(12) United States Patent
Jeon et al.

(10) Patent No.: US 11,832,489 B2
(45) Date of Patent: Nov. 28, 2023

(54) LIGHT-EMITTING DEVICE

(71) Applicant: Samsung Display Co., LTD., Yongin-si (KR)

(72) Inventors: Pyungeun Jeon, Yongin-si (KR); Yoojin Sohn, Yongin-si (KR); Juwon Lee, Yongin-si (KR); Wonjong Kim, Yongin-si (KR)

(73) Assignee: Samsung Display Co., LTD., Yongin-si (KR)

( * ) Notice: Subject to any disclaimer, the term of this patent is extended or adjusted under 35 U.S.C. 154(b) by 459 days.

(21) Appl. No.: 17/060,660

(22) Filed: Oct. 1, 2020

(65) Prior Publication Data

US 2021/0175294 A1 Jun. 10, 2021

(30) Foreign Application Priority Data

Dec. 4, 2019 (KR) .................. 10-2019-0160009

(51) Int. Cl.
*H10K 59/35* (2023.01)
*H10K 50/11* (2023.01)
(Continued)

(52) U.S. Cl.
CPC ............. *H10K 59/35* (2023.02); *H10K 50/11* (2023.02); *H10K 50/156* (2023.02);
(Continued)

(58) Field of Classification Search
CPC ............. H01L 27/3211; H01L 51/5004; H01L 51/0052; H01L 51/0056; H01L 51/0058;
(Continued)

(56) References Cited

U.S. PATENT DOCUMENTS 9,093,650 B2 7/2015 Kim et al.
9,391,121 B2 7/2016 Lee et al.
(Continued)

FOREIGN PATENT DOCUMENTS

KR 10-2015-0037235 4/2015
KR 10-2015-0043889 4/2015
(Continued)

*Primary Examiner* — Moin M Rahman
*Assistant Examiner* — Mohammad A Rahman
(74) *Attorney, Agent, or Firm* — H.C. Park & Associates, PLC

(57) ABSTRACT

A light-emitting device includes: a plurality of first electrodes respectively disposed in a first subpixel, a second subpixel, and a third subpixel; a second electrode facing the plurality of first electrodes; a first emission layer disposed in the first subpixel to emit a first-color light; a second emission layer disposed in the second subpixel to emit a second-color light; a first layer disposed between the second electrode and each of the first emission layer and the second emission layer, and integrated with the first subpixel, the second subpixel, and the third subpixel; a hole transport region disposed between the plurality of first electrodes and each of the first layer, the first emission layer, and the second emission layer; a first auxiliary layer disposed between the hole transport region and the first emission layer; and a first intermediate layer disposed between the first auxiliary layer and the first emission layer.

18 Claims, 4 Drawing Sheets

(51) Int. Cl.
*H10K 50/15* (2023.01)
*H10K 85/60* (2023.01)
*H10K 101/40* (2023.01)
*H10K 101/30* (2023.01)

(52) U.S. Cl.
CPC ......... *H10K 85/615* (2023.02); *H10K 85/624* (2023.02); *H10K 85/626* (2023.02); *H10K 85/631* (2023.02); *H10K 85/633* (2023.02); *H10K 85/636* (2023.02); *H10K 85/6572* (2023.02); *H10K 2101/30* (2023.02); *H10K 2101/40* (2023.02)

(58) Field of Classification Search
CPC ............... H01L 51/0059; H01L 51/006; H01L 51/0061; H01L 51/0072; H01L 51/5064; H01L 2251/552; H01L 51/506; H01L 51/5265; H01L 51/0073; H01L 51/502; H01L 51/504; H01L 51/52; H01L 51/50–56; H01L 51/0032–0095; H01L 27/32; H01L 2251/50–568; B32B 2457/206; G09G 2300/0452; H10K 59/35; H10K 50/11; H10K 50/156; H10K 85/615; H10K 85/624; H10K 85/626; H10K 85/631; H10K 85/633; H10K 85/636; H10K 85/6572; H10K 2101/30; H10K 2101/40; H10K 50/155; H10K 50/852; H10K 50/115; H10K 50/13; H10K 50/80; H10K 85/6574; H10K 10/10; H10K 19/00; H10K 30/00; H10K 39/00; H10K 50/00; H10K 59/00; H10K 65/00; H10K 71/00; H10K 77/00; H10K 85/00; H10K 99/10; H10K 2101/00; H10K 2102/00

See application file for complete search history.

(56) References Cited

U.S. PATENT DOCUMENTS

| | | | |
|---|---|---|---|
| 10,326,111 | B2 | 6/2019 | Yoo et al. |
| 2014/0027732 | A1* | 1/2014 | Pyo ........................ H10K 59/35 257/40 |
| 2017/0018600 | A1 | 1/2017 | Ito et al. |
| 2017/0200899 | A1 | 7/2017 | Kim et al. |
| 2019/0123291 | A1* | 4/2019 | Jeon ........................ H10K 59/12 |
| 2019/0165054 | A1* | 5/2019 | Kim ....................... H10K 59/351 |

FOREIGN PATENT DOCUMENTS

| | | |
|---|---|---|
| KR | 10-2017-0010514 | 2/2017 |
| KR | 10-1960377 | 3/2019 |
| KR | 10-2019-0044148 | 4/2019 |

\* cited by examiner

LIGHT-EMITTING DEVICE

CROSS REFERENCE TO RELATED APPLICATION

This application claims priority from and the benefit of Korean Patent Application No. 10-2019-0160009, filed on Dec. 4, 2019, which is hereby incorporated by reference for all purposes as if fully set forth herein.

BACKGROUND

Field

Exemplary embodiments of the invention relate generally to light emitting devices and, more specifically, to light emitting devices having improved color purity.

Discussion of the Background

A light-emitting device includes an anode, a cathode, and an emission layer disposed between the anode and the cathode. Holes provided from the anode and electrons provided from the cathode combine in the emission layer to generate excitons, which transit from an excited state to a ground state, thereby generating light.

The light-emitting device may be driven at a low voltage and may be configured to be light and thin, and has excellent characteristics in terms of viewing angles, a contrast ratio, and a response speed. Accordingly, the light-emitting device may be used in personal portable devices such as MP3 players and portable phones as well as TVs.

The above information disclosed in this Background section is only for understanding of the background of the inventive concepts, and, therefore, it may contain information that does not constitute prior art.

SUMMARY

In light-emitting devices of the related art, which include common layers, two emission layers having different colors are stacked, and an intermediate layer is inserted between the two emission layers to prevent or reduce color mixing.

Although the intermediate layer serves as a hole injection layer and a hole transport layer in a single device, because the intermediate layer is in direct contact with the emission layers, an auxiliary layer may not exist therein. Furthermore, due to the absence of an auxiliary layer, the driving voltage is increased by the high hole injection barrier, and electrons entering the intermediate layer from the emission layers are not blocked, thereby leading to color mixing and a decrease in lifespan.

In addition, when electrons and holes are injected into two different emission layers, there is a limitation that the electrons and the holes should not emit light even while passing through a common layer. In this regard, in the related art, electrons pass through an intermediate layer between the two different emission layers and the common layer, and the intermediate layer is designed to prevent electrons from moving toward a hole transport region.

Applicant realized that the electrons that fail to move to the other emission layer emit light of the color of the common layer and thus color-mixing may occur.

Light emitting devices constructed according to principles and exemplary implementations of the invention have reduced or no color mixing and improved color purity. For example, as discussed hereinafter, one of more of the various problems including problems in the related art Applicant recognized described above are resolved with the light-emitting devices constructed according to the principles and exemplary embodiments of the invention.

Additional features of the inventive concepts will be set forth in the description which follows, and in part will be apparent from the description, or may be learned by practice of the inventive concepts.

According to one aspect of the invention, a light-emitting device includes: a plurality of first electrodes respectively disposed in a first subpixel, a second subpixel, and a third subpixel; a second electrode facing the plurality of first electrodes; a first emission layer disposed in the first subpixel to emit a first-color light; a second emission layer disposed in the second subpixel to emit a second-color light; a first layer disposed between the second electrode and each of the first emission layer and the second emission layer, and integrated with the first subpixel, the second subpixel, and the third subpixel; a hole transport region disposed between the plurality of first electrodes and each of the first layer, the first emission layer, and the second emission layer; a first auxiliary layer disposed between the hole transport region and the first emission layer; and a first intermediate layer disposed between the first auxiliary layer and the first emission layer; wherein when other layers are not disposed between the first layer and the first emission layer; the first auxiliary layer includes a p-dopant, an absolute value of a HOMO energy level of the first intermediate layer is greater than an absolute value of a HOMO energy level of the first auxiliary layer and smaller than an absolute value of a HOMO energy level of the first emission layer, and an absolute value of a LUMO energy level of the first intermediate layer is greater than an absolute value of a LUMO energy level of the first auxiliary layer and smaller than an absolute value of a LUMO energy level of the first emission layer. The first layer may not directly contact the first emission layer.

The p-dopant may include at least one of a quinone derivative, a metal oxide, and a cyano group-containing compound.

The first intermediate layer may include a p-dopant or a single film including a p-dopant.

The at least one of the first intermediate layer and the first auxiliary layer may further includes a hole transport compound.

The hole transport compound may include at least one compound of Formula 201 and of Formula 202 below:

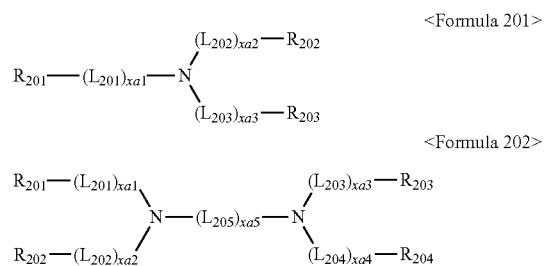

wherein, in Formulae 201 and 202, the variables are defined herein.

A second intermediate layer may be between the hole transport region and the second emission layer.

A third intermediate layer may be between the first intermediate layer and the first emission layer.

An absolute value of a HOMO energy level of the third intermediate layer may be greater than an absolute value of a HOMO energy level of the first intermediate layer and smaller than an absolute value of a HOMO energy level of the first emission layer, and an absolute value of a LUMO energy level of the third intermediate layer may be greater than an absolute value of a LUMO energy level of the first intermediate layer and smaller than an absolute value of a LUMO energy level of the first emission layer.

The hole transport region may further include at least one of a hole injection layer and a hole transport layer.

The at least one of a hole injection layer and a hole transport layer may include a p-dopant or a single film including a p-dopant.

At least one of an electron injection layer and an electron transport layer may be disposed between the first layer and the second electrode.

The at least one of an electron injection layer and an electron transport layer may include a metal-containing material.

A buffer layer may be between the first layer and the second electrode.

The plurality of first electrodes may be an anode, and the second electrode may be a cathode.

The anode may be transmissive, and the cathode may be reflective or semi-transmissive.

The light-emitting device may be a bottom emission device.

The first layer has a region disposed substantially in the third subpixel that may be configured to emit a third-color light, and a resonance order of one of the first-color light, the second-color light, or the third-color light may be different from the resonance order of the other two.

The first-color light may be blue light, the second-color light may be red light, and the first layer has a region substantially in the third subpixel may be configured to emit a green light.

A flat-panel display apparatus may include: a thin-film transistor having a source electrode, a drain electrode, and an activation layer; and the light-emitting device as described above, wherein the plurality of first electrodes of the light-emitting device may be electrically coupled to one of the source electrode and the drain electrode.

In some exemplary embodiments, the first-color light may be blue light, the second-color light may be red light or green light, and a region of the first layer substantially in the third subpixel may emit green light or red light; the first-color light may be blue light, the second-color light may be red light, and a region of the first layer substantially in the third subpixel may emit green light; or the first-color light may be blue light, the second-color light may be green light, and a region of the first layer substantially in the third subpixel may emit red light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
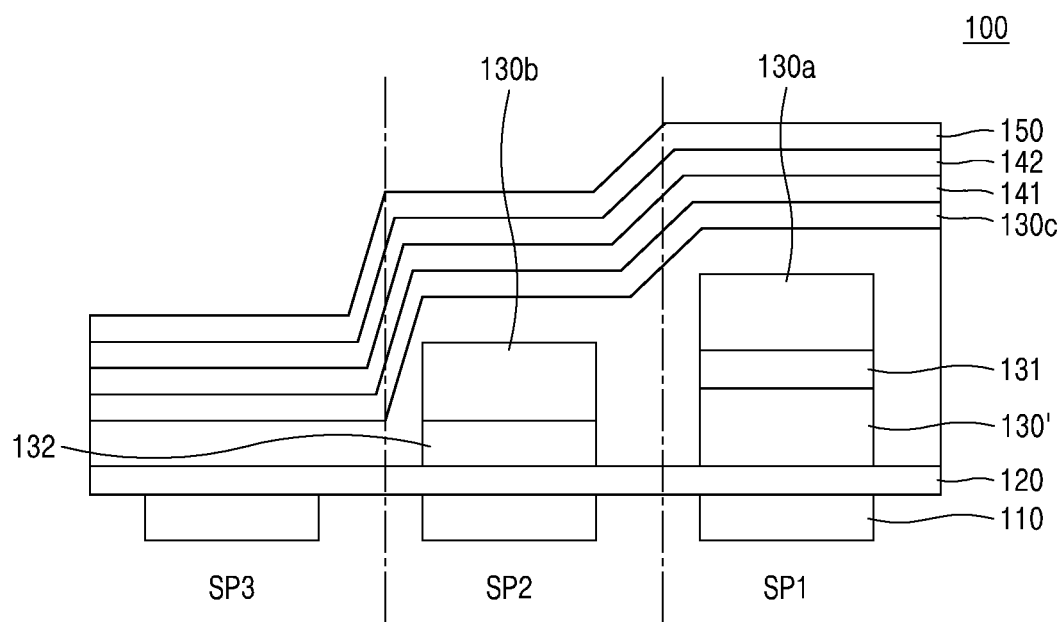
FIG. 1 is a schematic cross-sectional view of an exemplary embodiment of a light-emitting device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, film, region, or plate, is referred to as being "on," "connected to," or "coupled to"

another element, layer, film, region, or plate, it may be directly on, connected to, or coupled to the other element, layer, film, region, or plate, or intervening elements, layers, films, regions, or plates may be present. When, however, an element, layer, film, region, or plate is referred to as being "directly on," "directly connected to," or "directly coupled to" another element, layer, film, region, or plate, there are no intervening elements, layers, films, regions, or plates present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic cross-sectional view of an exemplary embodiment of a light-emitting device constructed according to principles of the invention.

Referring to FIG. 1, a light-emitting device 100 according to some exemplary embodiments includes: a plurality of first electrodes 110 respectively disposed in a representative first subpixel SP1, a representative second subpixel SP2, and a representative third subpixel SP3; a second electrode 150 facing the first electrodes 110; a first emission layer 130a disposed in the first subpixel SP1 and emitting first-color light; a second emission layer 130b disposed in the second subpixel SP2 and emitting second-color light; a first layer 130c disposed between the second electrode 150 and each of the first emission layer 130a and the second emission layer 130b, and integrated with the first subpixel SP1, the second subpixel SP2, and the third subpixel SP3; a hole transport region disposed between the first electrode 110 and each of the first layer 130c, the first emission layer 130a, and the second emission layer 130b; a first auxiliary layer 130' disposed between the hole transport region and the first emission layer 130a; and a first intermediate layer 131 between the first auxiliary layer 130' and the first emission layer 130a, wherein other layers are not present between the first layer 130c and the first emission layer 130a, the first auxiliary layer 130' includes a p-dopant, an absolute value of a highest occupied molecular orbital (HOMO) energy level of the first intermediate layer 131 is greater than an absolute value of a HOMO energy level of the first auxiliary layer 130' and smaller than an absolute value of a HOMO energy level of the first emission layer 130a, and an absolute value of a lowest unoccupied molecular orbital (LUMO) energy level of the first intermediate layer 131 is greater than an absolute value of a LUMO energy level of the first auxiliary layer 130' and smaller than an absolute value of a LUMO energy level of the first emission layer 130a.

In addition, in some exemplary embodiments, other layers may not present between the first layer 130c and the second emission layer 130b. Furthermore, in some exemplary embodiments, the first layer 130c may be in direct contact with the first emission layer 130a. For example, in some exemplary embodiments, the first layer 130c may be in direct contact with the first emission layer 130a and the second emission layer 130b. In addition, in some exemplary embodiments, the light-emitting device 100 may further include a second intermediate layer 132 between the hole transport region and the second emission layer 130b.

In some exemplary embodiments, the hole transport region may further include at least one of a hole injection layer and a hole transport layer, at least one of an electron injection layer 144 and an electron transport layer 142 is further disposed between the first layer 130c and the second electrode 150, and a buffer layer is further disposed between the first layer 130c and the second electrode 150. The layers are described in more detail below.

In some exemplary embodiments, as described above, the first layer 130c is integrated with a first subpixel to a third pixel (SP1, SP2, and SP3). That is, the first layer 130c is a common layer. In general, in a structure of a light-emitting device of the related art, which includes two or more emission layers and a common layer, holes are injected through the common layer so that one layer is inserted between a lower emission layer (common layer) and an upper emission layer.

In some exemplary embodiments, compared to the structure of the light-emitting device in the art, the first layer 130c, that is, a common layer, is disposed as an upper emission layer, and two layers between the hole transport region and the first emission layer 130a, that is, the first auxiliary layer 130' and the first intermediate layer 131, are further disposed. In other words, due to additional inclusion of the first intermediate layer 131 between the first auxiliary layer 130' and the first emission layer 130a, the transport of holes injected from the first layer 130c to the first auxiliary layer 130' may be facilitated, and electrons injected to the first emission layer 130a through the electron transport layer 142 may not emit light in the first emission layer 130a and may be prevented from moving to the hole transport region.

In addition, other layers are not disposed between the first layer 130c and the first emission layer 130a or the second emission layer 130b, and thus different colors of light are prevented from being emitted together and being mixed with each other in the first emission layer 130a or the second emission layer 130b.

In addition, in some exemplary embodiments, due to inclusion of p-dopant in the first auxiliary layer 130', hole injection to the first emission layer 130a may be facilitated. Furthermore, the first intermediate layer 131 may have an absolute value of a HOMO energy level that is greater than an absolute value of a HOMO energy level of the first auxiliary layer 130' and smaller than an absolute value of a HOMO energy level of the first emission layer 130a, thereby facilitating hole injection from the first auxiliary layer 130' to the first emission layer 130a. In addition, the first intermediate layer 131 may have an absolute value of a LUMO energy level that is smaller than an absolute value of a LUMO energy level of the first emission layer 130a, thereby further facilitating electron blocking.

In detail, the first emission layer 130a may include a luminescent material, for example, a host material, an absolute value of a HOMO energy level of the first intermediate layer 131 may be greater than an absolute value of a HOMO energy level of the first auxiliary layer 130' and smaller than an absolute value of a HOMO energy level of the host material included in the first emission layer 130a, and an absolute value of a LUMO energy level of the first intermediate layer 131 may be greater than an absolute value of a LUMO energy level of the first auxiliary layer 130' and smaller than an absolute value of a LUMO energy level of the host material included in the first emission layer 130a. Hereinafter, the light-emitting device 100 is described in detail.

First Electrode 110

Referring to FIG. 1, a substrate may be additionally placed below the first electrode 110 or above the second electrode 150. The substrate may be a glass substrate or a plastic substrate, each having excellent mechanical strength, thermal stability, transparency, surface smoothness, ease of handling, and water resistance.

For example, when the light-emitting device 100 is a top emission type light-emitting device in which light is emitted in a direction away from the substrate, the substrate does not necessarily need to be transparent, but may be opaque or semi-transparent. In this case, the substrate may include a metal. When the substrate includes the metal, the substrate may include at least one selected from carbon, iron, chromium, manganese, nickel, titanium, molybdenum, a stainless steel (SUS), an alloy sold under the trade designation INVAR from Aperam Alloys Imphy Joint Stock Company France of Imphy, France, an alloy sold under the trade designation INCONEL from Huntington Alloys Corporation of Huntington, WV, and an alloy sold under the trade designation KOVAR, but the exemplary embodiments are not limited thereto.

In addition, a buffer layer, a thin-film transistor, an organic insulating layer, and the like may be further disposed between the substrate and the first electrode 110. The first electrode 110 may be formed by depositing or sputtering a material for forming the first electrode 110 on the substrate. When the first electrode 110 is an anode, the material for forming the first electrode 110 may be selected from materials with a high work function to facilitate hole injection.

The first electrode 110 may be a reflective electrode, a semi-transmissive electrode, or a transmissive electrode. When the first electrode 110 is a transmissive electrode, a material for forming a first electrode may be selected from indium tin oxide (ITO), indium zinc oxide (IZO), tin oxide ($SnO_2$), zinc oxide (ZnO), and any combinations thereof, but the exemplary embodiments are not limited thereto. In one or more exemplary embodiments, when the first electrode 110 is a semi-transmissive electrode or a reflective electrode, a material for forming a first electrode may be selected from magnesium (Mg), silver (Ag), aluminum (Al), aluminum-lithium (Al—Li), calcium (Ca), magnesium-indium (Mg—In), magnesium-silver (Mg—Ag), and any combinations thereof, but the exemplary embodiments are not limited thereto.

The first electrode 110 may have a single-layered structure or a multi-layered structure including two or more layers. For example, the first electrode 110 may have a three-layered structure of ITO/Ag/ITO, but the structure of the first electrode 110 is not limited thereto.

For example, when the anode is semi-transmissive, the anode may include a transparent conductive layer including at least one selected from a tin oxide ($SnO_2$), an indium tin oxide (ITO), an indium zinc oxide (IZO), a zinc oxide (ZnO), an indium oxide ($In_2O_3$), an indium gallium oxide (IGO), and an aluminum zinc oxide (AZO), and a semi-transmissive thin film including silver (Ag), magnesium (Mg), aluminum (Al), platinum (Pt), palladium (Pd), gold (Au), indium (In), nickel (Ni), neodymium (Nd), iridium (Ir), chromium (Cr), lithium (Li), calcium (Ca), ytterbium (Yb), or any combination thereof, each of which has the size of several to tens nanometers, wherein the semi-transmissive thin film is used to improve light efficiency.

For example, the anode is reflective, the anode may include a reflective film including Ag, Mg, Al, Pt, Pd, Au, Ni, In, Nd, Ir, Cr, Li, Ca, Yb, or any combination thereof, and a transparent conductive layer disposed at least one of above and below the reflective film.

The exemplary embodiments are not limited thereto, and the anode may include various materials, and the structure thereof may be variously modified, such as being a single layer or a multilayer. The thickness of the anode may be about 50 nm to about 110 nm. When the thickness of the anode is within this range, excellent light-emission characteristics may be obtained without a substantial increase in driving voltage. The light-emitting device 100 may further include a hole transport region between the first electrode 110 and the first emission layer 130a and the second emission layer 130b and/or an electron transport region between the first layer 130c and the second electrode 150.

Hole Transport Region

The hole transport region may have i) a single-layered structure including a single layer including a single material, ii) a single-layered structure including a single layer including a plurality of different materials, or iii) a multi-layered structure having a plurality of layers including a plurality of different materials.

The hole transport region may include at least one layer selected from a hole injection layer, a hole transport layer, an emission auxiliary layer, and an electron blocking layer. For example, the hole transport region may have a single-layered structure including a single layer including a plurality of different materials, or a multi-layered structure having a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein for each structure, constituting layers are sequentially stacked in this stated order, but the structure of the hole transport region is not limited thereto.

The hole transport region may include at least one selected from 4,4',4"-tris[phenyl(m-tolyl)amino]triphenylamine (m-MTDATA), 1-N,1-N-bis[4-(diphenylamino)phenyl]-4-N,4-N-diphenylbenzene-1,4-diamine (TDATA), 4,4',4"-tris[2-naphthyl(phenyl)amino]triphenylamine (2-TNATA), N,N'-di(1-naphthyl)-N,N'-diphenyl-(1,1'-biphenyl)-4,4'-diamine (NPB or NPD), N4,N4'-di(naphthalen-2-yl)-N4,N4'-diphenyl-[1,1'-biphenyl]-4,4'-diamine (β-NPB), N,N'-bis(3-methylphenyl)-N,N'-diphenylbenzidine (TPD), N,N'-bis(3-methylphenyl)-N,N'-diphenyl-9,9-spirobifluorene-2,7-diamine (spiro-TPD), N2,N7-di-1-naphthalenyl-N2,N7-diphenyl-9,9'-spirobi[9H-fluorene]-2,7-diamine (spiro-NPB), N,N,N'-di(1-naphthyl)-N,N'-2,2'dimethyldiphenyl-(1,1'-biphenyl)-4,4'-diamine (methylated-NPB), 4,4'-cyclohexylidenebis[N,N-bis(4-methylphenyl)benzenamine] (TAPC), N,N,N',N'-tetrakis(3-methylphenyl)-3,3'-dimethylbenzidine (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, and a compound represented by Formula 202:

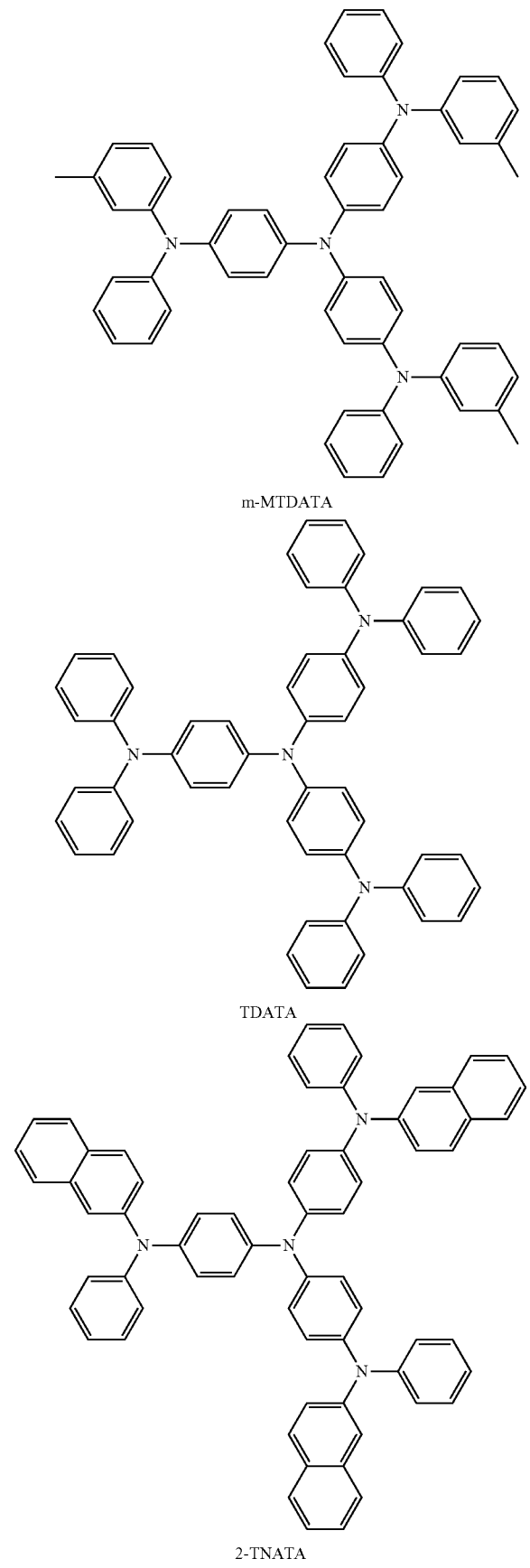

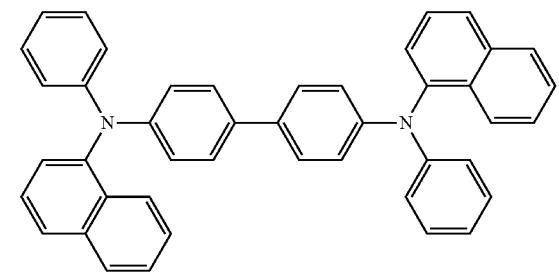

NPB

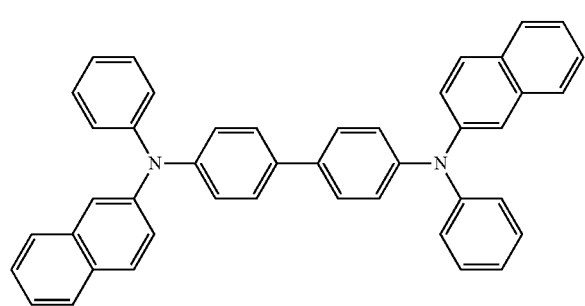

β-NPB

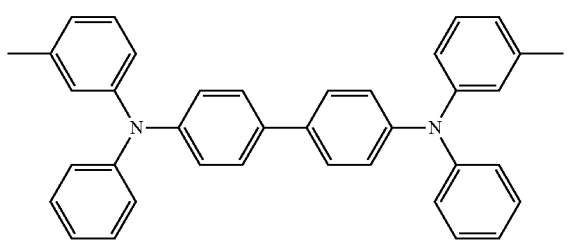

TPD

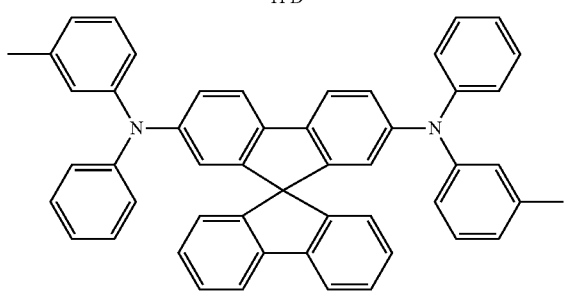

Spiro-TPD

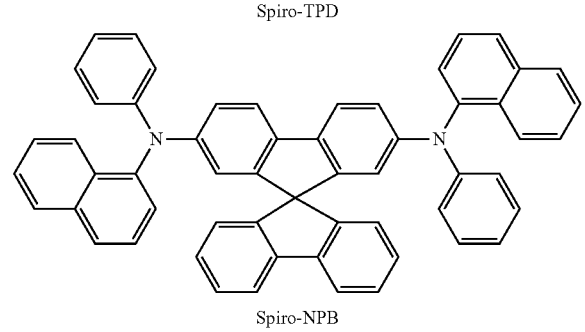

Spiro-NPB

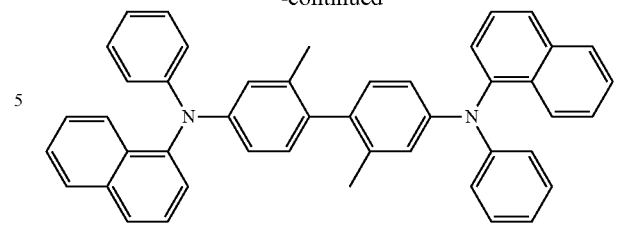

methylated NPB

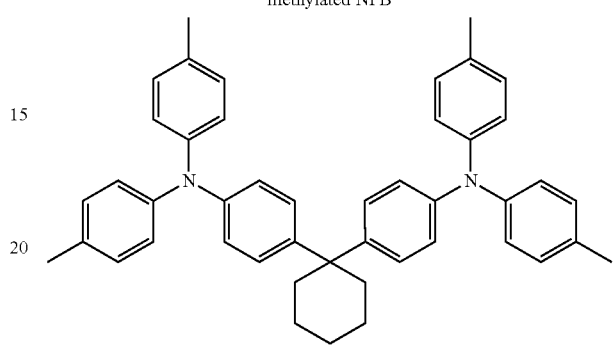

TAPC

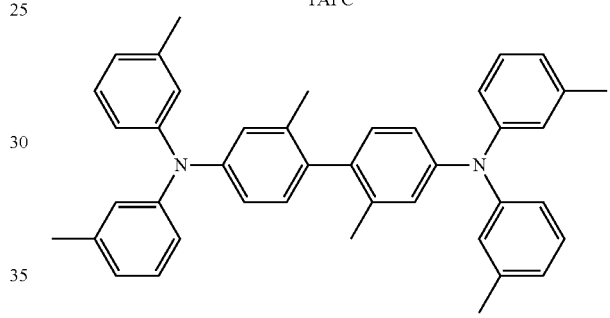

HMTPD

<Formula 201>

$$R_{201}\text{—}(L_{201})_{xa1}\text{—}N\begin{matrix}(L_{202})_{xa2}\text{—}R_{202}\\(L_{203})_{xa3}\text{—}R_{203}\end{matrix}$$

<Formula 202>

$$R_{201}\text{—}(L_{201})_{xa1}\text{—}N\text{—}(L_{205})_{xa5}\text{—}N\begin{matrix}(L_{203})_{xa3}\text{—}R_{203}\\(L_{204})_{xa4}\text{—}R_{204}\end{matrix}$$
$$R_{202}\text{—}(L_{202})_{xa2}$$

In Formulae 201 and 202,

L201 to L204 may each independently be selected from a substituted or unsubstituted C3-C10 cycloalkylene group, a substituted or unsubstituted C1-C10 heterocycloalkylene group, a substituted or unsubstituted C3-C10 cycloalkenylene group, a substituted or unsubstituted C1-C10 heterocycloalkenylene group, a substituted or unsubstituted C6-C60 arylene group, a substituted or unsubstituted C1-C60 heteroarylene group, a substituted or unsubstituted divalent non-aromatic condensed polycyclic group, and a substituted or unsubstituted divalent non-aromatic condensed heteropolycyclic group, L205 may be selected from *—O—*', *—S—*', *—N($Q_{201}$)-*', a substituted or unsubstituted C1-C20 alkylene group, a substituted or unsubstituted C2-C20 alkenylene group, a substituted or unsubstituted C3-C10 cycloalkylene group, a substituted or unsubstituted C1-C10 heterocycloalkylene group, a substituted or unsubstituted C3-C10 cycloalkenylene group, a substituted or unsubstituted C1-C10 heterocycloalkenylene group, a substituted or unsubstituted C6-C60 arylene group, a substituted or unsubstituted C1-C60 heteroarylene group, a substituted or unsubstituted divalent non-aromatic condensed polycyclic group, and a substituted or unsubstituted divalent non-aromatic condensed heteropolycyclic group, xa1 to xa4 may each independently be an integer from 0 to 3, xa5 may be an integer from 1 to 10, and R201 to R204 and Q201 may each independently be selected from a substituted or unsubstituted C3-C10 cycloalkyl group, a substituted or unsubstituted C1-C10 heterocycloalkyl group, a substituted or unsubstituted C3-C10 cycloalkenyl group, a substituted or unsubstituted C1-C10 heterocycloalkenyl group, a substituted or unsubstituted C6-C60 aryl group, a substituted or unsubstituted C6-C60 aryloxy group, a substituted or unsubstituted C6-C60 arylthio group, a substituted or unsubstituted C1-C60 heteroaryl group, a substituted or unsubstituted monovalent non-aromatic condensed polycyclic group, and a substituted or unsubstituted monovalent non-aromatic condensed heteropolycyclic group.

For example, in Formula 202, R201 and R202 may optionally be linked to each other via a single bond, a dimethyl-methylene group, or a diphenyl-methylene group, and R203 and R204 may optionally be linked to each other via a single bond, a dimethyl-methylene group, or a diphenyl-methylene group.

In one exemplary embodiment, in Formulae 201 and 202, L201 to L205 may each independently be selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more exemplary embodiments, xa1 to xa4 may each independently be 0, 1, or 2.

In one or more exemplary embodiments, xa5 may be 1, 2, 3, or 4.

In one or more exemplary embodiments, $R_{201}$ to $R_{204}$ and $Q_{201}$ may each independently be selected from: a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), and $Q_{31}$ to $Q_{33}$ are the same as described above.

In one or more exemplary embodiments, at least one selected from $R_{201}$ to $R_{203}$ in Formula 201 may each independently be selected from:
- a fluorenyl group, a spiro-bifluorenyl group, a carbazolyl group, a dibenzofuranyl group, and a dibenzothiophenyl group; and
- a fluorenyl group, a spiro-bifluorenyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but the exemplary embodiments are not limited thereto.

In one or more exemplary embodiments, in Formula 202, i) $R_{201}$ and $R_{202}$ may be linked to each other via a single bond, and/or ii) $R_{203}$ and $R_{204}$ may be linked to each other via a single bond.

In one or more exemplary embodiments, at least one selected from $R_{201}$ to $R_{204}$ in Formula 202 may each independently be selected from:
- a carbazolyl group; and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group, but the exemplary embodiments are not limited thereto.

In one or more exemplary embodiments, the compound represented by Formula 201 may be represented by Formula 201A below:

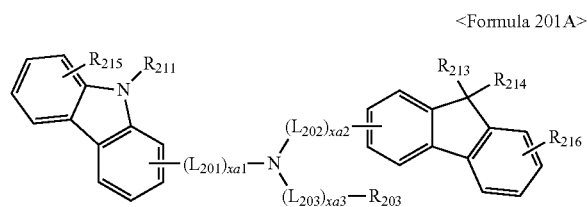

<Formula 201A>

In one or more exemplary embodiments, the compound represented by Formula 201 may be represented by Formula 201A(1) below, but the exemplary embodiments are not limited thereto:

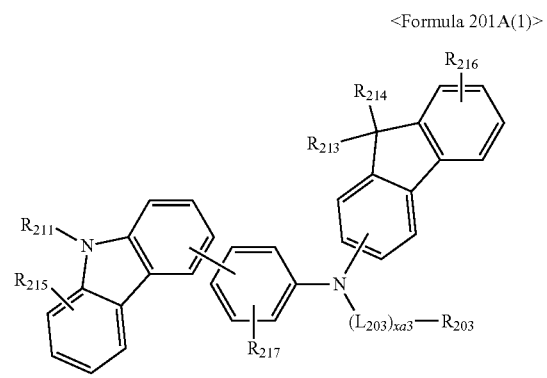

<Formula 201A(1)>

In one or more exemplary embodiments, the compound represented by Formula 201 may be represented by Formula 201A-1 below, but the exemplary embodiments are not limited thereto:

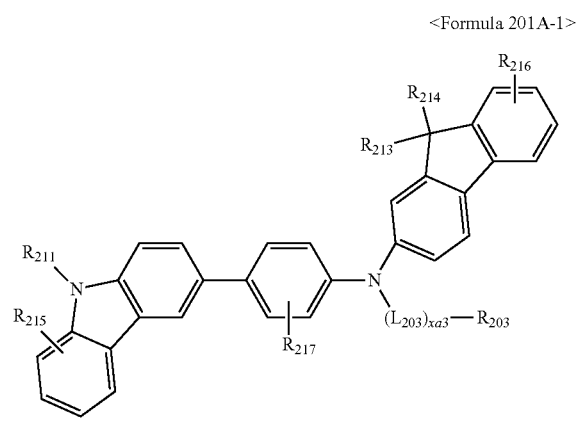

<Formula 201A-1>

In one or more exemplary embodiments, the compound represented by Formula 202 may be represented by Formula 202A below:

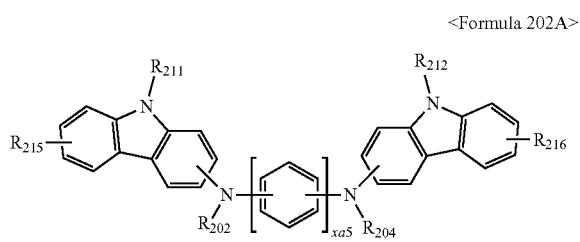

<Formula 202A>

In one or more exemplary embodiments, the compound represented by Formula 202 may be represented by Formula 202A-1 below:

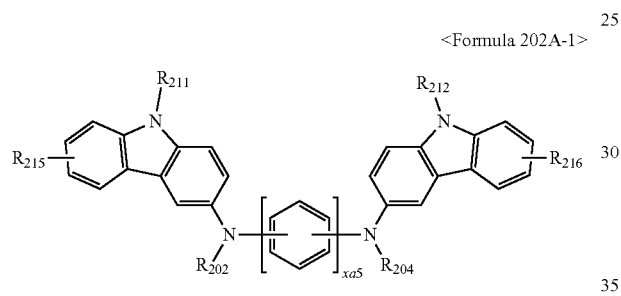

<Formula 202A-1>

In Formulae 201A, 201A(1), 201A-1, 202A, and 202A-1, $L_{201}$ to $L_{203}$, xa1 to xa3, xa5, and $R_{202}$ to $R_{204}$ are the same as described above, $R_{211}$ and $R_{212}$ are the same as described in connection with $R_{203}$, and $R_{213}$ to $R_{217}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

The hole transport region and a first auxiliary layer 130' may each include at least one compound selected from Compounds HT1 to HT39, but the exemplary embodiments are not limited thereto:

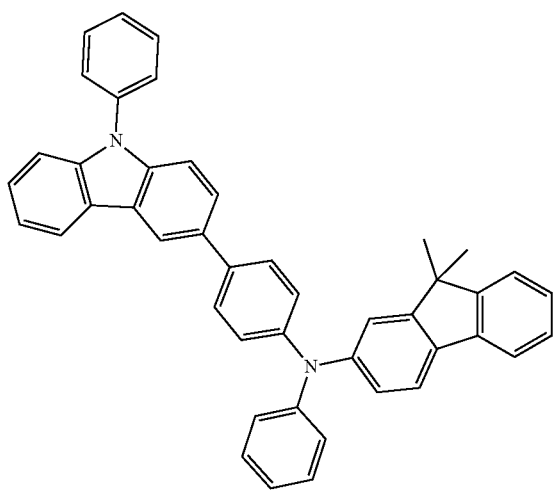

HT1

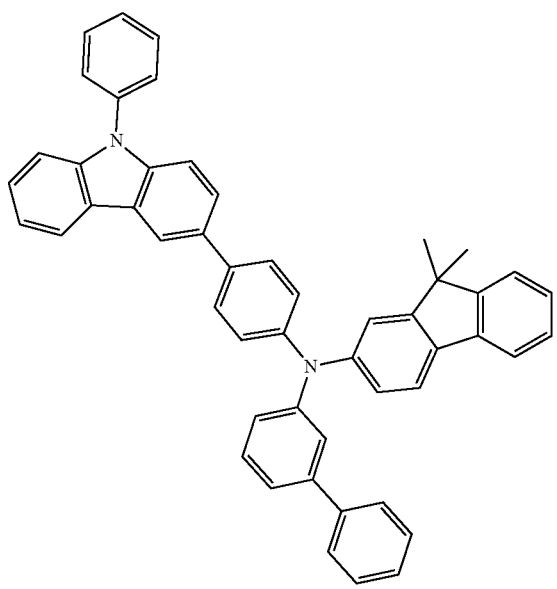

HT2

HT3
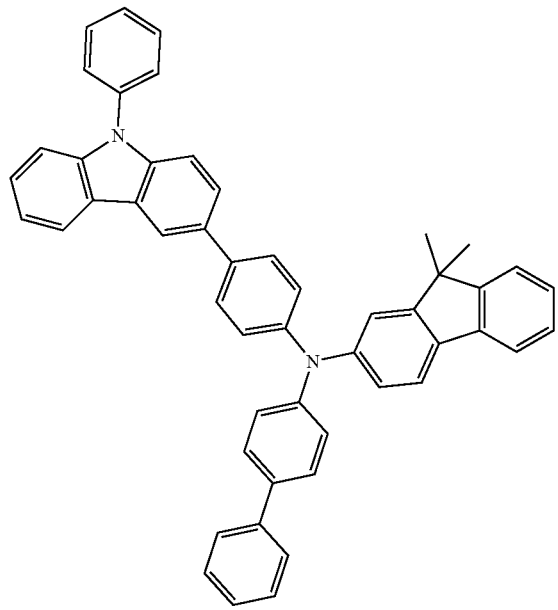
HT4
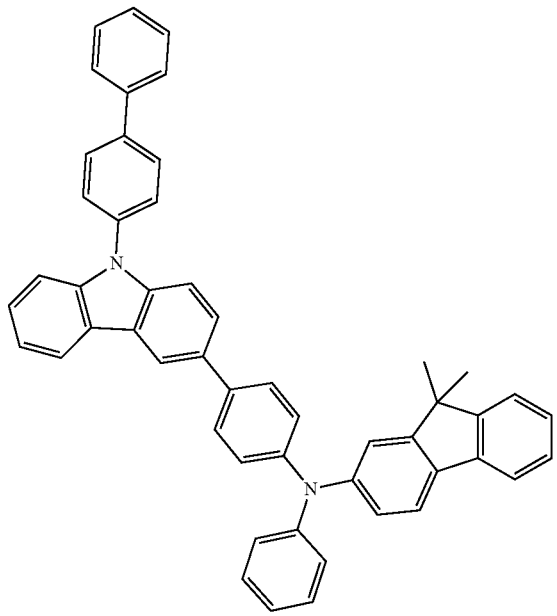
HT5
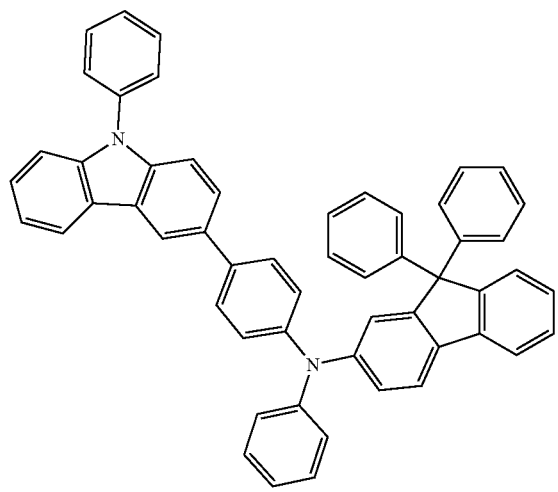
HT6
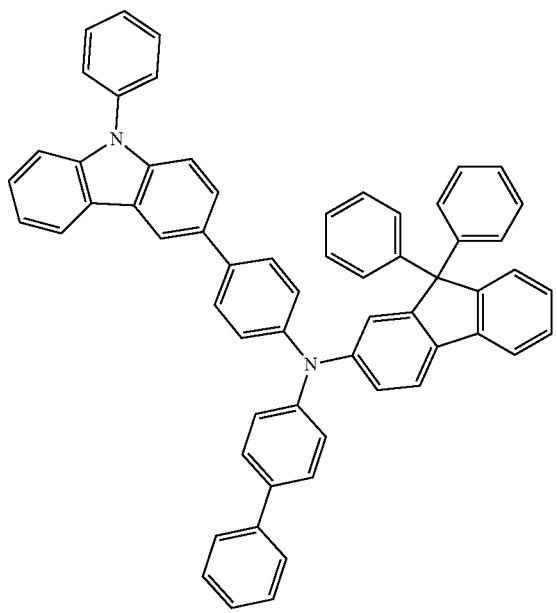

-continued
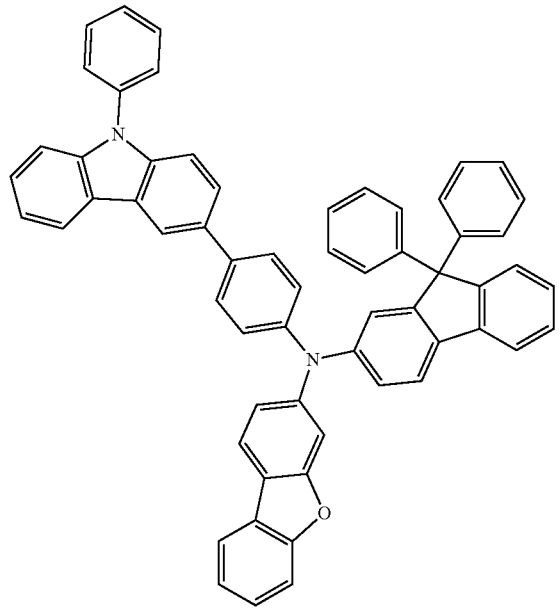
HT7
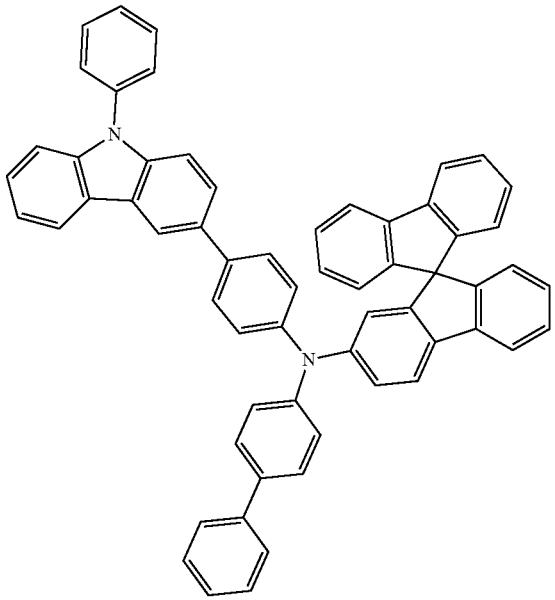
HT8
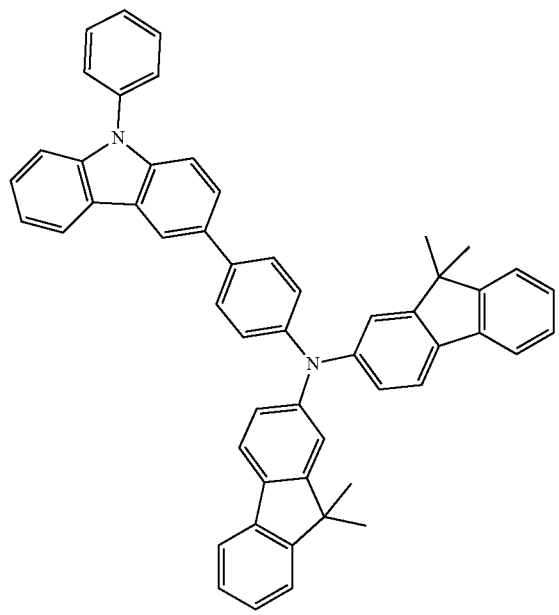
HT9
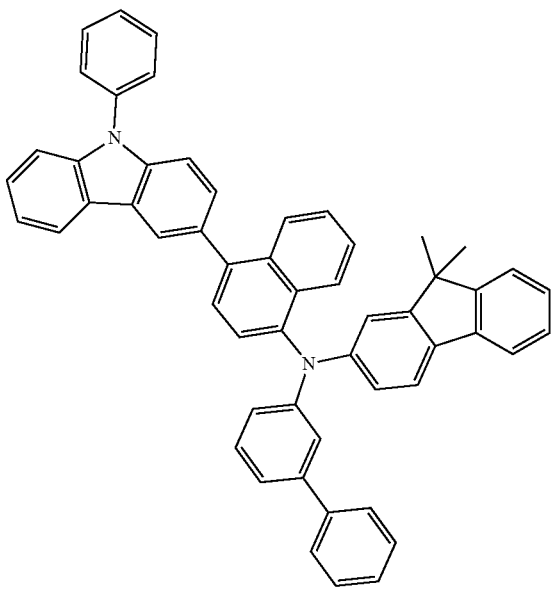
HT10

HT11
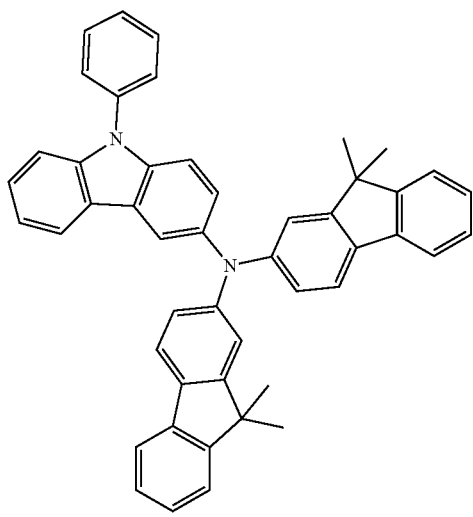
HT12
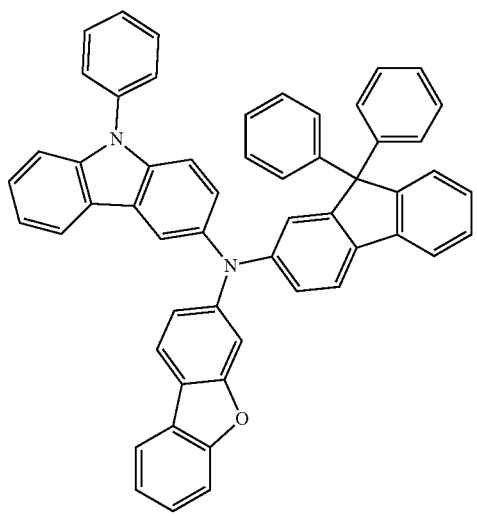
HT13
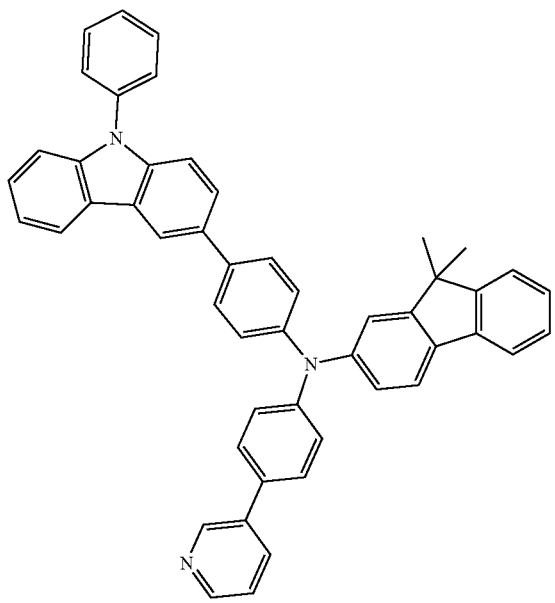
HT14
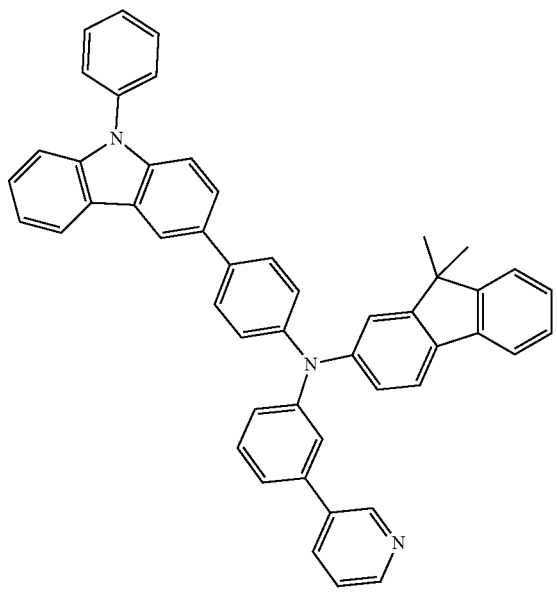
HT15
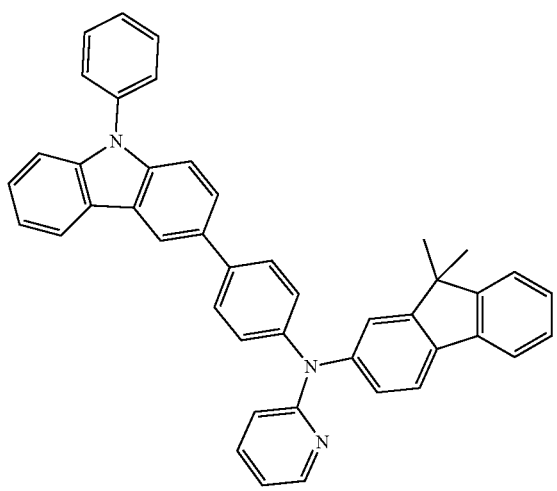
HT16
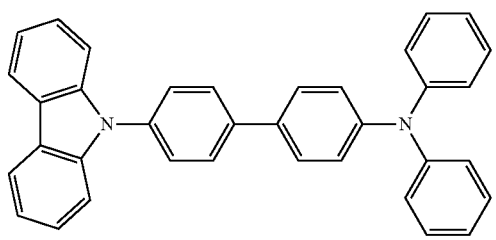

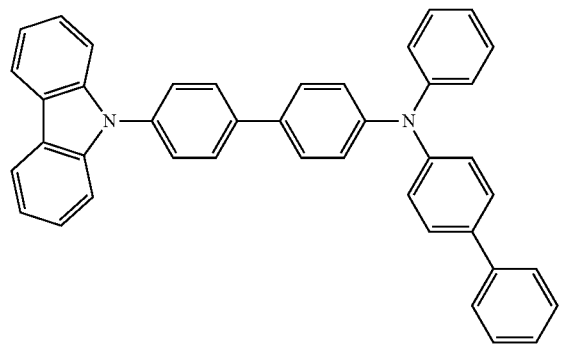
HT17
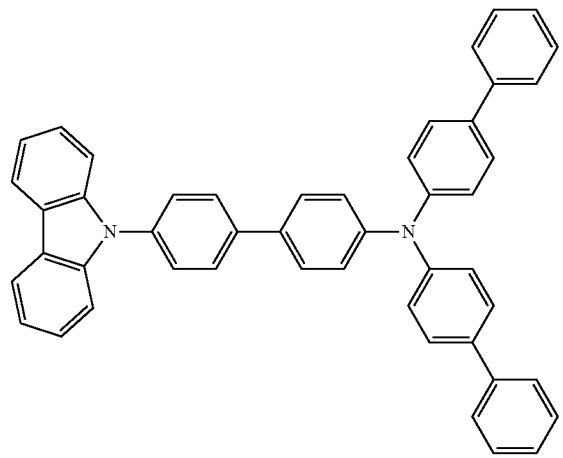
HT18
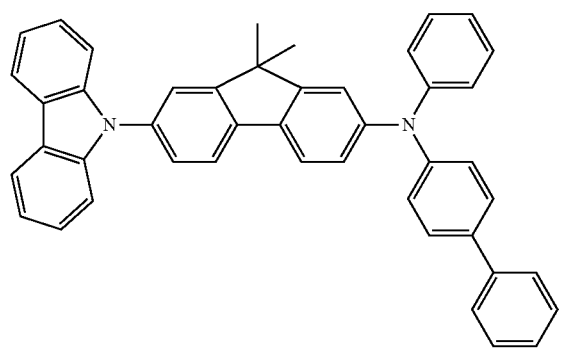
HT19
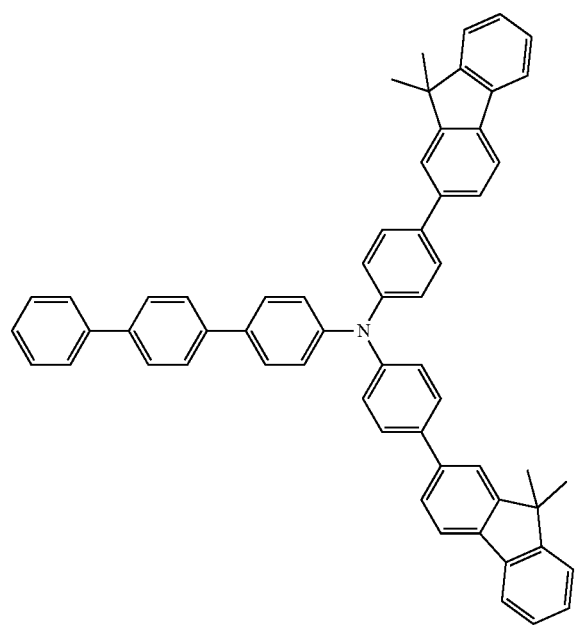
HT20

-continued
HT21
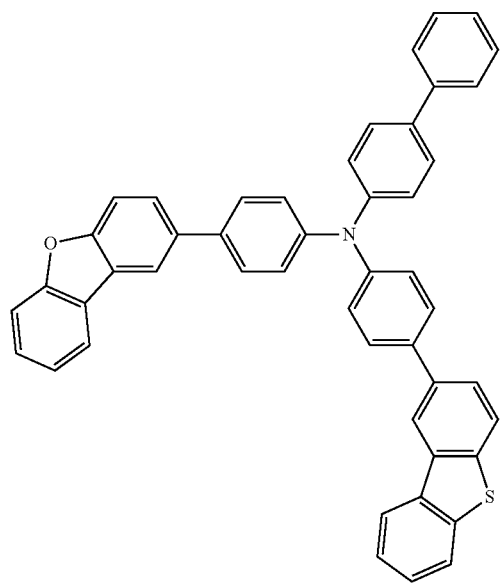
HT22
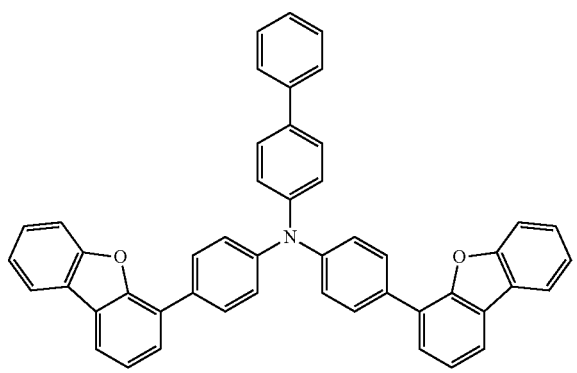
HT23
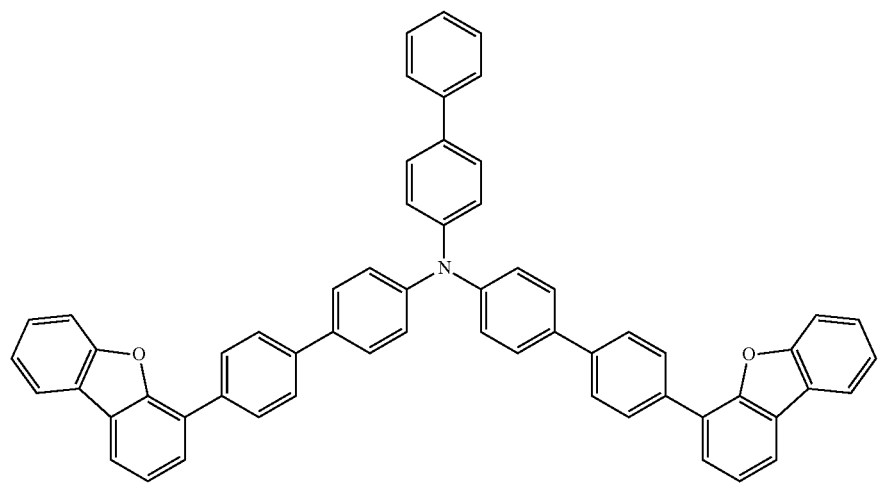
HT24
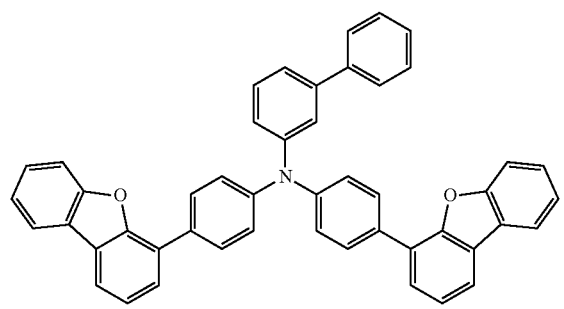
HT25
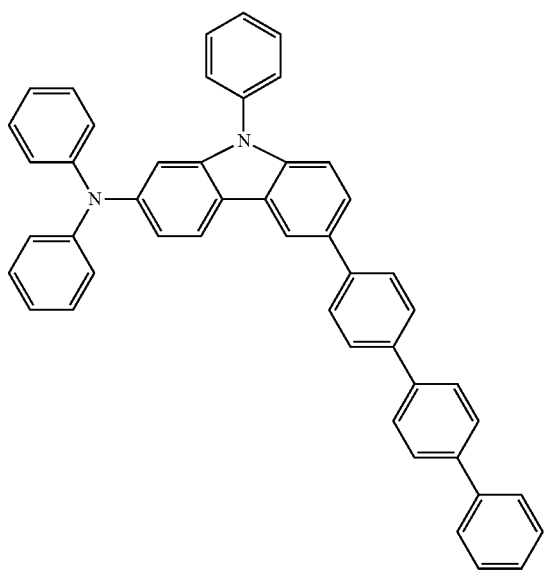

-continued
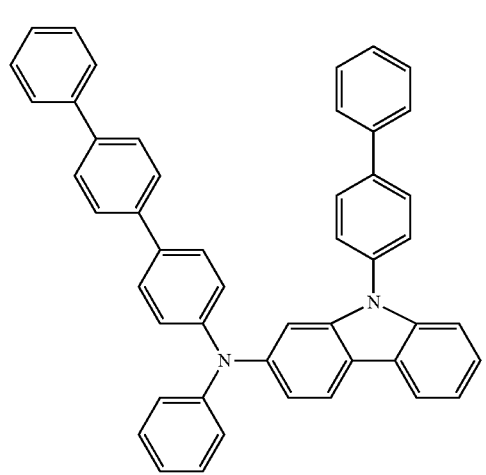
HT26
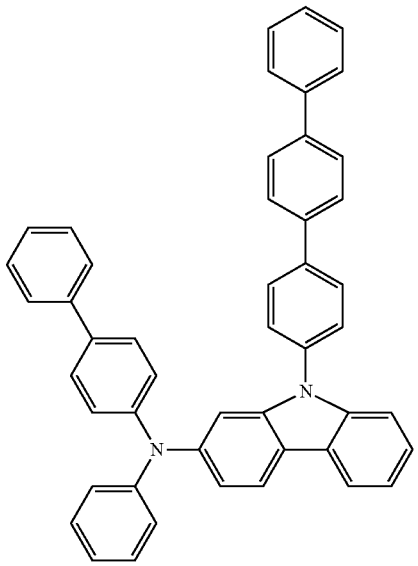
HT27
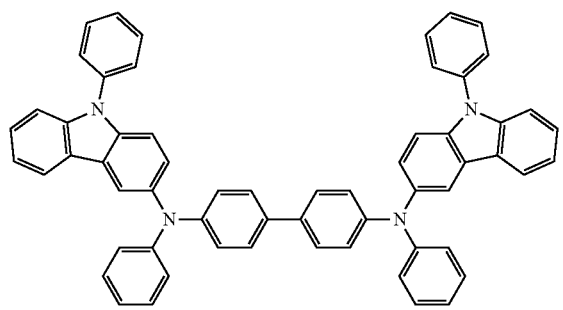
HT28
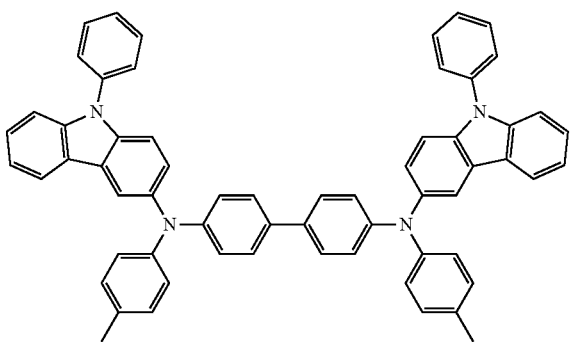
HT29
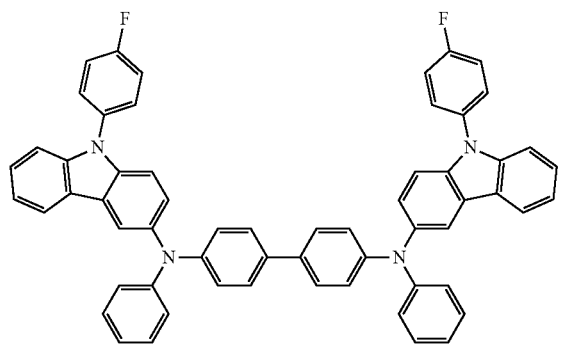
HT30
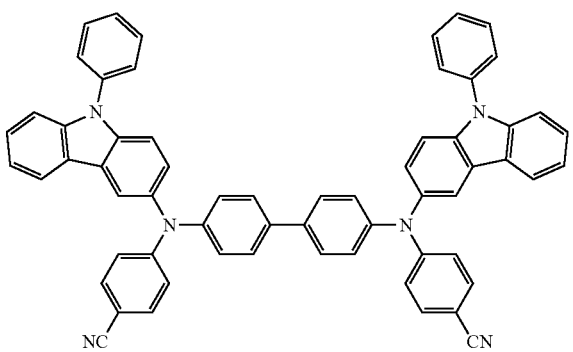
HT31

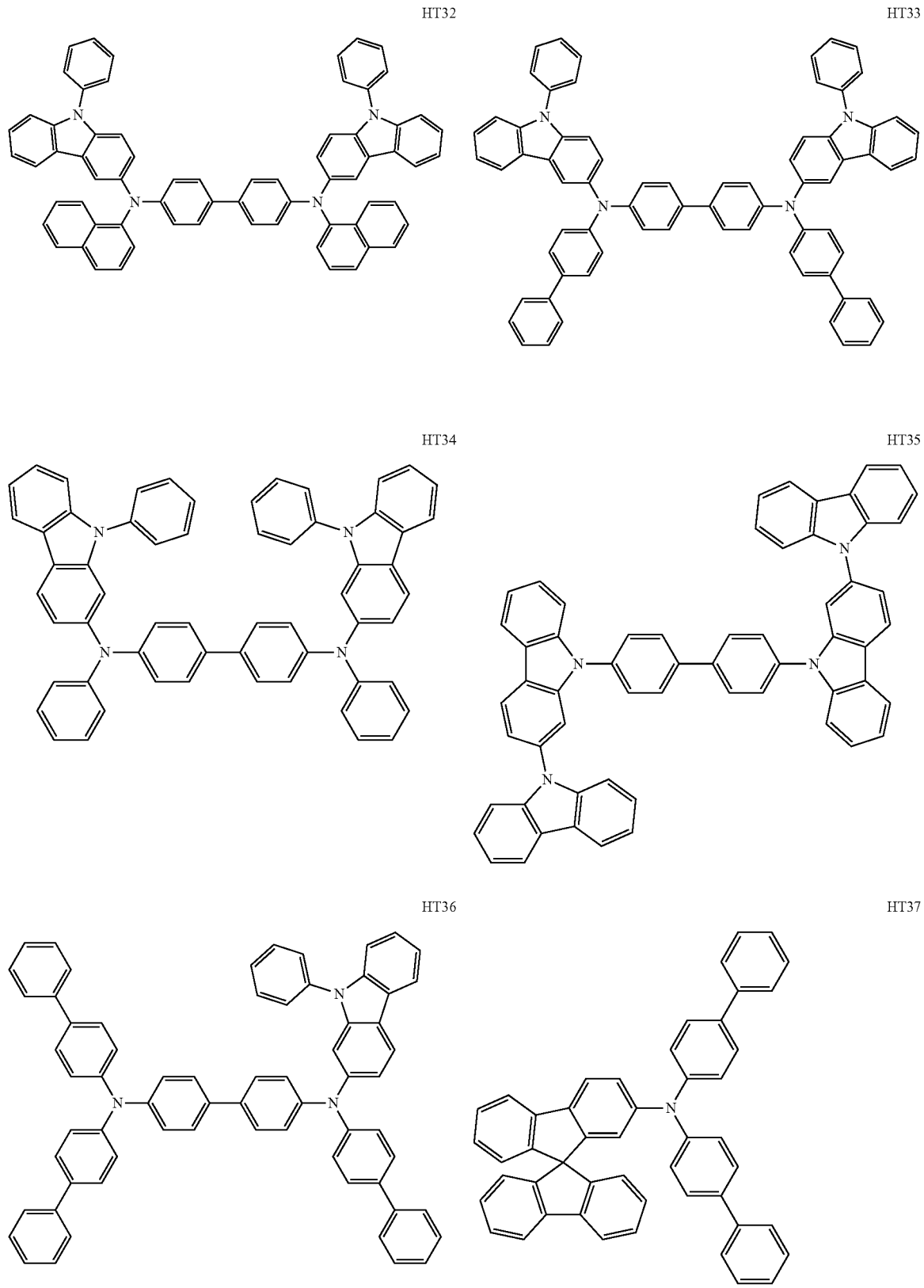

-continued

HT38

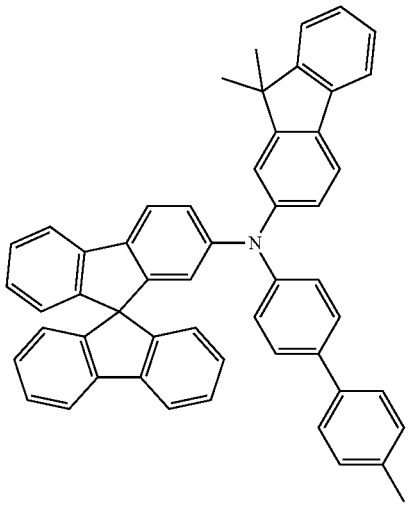

HT39

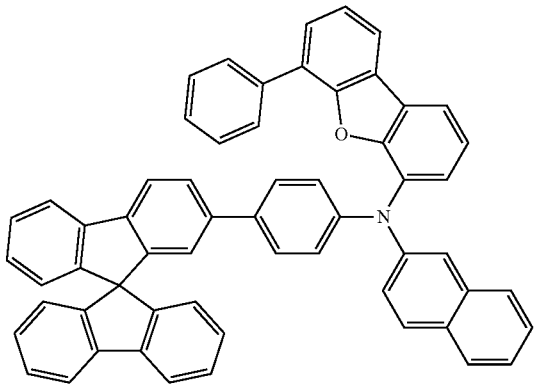

The thickness of the hole transport region may be in a range of about 100 Å to about 10,000 Å, for example, about 100 Å to about 1,000 Å. When the hole transport region includes at least one selected from the hole injection layer and the hole transport layer, the thickness of the hole injection layer may be in a range of about 100 Å to about 9,000 Å, for example, about 100 Å to about 1,000 Å, and the thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for the optical resonance distance according to the wavelength of light emitted by the emission layers 130a-c, and the electron blocking layer may block the flow of electrons from an electron transport region. The emission auxiliary layer and the electron blocking layer may include the materials as described above.

p-Dopant

At least one of the hole injection layer and the hole transport layer may include a p-dopant or a single film including a p-dopant. In this exemplary embodiment, the hole injection layer has the single film. In one exemplary embodiment, the first intermediate layer 131, the second intermediate layer 132, and the first auxiliary layer 130' may each independently include a p-dopant or a single film include a p-dopant.

In one exemplary embodiment, a LUMO energy level of the p-dopant may be about −3.5 eV or less. The p-dopant may include at least one selected from a quinone radical or derivative, a metal oxide, and a cyano group-containing compound, but the exemplary embodiments are not limited thereto. In one exemplary embodiment, the p-dopant may include at least one selected from:

a quinone derivative, such as tetracyanoquinodimethane (TCNQ) and 2,3,5,6-tetrafluoro-7,7,8,8-tetracyanoquinodimethane (F4-TCNQ);

a metal oxide, such as tungsten oxide or molybdenum oxide;

1,4,5,8,9,12-hexaazatriphenylene-hexacarbonitrile (HAT-CN); and a compound represented by Formula 221 below, but the exemplary embodiments are not limited thereto:

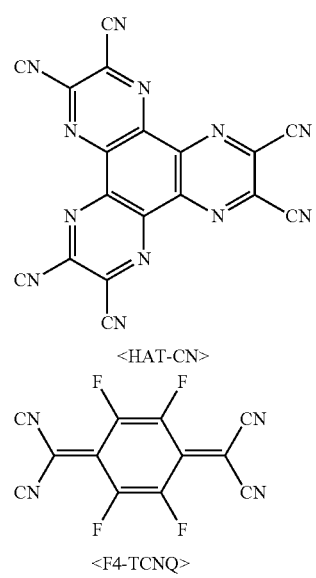

<HAT-CN>

<F4-TCNQ>

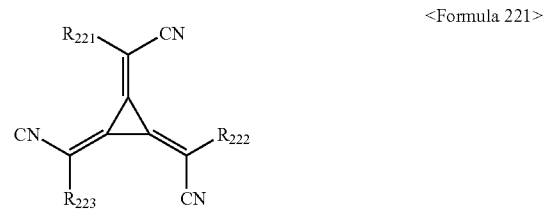

<Formula 221>

In Formula 221, $R_{221}$ to $R_{223}$ may each independently be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one selected from $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

First Emission Layer 130a, Second Emission Layer 130b, and First Layer 130c

The first emission layer 130a, the second emission layer 130b, and the first layer 130c may each include a host and a dopant. The dopant may include at least one selected from a phosphorescent dopant and a fluorescent dopant. The dopant may emit the first-color light to the third-color light. For example, the first-color light to the third-color light may each independently be selected from blue light, red light, and green light. The amount of the dopant may be in a range of about 0.01 parts by weight to about 15 parts by weight based on 100 parts by weight of the host, but the exemplary embodiments are not limited thereto.

The thickness of each of the first emission layer 130a, the second emission layer 130b, and the first layer 130c may each independently be about 100 Å to about 1,000 Å, for example, about 200 Å to about 600 Å. When the thickness of each of the first emission layer 130a, the second emission layer 130b, and the first layer 130c is within this range, excellent light-emission characteristics may be obtained without a substantial increase in driving voltage.

Host in First Emission Layer 130a, Second Emission Layer 130b, and First Layer 130c The host may include a compound represented by Formula 301.

$$[Ar_{301}]_{xb11}-[(L_{301})_{xb1}-R_{301}]_{xb21} \quad \text{<Formula 301>}$$

In Formula 301, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xb1 may be an integer from 0 to 5, $R_{301}$ may be selected from deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), and —P(=O)($Q_{301}$)($Q_{302}$), xb21 may be an integer from 1 to 5, and $Q_{301}$ to $Q_{303}$ may each independently be selected from a $C_1$-$C_{10}$ alkyl group, a $C_1$-$C_{10}$ alkoxy group, a phenyl group, a biphenyl group, a terphenyl group, and a naphthyl group, but the exemplary embodiments are not limited thereto.

In one exemplary embodiment, $Ar_{301}$ in Formula 301 may be selected from:

a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group; and a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, and a dibenzothiophene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group, but the exemplary embodiments are not limited thereto.

When xb11 in Formula 301 is 2 or more, two or more $Ar_{301}$(s) may be linked to each other via a single bond.

In one or more exemplary embodiments, the compound represented by Formula 301 may be represented by Formula 301-1 or 301-2:

<Formula 301-1>

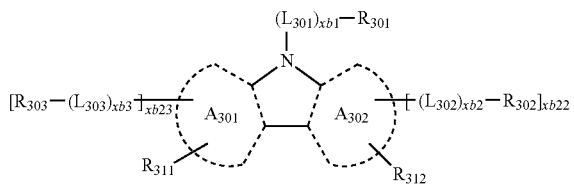

<Formula 301-2>

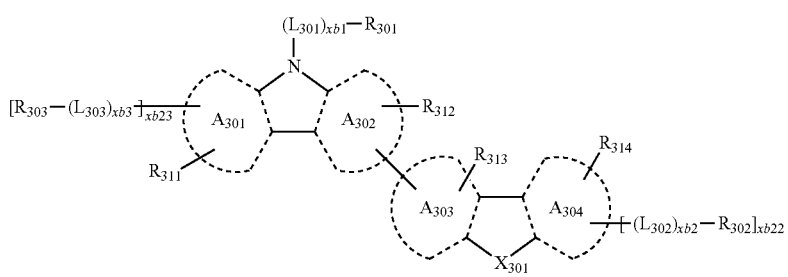

In Formulae 301-1 and 301-2,
ring $A_{301}$ to ring $A_{304}$ may each independently be selected from a benzene ring, a naphthalene ring, a phenanthrene ring, a fluoranthene ring, a triphenylene ring, a pyrene ring, a chrysene ring, a pyridine ring, a pyrimidine ring, an indene ring, a fluorene ring, a spiro-bifluorene ring, a benzofluorene ring, a dibenzofluorene ring, an indole ring, a carbazole ring, a benzocarbazole ring, a dibenzocarbazole ring, a furan ring, a benzofuran ring, a dibenzofuran ring, a naphthofuran ring, a benzonaphthofuran ring, a dinaphthofuran ring, a thiophene ring, a benzothiophene ring, a dibenzothiophene ring, a naphthothiophene ring, a benzonaphthothiophene ring, and a dinaphthothiophene ring, $X_{301}$ may be O, S, or N-[$(L_{304})_{xb4}$-$R_{304}$], $R_{311}$ to $R_{314}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), xb22 and xb23 may each independently be 0, 1, or 2, $L_{301}$, xb1, $R_{301}$, and $Q_{31}$ to $Q_{33}$ are each the same as described above, $L_{302}$ to $L_{304}$ are each independently the same as described in connection with $L_{301}$, Xb2 to xb4 are each independently the same as described in connection with xb1, and $R_{302}$ to $R_{304}$ are each independently the same as described in connection with $R_{301}$.

For example, in Formulae 301, 301-1, and 301-2, $L_{301}$ to $L_{304}$ may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ are the same as described above.

In one exemplary embodiment, in Formulae 301, 301-1, and 301-2, $R_{301}$ to $R_{304}$ may each independently be selected from:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{31}$ to $Q_{33}$ are the same as described above.

In one exemplary embodiment, the host may include an alkaline earth-metal complex. For example, the host may be selected from a Be complex (for example, Compound H55), a Mg complex, and a Zn complex.

In one or more exemplary embodiments, the host may include at least one selected from 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), and Compounds H1 to H55, but the exemplary are not limited thereto:

H1
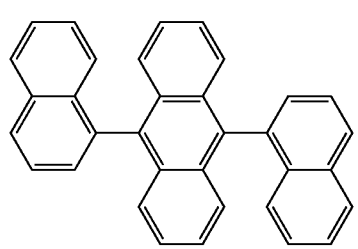

H2
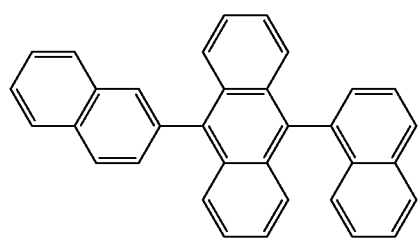

H3
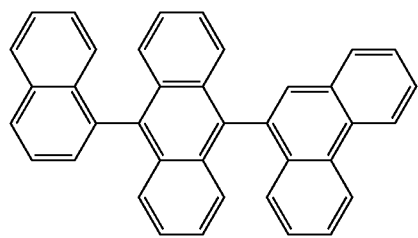

H4
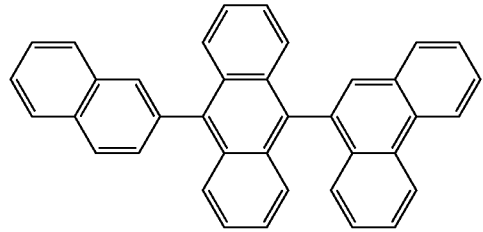

H5
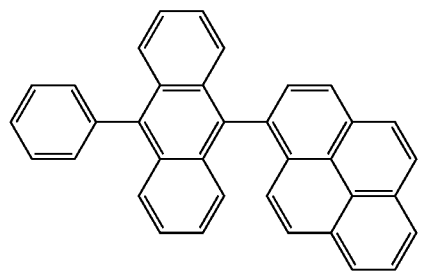

-continued

H6
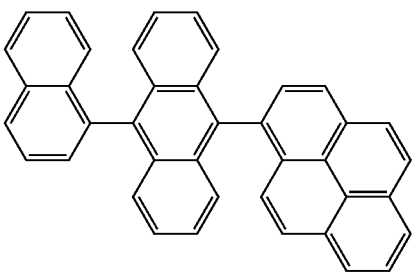

H7
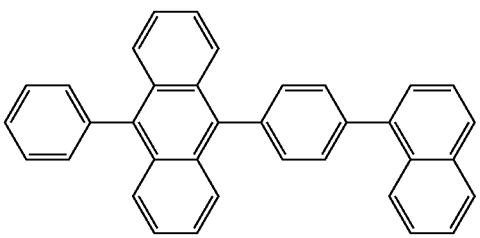

H8
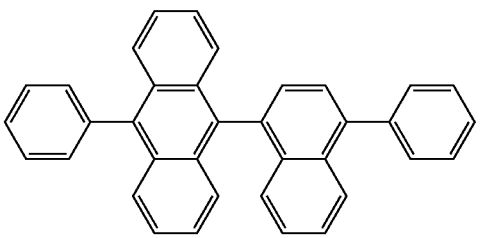

H9
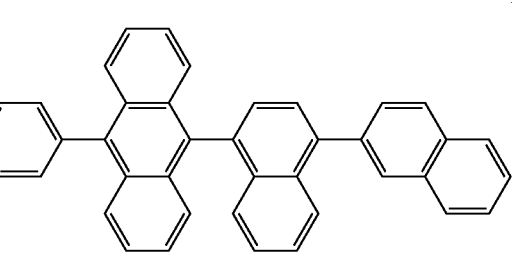

H10
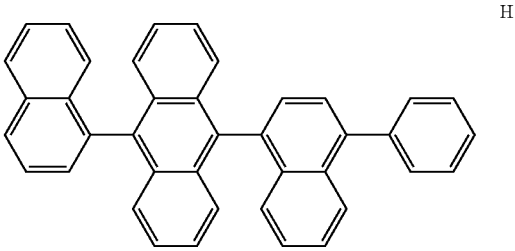

H11
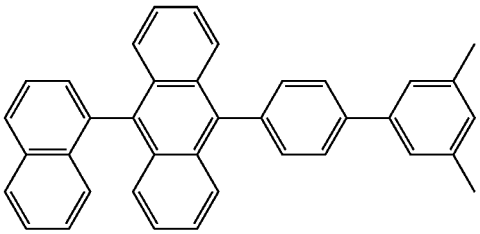

H12
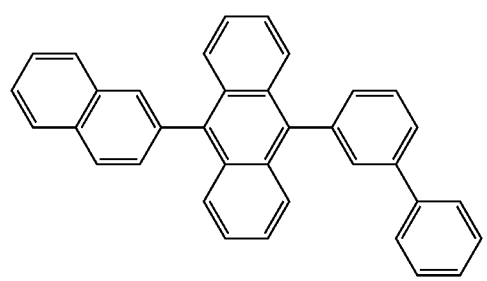
H13
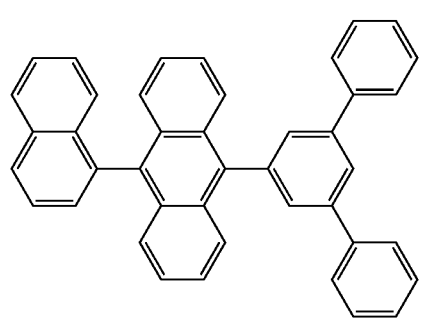
H14
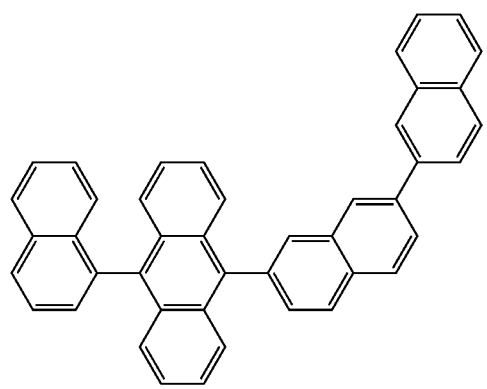
H15
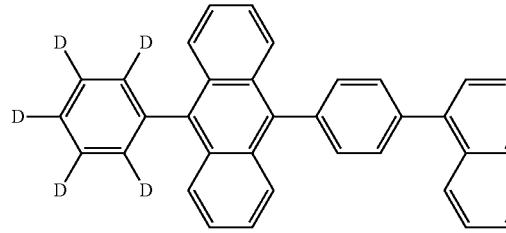
H16
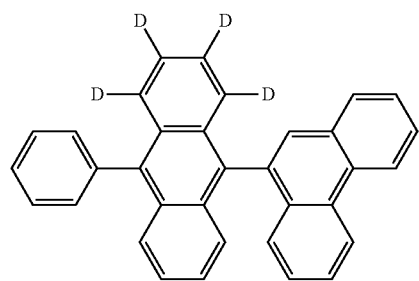
H17
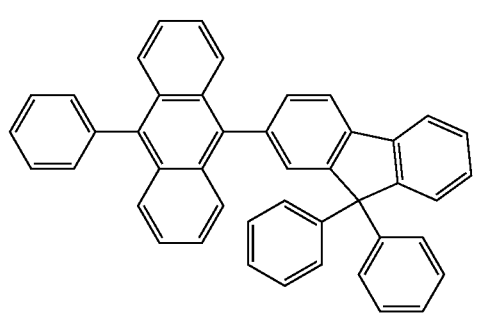
H18
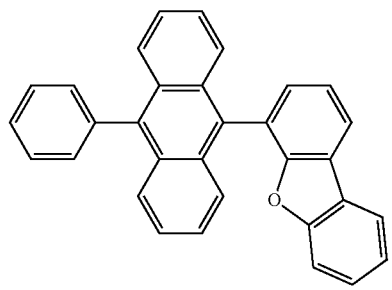
H19
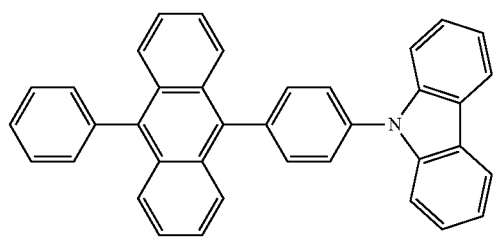
H20
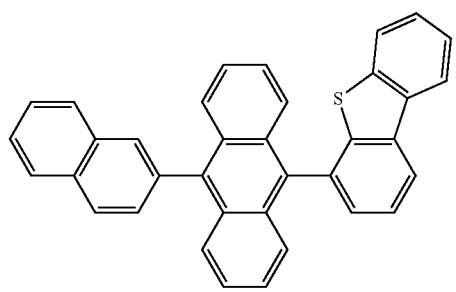
H21
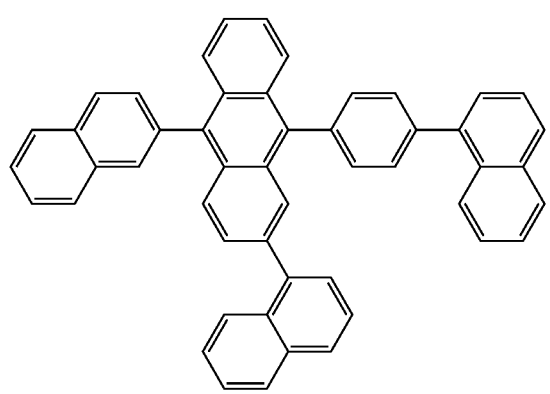

H22
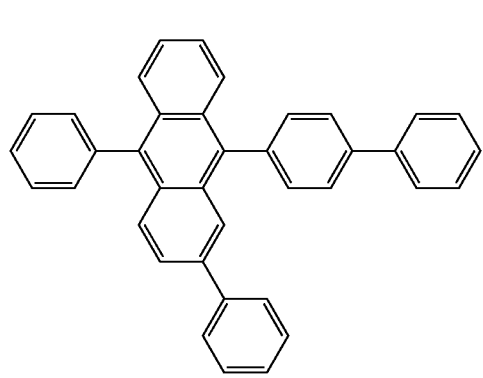
H23
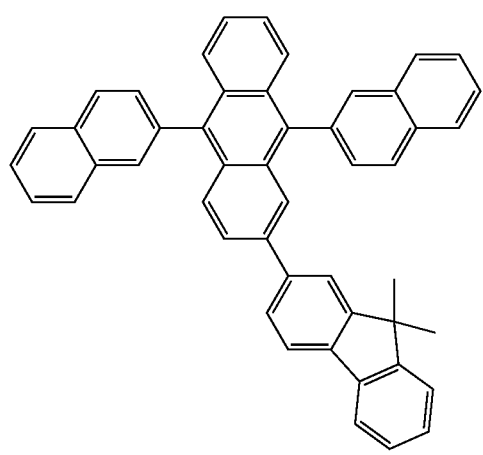
H24
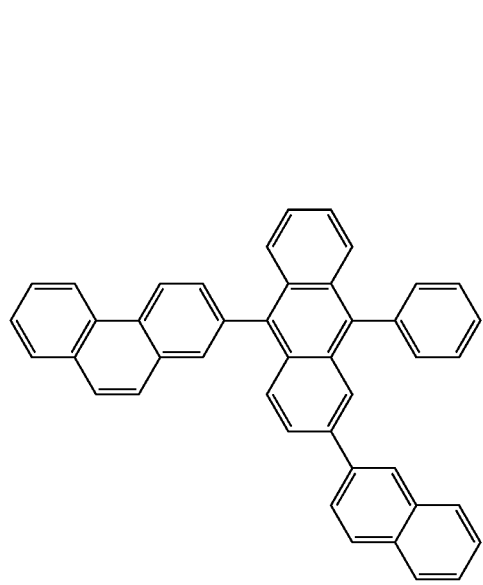
H25
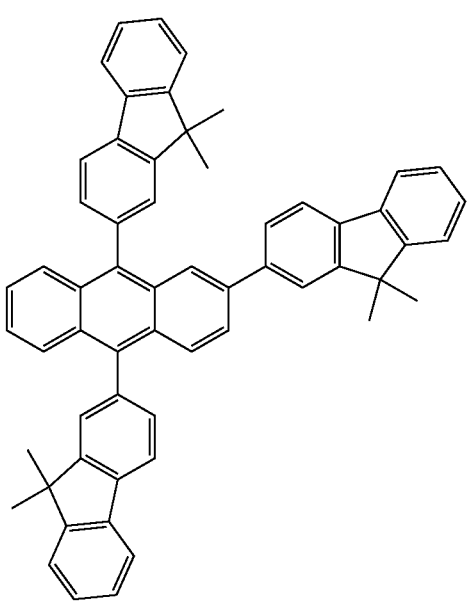
H26
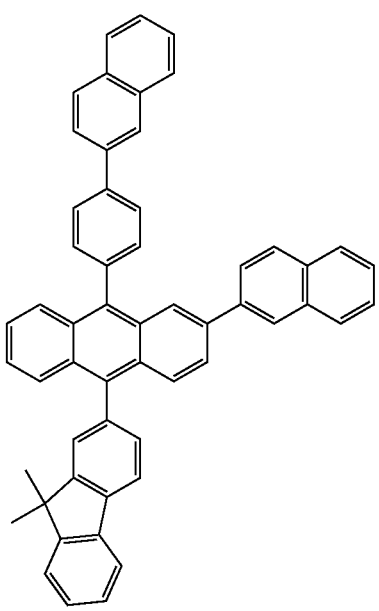

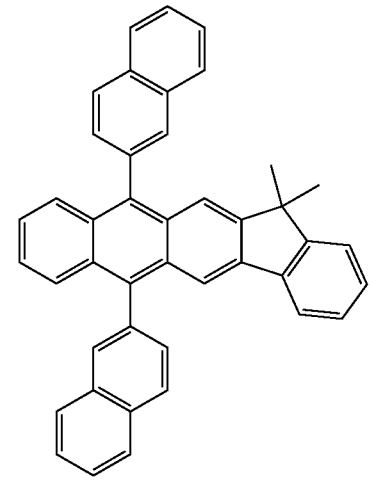
H27
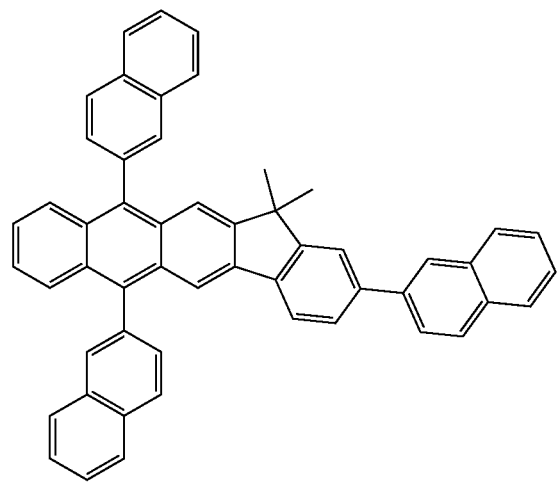
H28
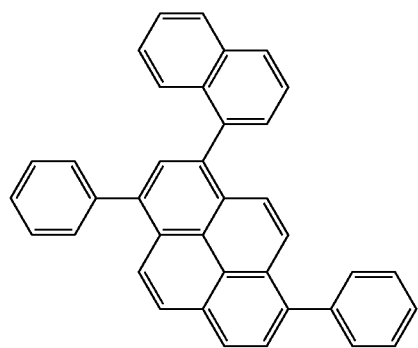
H29
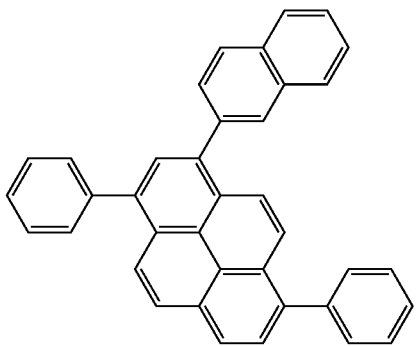
H30
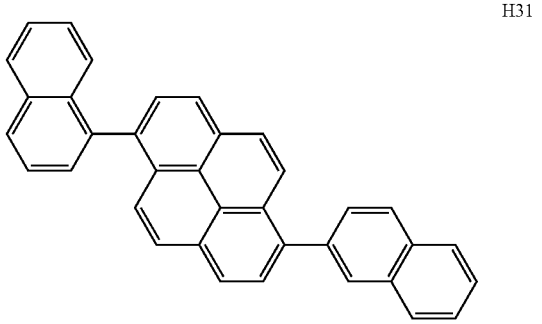
H31
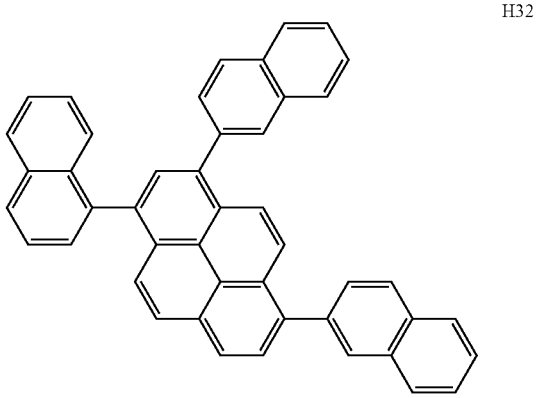
H32
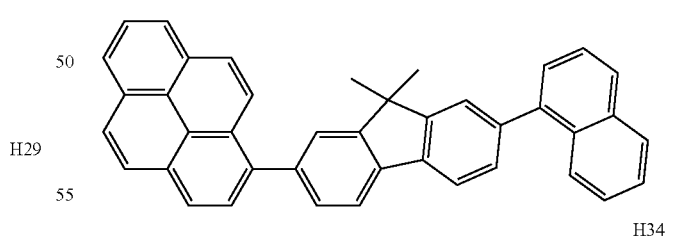
H33
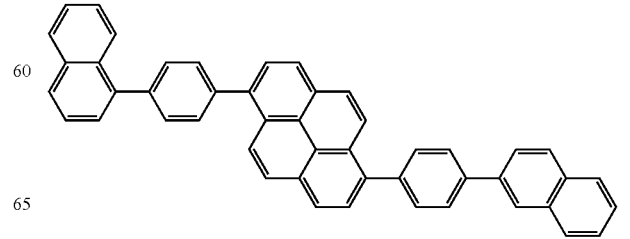
H34

H35
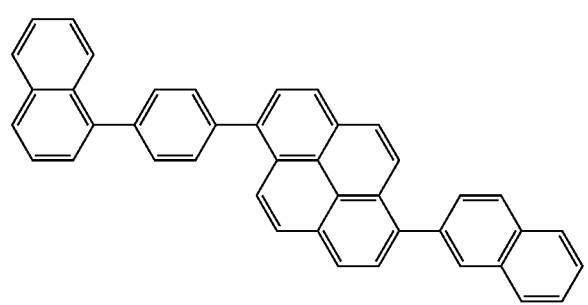
H36
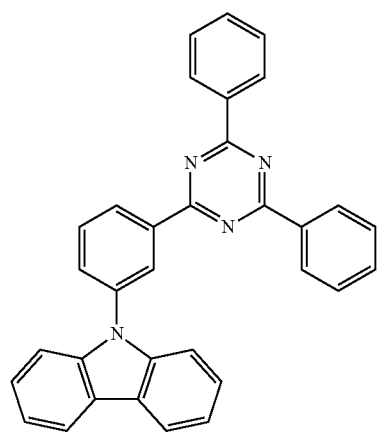
H37
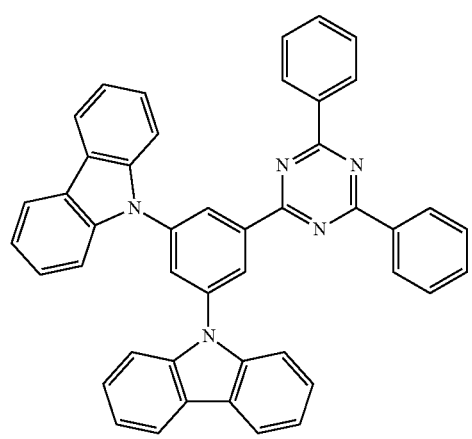
H38
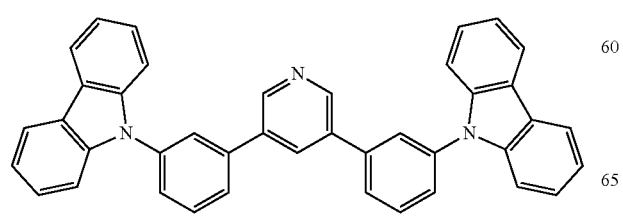
H39
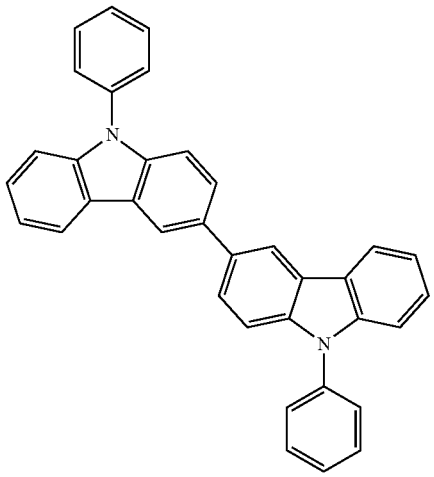
H40
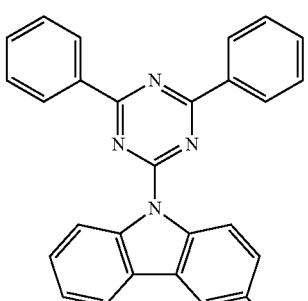
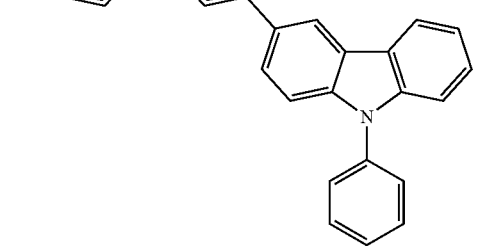
H41
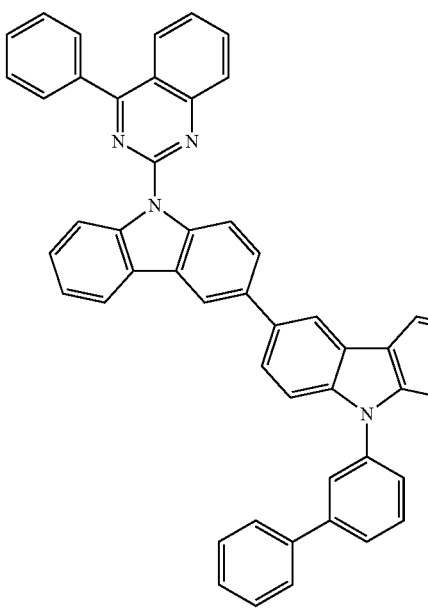

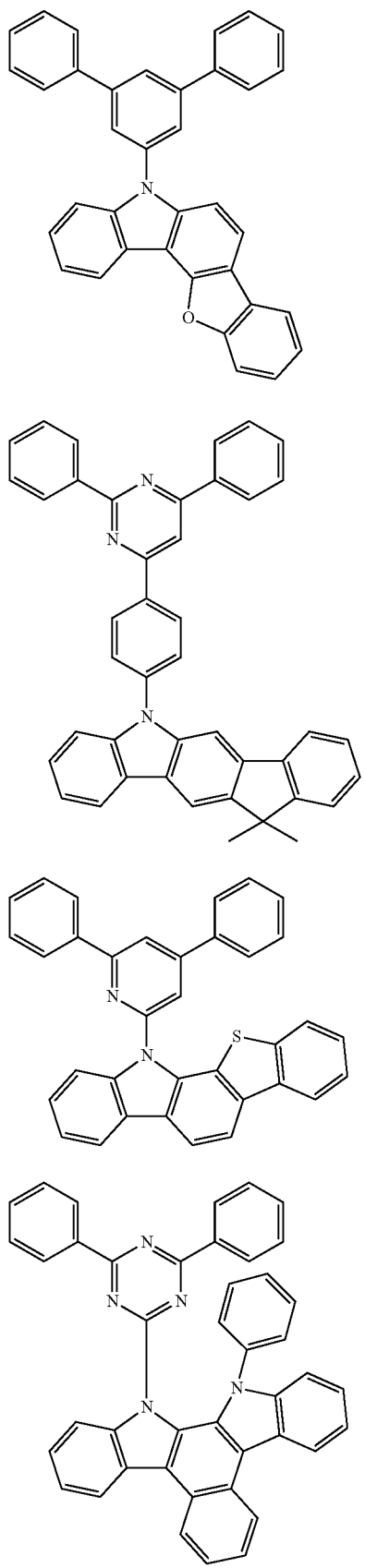
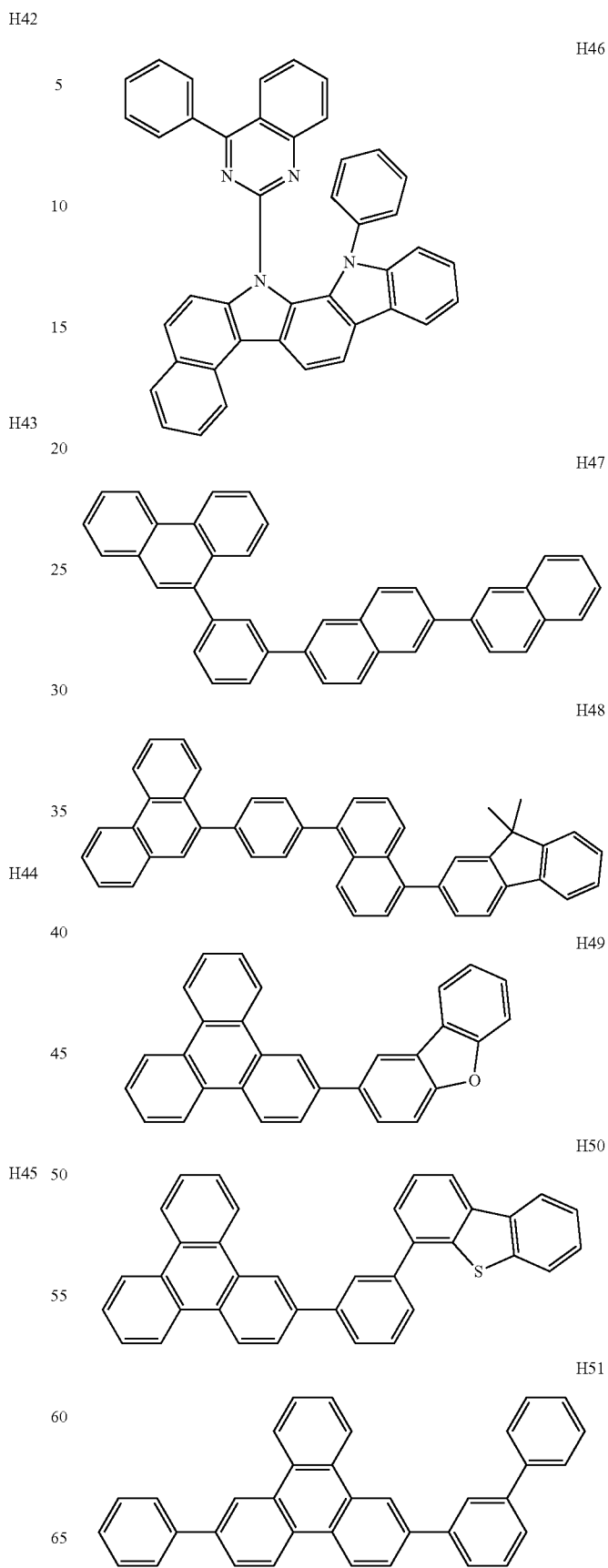

H52

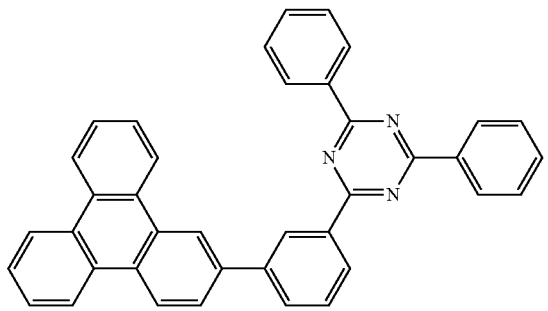

H53

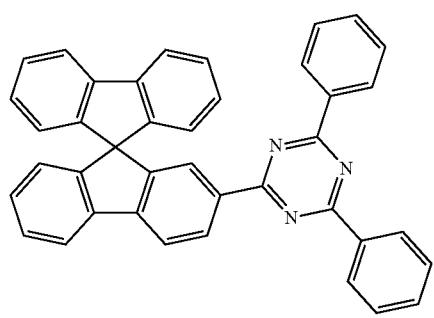

H54

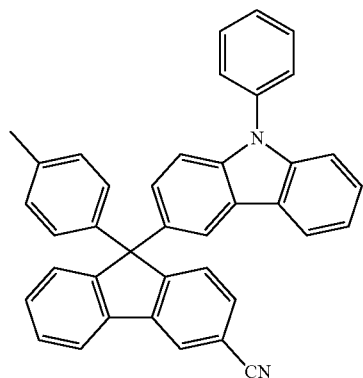

H55

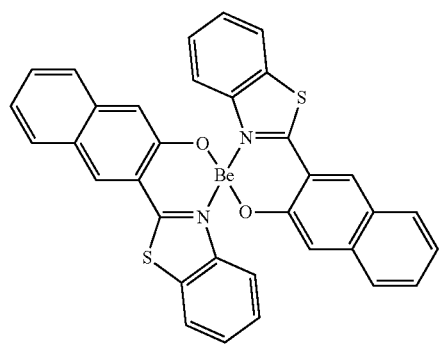

Phosphorescent Dopant Included in First Emission Layer 130a, Second Emission Layer 130b, and First Layer 130c The phosphorescent dopant may include an organometallic complex represented by Formula 401 below:

$$M(L_{401})_{xc1}(L_{402})_{xc2}$$  <Formula 401>

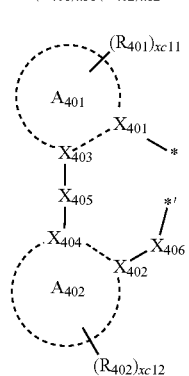

<Formula 402>

In Formulae 401 and 402,

M may be selected from iridium (Ir), platinum (Pt), palladium (Pd), osmium (Os), titanium (Ti), zirconium (Zr), hafnium (Hf), europium (Eu), terbium (Tb), rhodium (Rh), and thulium (Tm), $L_{401}$ may be selected from ligands represented by Formula 402, and xc1 may be 1, 2, or 3, wherein, when xc1 is 2 or more, two or more $L_{401}$(s) may be identical to or different from each other, $L_{402}$ may be an organic ligand, and xc2 may be an integer from 0 to 4, wherein, when xc2 is 2 or more, two or more $L_{402}$(s) may be identical to or different from each other, $X_{401}$ to $X_{404}$ may each independently be nitrogen or carbon, $X_{401}$ and $X_{403}$ may be linked to each other via a single bond or a double bond, and $X_{402}$ and $X_{404}$ may be linked to each other via a single bond or a double bond, $A_{401}$ and $A_{402}$ may each independently be selected from a $C_5$-$C_{60}$ carbocyclic group or a $C_1$-$C_{60}$ heterocyclic group, $X_{405}$ may be a single bond, *—O—*', *—S—*', *—C(=O)—*', *—N($Q_{411}$)—*', *—C($Q_{411}$)($Q_{412}$)-*', *—C($Q_{411}$)=C($Q_{412}$)-*', *—C($Q_{411}$)=*', or *=C=*', wherein $Q_{411}$ and $Q_{412}$ may each independently be hydrogen, deuterium, a $C_1$-$C_{20}$ alkyl group, a $C_1$-$C_{20}$ alkoxy group, a phenyl group, a biphenyl group, a terphenyl group, or a naphthyl group, $X_{406}$ may be a single bond, O, or S, $R_{401}$ and $R_{402}$ may each independently be selected from hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{20}$ alkyl group, a substituted or unsubstituted $C_1$-$C_{20}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$(Q$_{401}$), and —P(=O)(Q$_{401}$)(Q$_{402}$), and Q$_{401}$ to Q$_{403}$ may each independently be selected from a C$_1$-C$_{10}$ alkyl group, a C$_1$-C$_{10}$ alkoxy group, a C$_6$-C$_{20}$ aryl group, and a C$_1$-C$_{20}$ heteroaryl group, xc11 and xc12 may each independently be an integer from 0 to 10, and

* and *' in Formula 402 each indicate a binding site to M in Formula 401.

In one exemplary embodiment, A$_{401}$ and A$_{402}$ in Formula 402 may each independently be selected from a benzene group, a naphthalene group, a fluorene group, a spirobifluorene group, an indene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, a quinoline group, an isoquinoline group, a benzoquinoline group, a quinoxaline group, a quinazoline group, a carbazole group, a benzimidazole group, a benzofuran group, a benzothiophene group, an isobenzothiophene group, a benzoxazole group, an isobenzoxazole group, a triazole group, a tetrazole group, an oxadiazole group, a triazine group, a dibenzofuran group, and a dibenzothiophene group.

In one or more exemplary embodiments, in Formula 402, i) X$_{401}$ may be nitrogen, and X$_{402}$ may be carbon, or ii) each of X$_{401}$ and X$_{402}$ may be nitrogen.

In one or more exemplary embodiments, R$_{401}$ and R$_{402}$ in Formula 402 may each independently be selected from:

hydrogen, deuterium, —F, —Cl, —Br, —I, a hydroxyl group, a cyano group, a nitro group, an amidino group, a hydrazino group, a hydrazono group, a C$_1$-C$_{20}$ alkyl group, and a C$_1$-C$_{20}$ alkoxy group;

a C$_1$-C$_{20}$ alkyl group and a C$_1$-C$_{20}$ alkoxy group, each substituted with at least one selected from deuterium, —F, —Cl, —Br, —I, a hydroxyl group, a cyano group, a nitro group, an amidino group, a hydrazino group, a hydrazono group, a phenyl group, a naphthyl group, a cyclopentyl group, a cyclohexyl group, an adamantanyl group, a norbornanyl group, and a norbornenyl group;

a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group;

a cyclopentyl group, a cyclohexyl group, an adamantanyl group, a norbornanyl group, a norbornenyl group a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group, each substituted with at least one selected from deuterium, —F, —Cl, —Br, —I, a hydroxyl group, a cyano group, a nitro group, an amidino group, a hydrazino group, a hydrazono group, a C$_1$-C$_{20}$ alkyl group, a C$_1$-C$_{20}$ alkoxy group, a cyclopentyl group, a cyclohexyl group, an adamantanyl group, a norbornanyl group, a norbornenyl group, a phenyl group, a biphenyl group, a terphenyl group, a naphthyl group, a fluorenyl group, a pyridinyl group, a pyrazinyl group, a pyrimidinyl group, a pyridazinyl group, a triazinyl group, a quinolinyl group, an isoquinolinyl group, a quinoxalinyl group, a quinazolinyl group, a carbazolyl group, a dibenzofuranyl group, and a dibenzothiophenyl group; and —Si(Q$_{401}$)(Q$_{402}$)(Q$_{403}$), —N(Q$_{401}$)(Q$_{402}$), —B(Q$_{401}$)(Q$_{402}$), —C(=O)(Q$_{401}$), —S(=O)$_2$(Q$_{401}$), and —P(=O)(Q$_{401}$)(Q$_{402}$), and wherein Q$_{401}$ to Q$_{403}$ may each independently be selected from a C$_1$-C$_{10}$ alkyl group, a C$_1$-C$_{10}$ alkoxy group, a phenyl group, a biphenyl group, and a naphthyl group, but the exemplary embodiments are not limited thereto.

In one or more exemplary embodiments, when xc1 in Formula 401 is 2 or more, two A$_{401}$(s) in two or more L$_{401}$(s) may optionally be linked to each other via X$_{407}$, which is a linking group, or two A$_{402}$(s) in two or more L$_{401}$(s) may optionally be linked to each other via X$_{408}$, which is a linking group (see Compounds PD1 to PD4 and PD7). X$_{407}$ and X$_{408}$ may each independently be a single bond, *—O—*', *—S—*', *—C(=O)—*', *—N(Q$_{413}$)-*', *—C(Q$_{413}$)(Q$_{414}$)-*', or *—C(Q$_{413}$)=C(Q$_{414}$)-*' (wherein Q$_{413}$ and Q$_{414}$ may each independently be hydrogen, deuterium, a C$_1$-C$_{20}$ alkyl group, a C$_1$-C$_{20}$ alkoxy group, a phenyl group, a biphenyl group, a terphenyl group, or a naphthyl group), but the exemplary embodiments are not limited thereto.

L$_{402}$ in Formula 401 may be a monovalent, divalent, or trivalent organic ligand. For example, L$_{402}$ may be selected from halogen, diketone (for example, acetylacetonate), carboxylic acid (for example, picolinate), —C(=O), isonitrile, —CN, and a phosphorus-containing material (for example, phosphine, or phosphite), but the exemplary embodiments are not limited thereto.

In one or more exemplary embodiments, the phosphorescent dopant may be selected from, for example, Compounds PD1 to PD25, but the exemplary embodiments are not limited thereto:

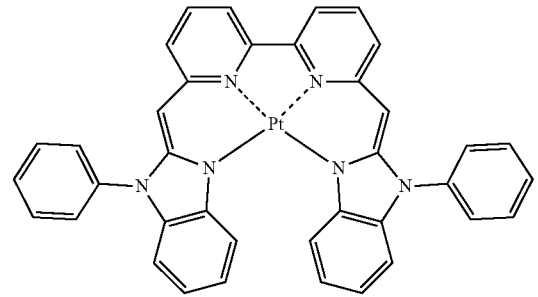

PD1

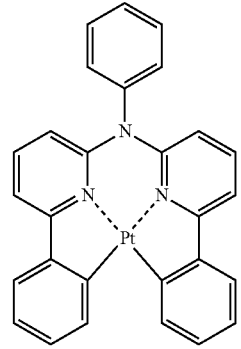

PD2

-continued
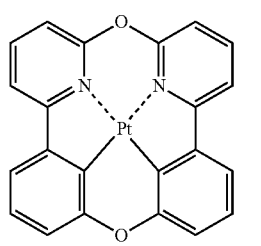
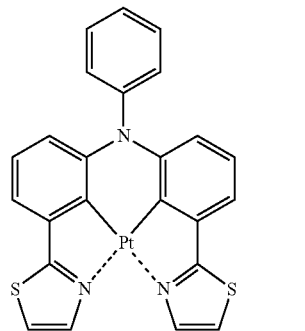
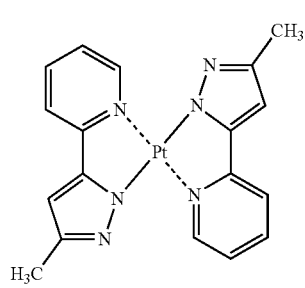
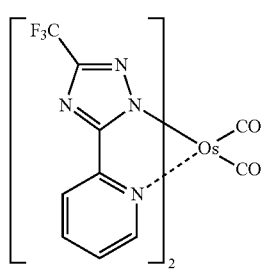
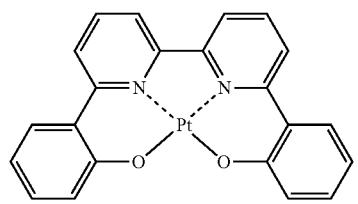
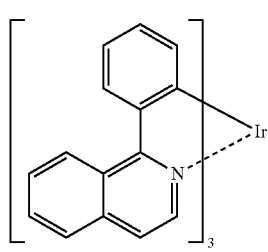
-continued
PD3
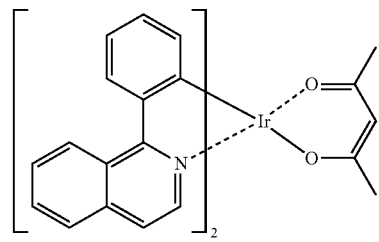
PD4
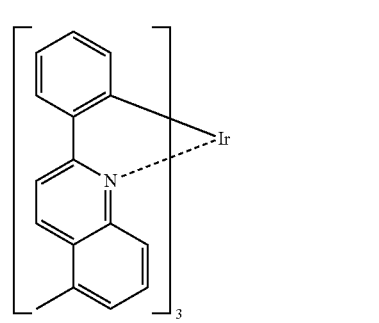
PD5
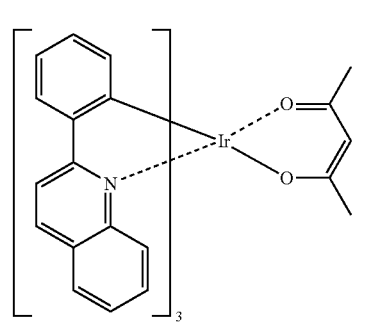
PD6
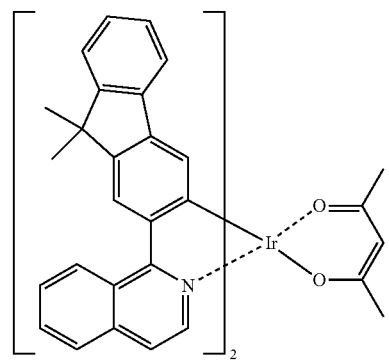
PD7
PD8
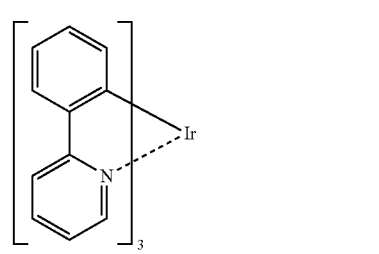
PD9
PD10
PD11
PD12
PD13

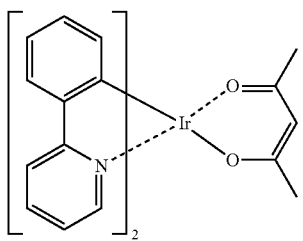
PD14
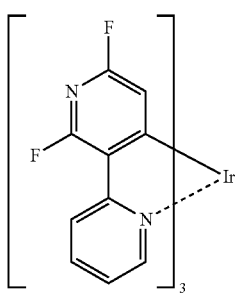
PD15
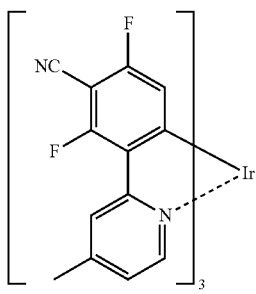
PD16
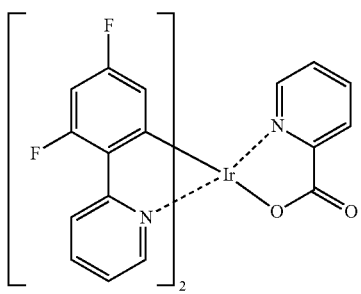
PD17
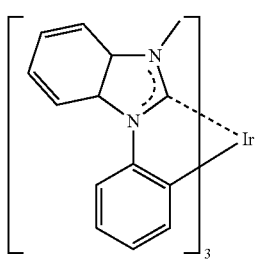
PD18
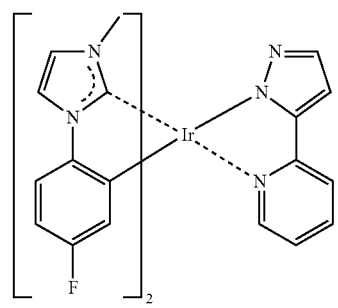
PD19
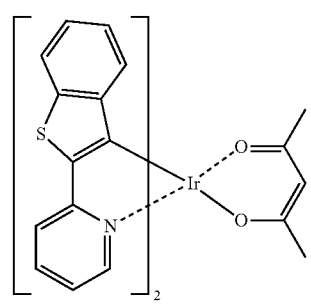
PD20
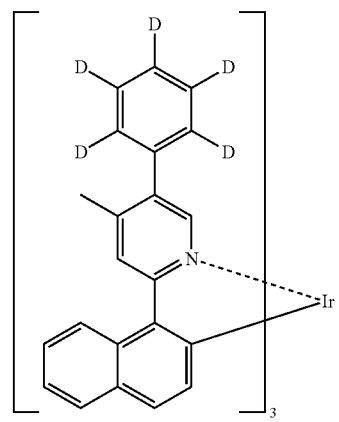
PD21
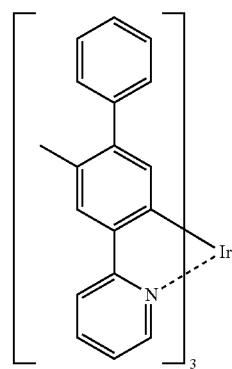
PD22

-continued

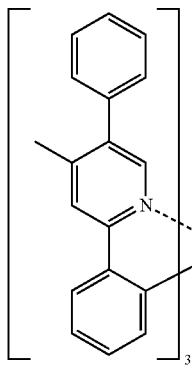

PD23

PD24

PD25

Fluorescent Dopant in First Emission Layer 130a, Second Emission Layer 130b and First Layer 130c

The fluorescent dopant may include an arylamine compound or a styrylamine compound. The fluorescent dopant may include a compound represented by Formula 501:

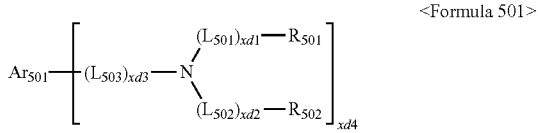

<Formula 501>

In Formula 501,

Ar$_{501}$ may be a substituted or unsubstituted C$_5$-C$_{60}$ carbocyclic group or a substituted or unsubstituted C$_1$-C$_{60}$ heterocyclic group, L$_{501}$ to L$_{503}$ may each independently be selected from a substituted or unsubstituted C$_3$-C$_{10}$ cycloalkylene group, a substituted or unsubstituted C$_1$-C$_{10}$ heterocycloalkylene group, a substituted or unsubstituted C$_3$-C$_{10}$ cycloalkenylene group, a substituted or unsubstituted C$_1$-C$_{10}$ heterocycloalkenylene group, a substituted or unsubstituted C$_6$-C$_{60}$ arylene group, a substituted or unsubstituted C$_1$-C$_{60}$ heteroarylene group, a substituted or unsubstituted divalent non-aromatic condensed polycyclic group, and a substituted or unsubstituted divalent non-aromatic condensed heteropolycyclic group, xd1 to xd3 may each independently be an integer from 0 to 3, R$_{501}$ and R$_{502}$ may each independently be selected from a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, and a substituted or unsubstituted monovalent non-aromatic condensed heteropolycyclic group, and xd4 may be an integer from 1 to 6.

In one exemplary embodiment, Ar$_{501}$ in Formula 501 may be selected from:

a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group; and a naphthalene group, a heptalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, and an indenophenanthrene group, each substituted with at least one selected from deuterium, —F, —Cl, —Br, —I, a hydroxyl group, a cyano group, a nitro group, an amidino group, a hydrazino group, a hydrazono group, a C$_1$-C$_{20}$ alkyl group, a C$_1$-C$_{20}$ alkoxy group, a phenyl group, a biphenyl group, a terphenyl group, and a naphthyl group.

In one or more exemplary embodiments, L$_{501}$ to L$_{503}$ in Formula 501 may each independently be selected from:

a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group; and a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group.

In one or more exemplary embodiments, $R_{501}$ and $R_{502}$ in Formula 501 may each independently be selected from:
- a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group; and
- a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, and —Si($Q_{31}$)($Q_{32}$)($Q_{33}$), wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

In one or more exemplary embodiments, xd4 in Formula 501 may be 2, but the exemplary embodiments are not limited thereto. For example, the fluorescent dopant may be selected from Compounds FD1 to FD22:

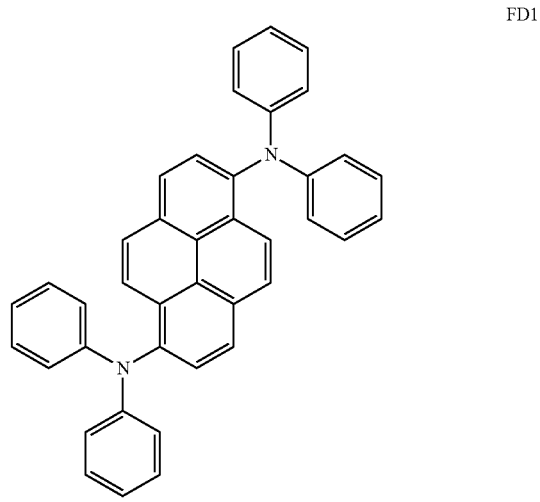

FD1

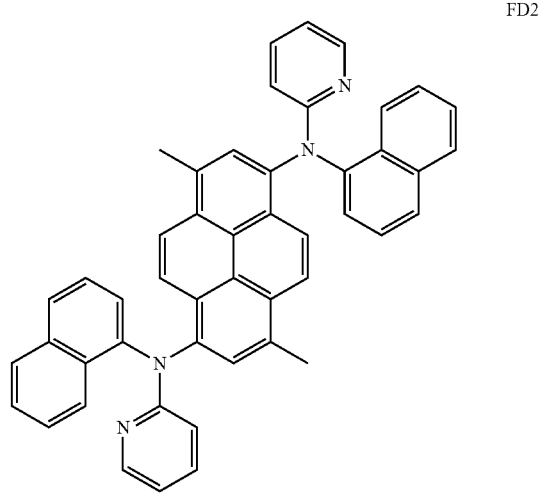

FD2

-continued
FD3
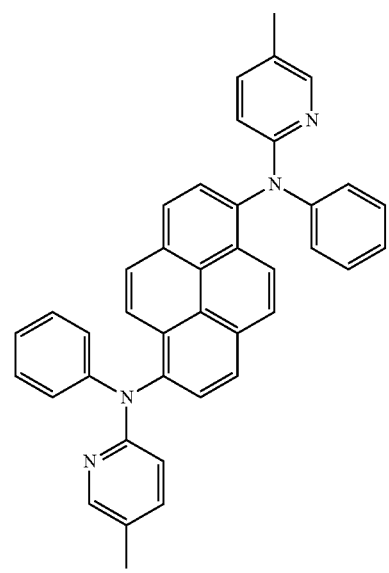
FD4
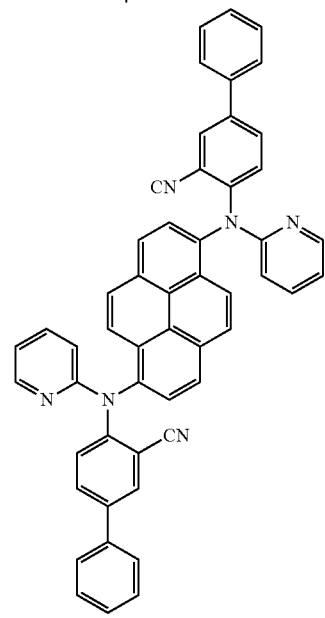
FD5
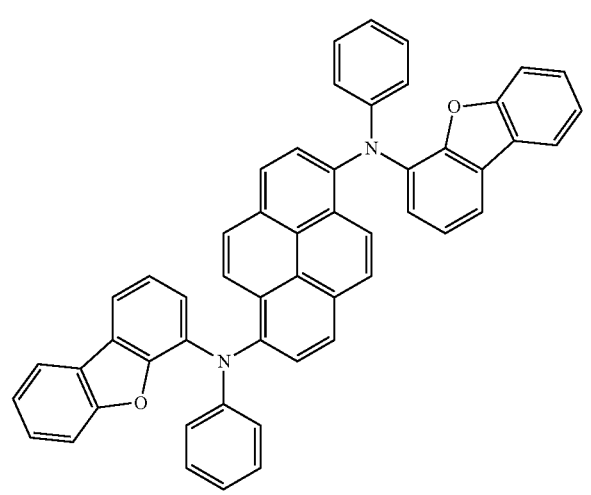
-continued
FD6
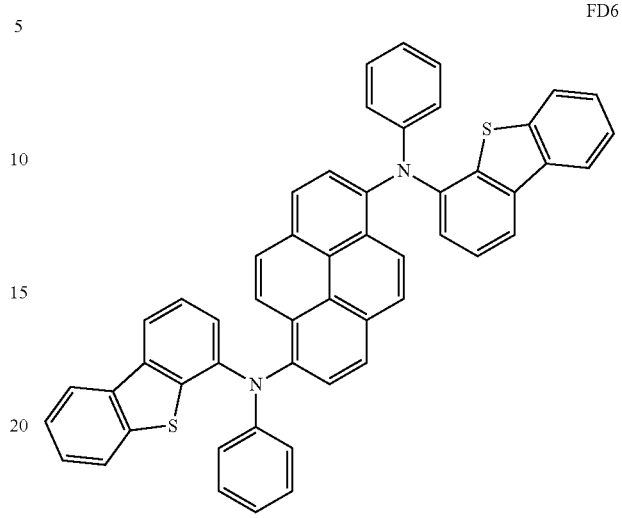
FD7
FD8
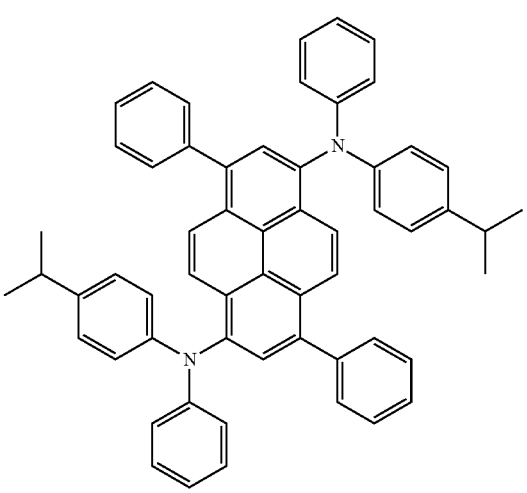

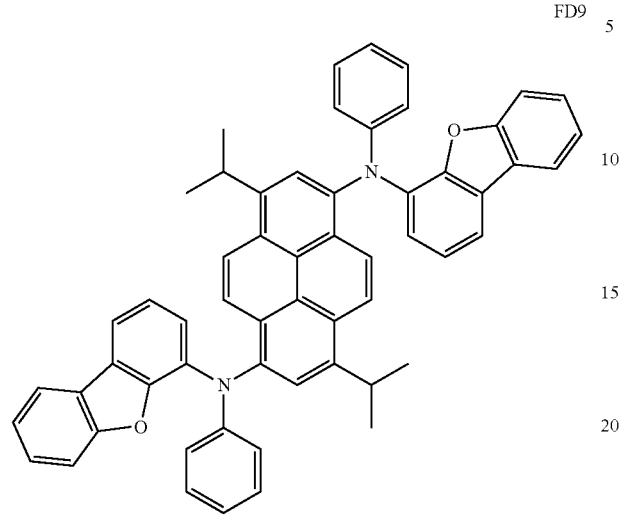
FD9
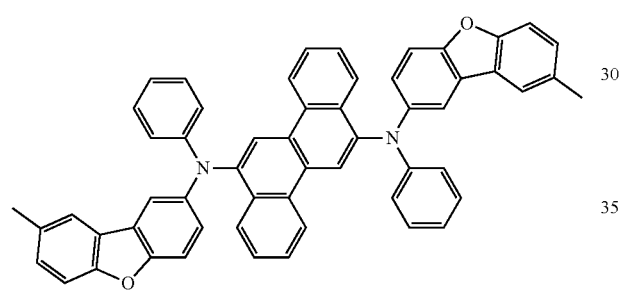
FD10
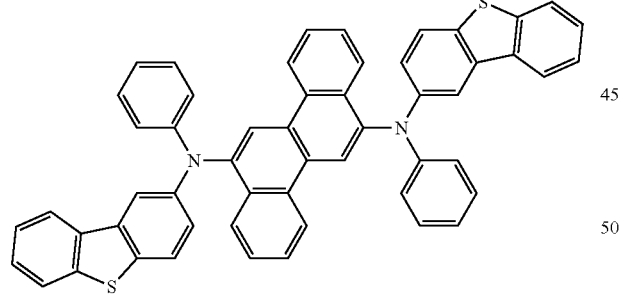
FD11
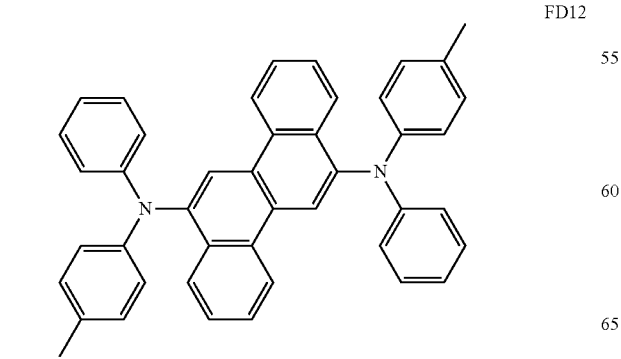
FD12
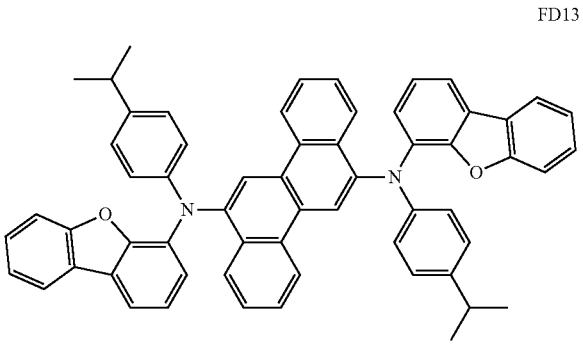
FD13
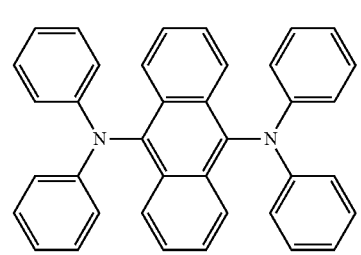
FD14
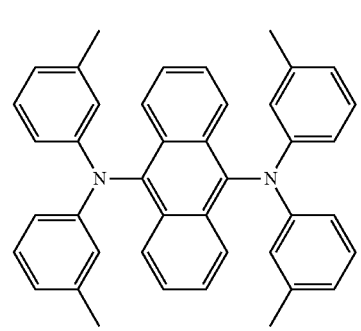
FD15
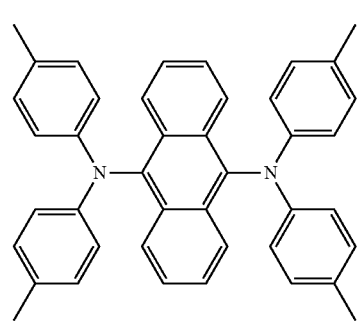
FD16
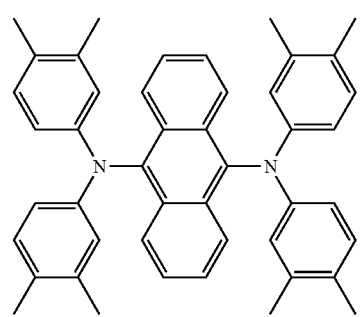
FD17

FD18
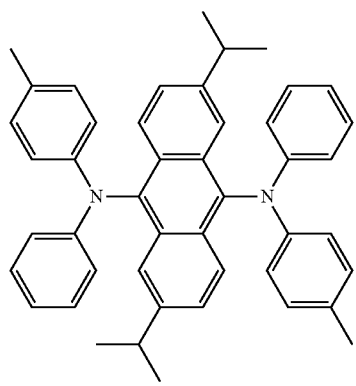
FD20
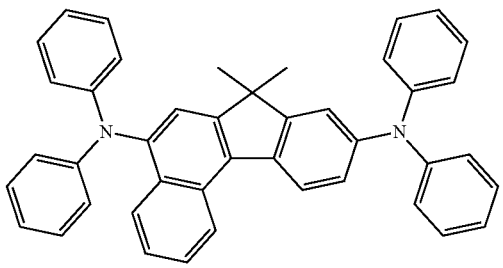
FD19
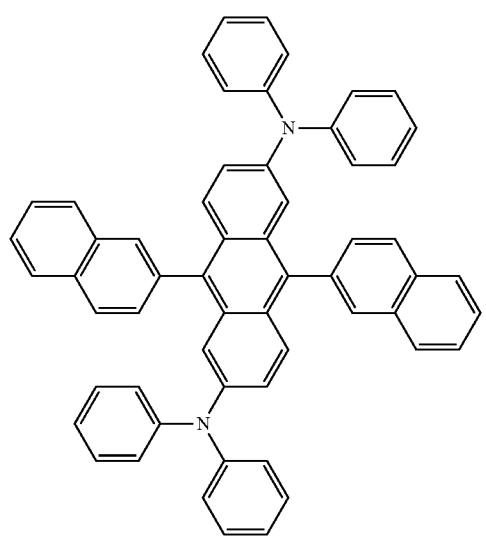
FD21
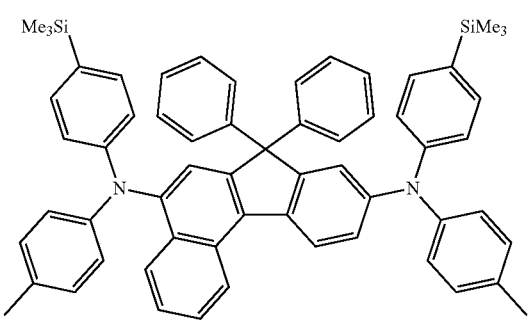
FD22
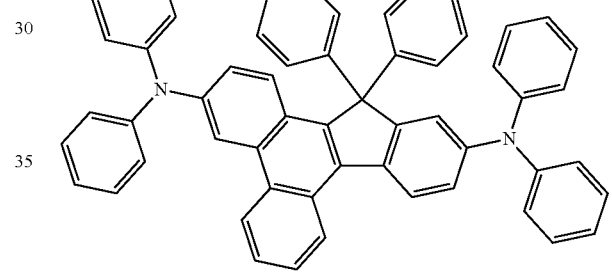
In one or more exemplary embodiments, the fluorescent dopant may be selected from the following compounds, but the exemplary embodiments are not limited thereto:
DPVBi
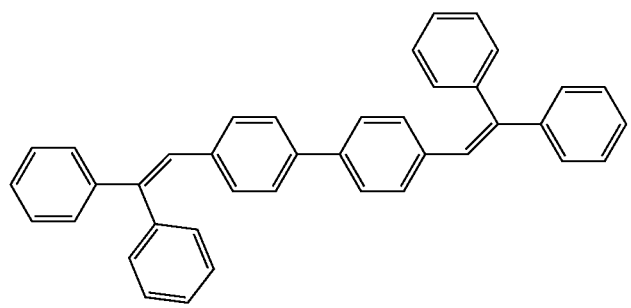
DPAVBi
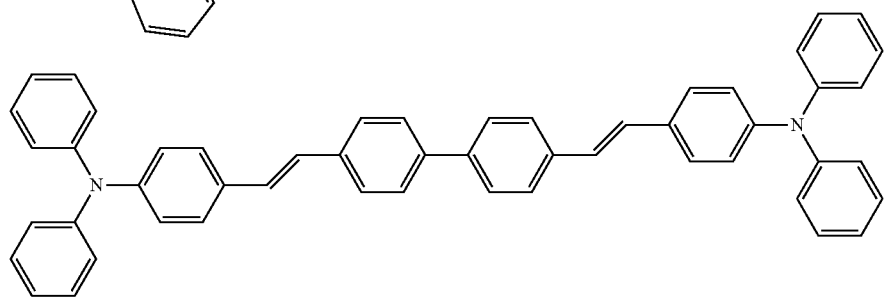

TBPe

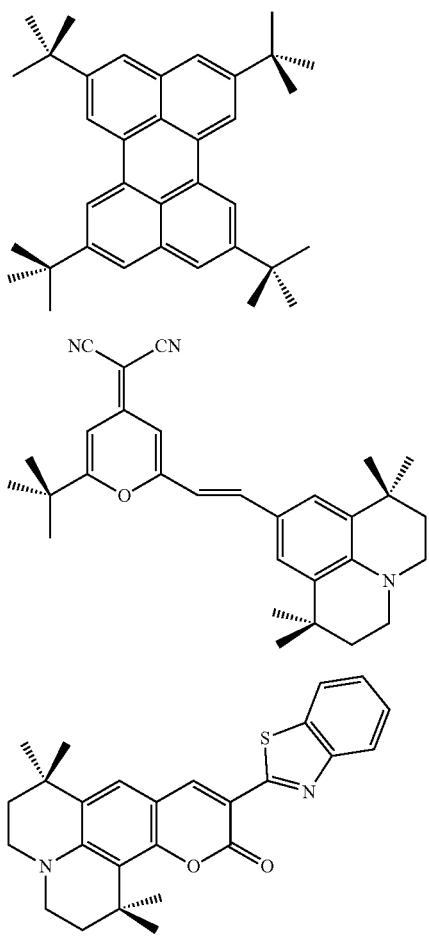

DCJTB

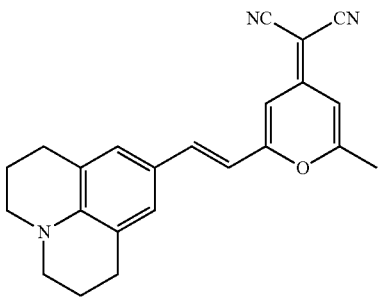

DCM

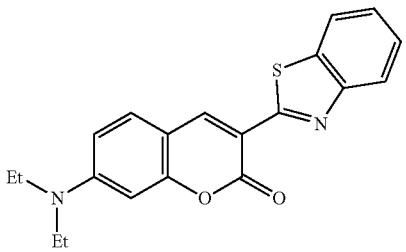

Coumarin 6

C545T

Electron Transport Region

The electron transport region may have i) a single-layered structure including a single layer including a single material, ii) a single-layered structure including a single layer including a plurality of different materials, or iii) a multi-layered structure having a plurality of layers including a plurality of different materials.

The electron transport region may include, in addition to the electron transport layer 142 or the buffer layer illustrated in FIG. 1, at least one layer selected from a hole blocking layer, an electron control layer, and an electron injection layer, but the exemplary embodiments are not limited thereto.

For example, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein for each structure, constituting layers are sequentially stacked from an emission layer. However, the exemplary embodiments of the structure of the electron transport region are not limited thereto.

The electron transport region (for example, the buffer layer, the hole blocking layer, the electron control layer, or the electron transport layer 142 in the electron transport region) may include a metal-free compound containing at least one π electron-deficient nitrogen-containing ring.

The "π electron-deficient nitrogen-containing ring" indicates a $C_1$-$C_{60}$ heterocyclic group having at least one *—N=*' moiety as a ring-forming moiety.

For example, the "π electron-deficient nitrogen-containing ring" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are fused with each other, or iii) a heteropolycyclic group in which at least one of 5-membered to 7-membered heteromonocyclic groups, each having at least one *—N=*' moiety, is fused with at least one $C_5$-$C_{60}$ carbocyclic group.

Examples of the π electron-deficient nitrogen-containing ring include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

For example, the electron transport region may include a compound represented by Formula 601 below:

$$[Ar_{601}]_{xe11}\text{-}[(L_{601})_{xe1}\text{-}R_{601}]_{xe21}$$ <Formula 601>

In Formula 601, $Ar_{601}$ may be a substituted or unsubstituted $C_5$-$C_{60}$ carbocyclic group or a substituted or unsubstituted $C_1$-$C_{60}$ heterocyclic group, xe11 may be 1, 2, or 3, $L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group, xe1 may be an integer from 0 to 5, $R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_{601})(Q_{602})(Q_{603})$, $-C(=O)(Q_{601})$, $-S(=O)_2(Q_{601})$, and $-P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In one exemplary embodiment, at least one of $Ar_{601}$(s) in the number of xe11 and $R_{601}$(s) in the number of xe21 may include the π electron-deficient nitrogen-containing ring.

In one exemplary embodiment, $Ar_{601}$ in Formula 601 may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group; and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, $-Si(Q_{31})(Q_{32})(Q_{33})$, $-S(=O)_2(Q_{31})$, and $-P(=O)(Q_{31})(Q_{32})$, and wherein $Q_{31}$ to $Q_{33}$ may each independently be selected from a $C_1$-$C_{10}$ alkyl group, a $C_1$-$C_{10}$ alkoxy group, a phenyl group, a biphenyl group, a terphenyl group, and a naphthyl group.

When xe11 in Formula 601 is 2 or more, two or more $Ar_{601}$(s) may be linked to each other via a single bond.

In one or more exemplary embodiments, $Ar_{601}$ in Formula 601 may be an anthracene group.

In one or more exemplary embodiments, a compound represented by Formula 601 may be represented by Formula 601-1 below:

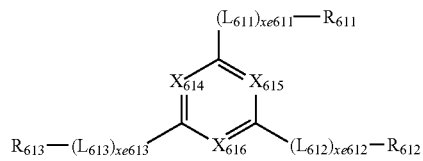

<Formula 601-1>

In Formula 601-1, $X_{614}$ may be N or $C(R_{614})$, $X_{615}$ may be N or $C(R_{615})$, $X_{616}$ may be N or $C(R_{616})$, and at least one selected from $X_{614}$ to $X_{616}$ may be N, $L_{611}$ to $L_{613}$ are each independently the same as described in connection with $L_{601}$, xe611 to xe613 are each independently the same as described in connection with xe1, $R_{611}$ to $R_{613}$ are each independently the same as described in connection with $R_{601}$, and $R_{614}$ to $R_{616}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, and a naphthyl group.

In one exemplary embodiment, $L_{601}$ and $L_{611}$ to $L_{613}$ in Formulae 601 and 601-1 may each independently be selected from:

- a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group; and
- a phenylene group, a naphthylene group, a fluorenylene group, a spiro-bifluorenylene group, a benzofluorenylene group, a dibenzofluorenylene group, a phenanthrenylene group, an anthracenylene group, a fluoranthenylene group, a triphenylenylene group, a pyrenylene group, a chrysenylene group, a perylenylene group, a pentaphenylene group, a hexacenylene group, a pentacenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, a pyridinylene group, an imidazolylene group, a pyrazolylene group, a thiazolylene group, an isothiazolylene group, an oxazolylene group, an isoxazolylene group, a thiadiazolylene group, an oxadiazolylene group, a pyrazinylene group, a pyrimidinylene group, a pyridazinylene group, a triazinylene group, a quinolinylene group, an isoquinolinylene group, a benzoquinolinylene group, a phthalazinylene group, a naphthyridinylene group, a quinoxalinylene group, a quinazolinylene group, a cinnolinylene group, a phenanthridinylene group, an acridinylene group, a phenanthrolinylene group, a phenazinylene group, a benzimidazolylene group, an isobenzothiazolylene group, a benzoxazolylene group, an isobenzoxazolylene group, a triazolylene group, a tetrazolylene group, an imidazopyridinylene group, an imidazopyrimidinylene group, and an azacarbazolylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, but the exemplary embodiments are not limited thereto.

In one or more exemplary embodiments, xe1 and xe611 to xe613 in Formulae 601 and 601-1 may each independently be 0, 1, or 2.

In one or more exemplary embodiments, $R_{601}$ and $R_{611}$ to $R_{613}$ in Formulae 601 and 601-1 may each independently be selected from:

- a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, and an azacarbazolyl group; and —S(=O)$_2$(Q$_{601}$) and —P(=O)(Q$_{601}$)(Q$_{602}$), wherein Q$_{601}$ and Q$_{602}$ are the same as described above.

The electron transport region may include at least one compound selected from Compounds ET1 to ET36, but the exemplary embodiments are not limited thereto:

ET1
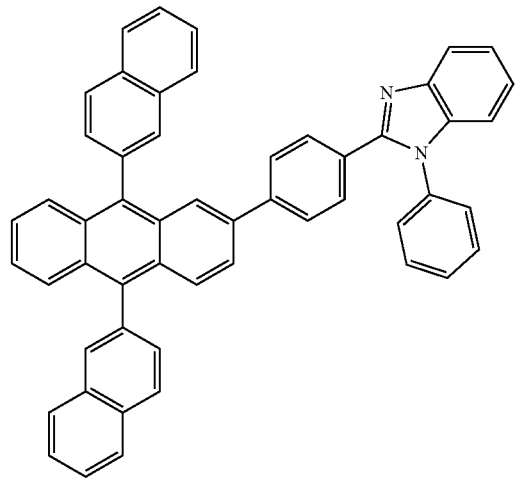

ET2
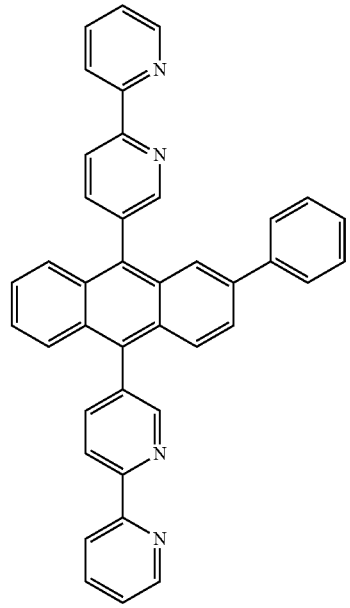

ET3
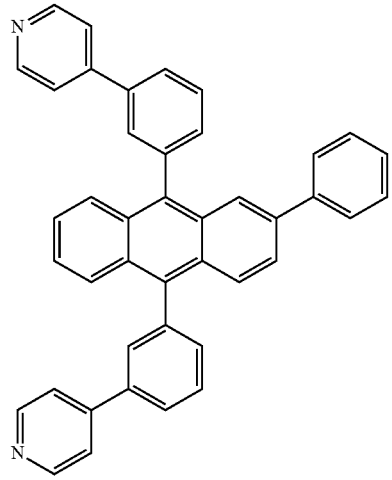

ET4
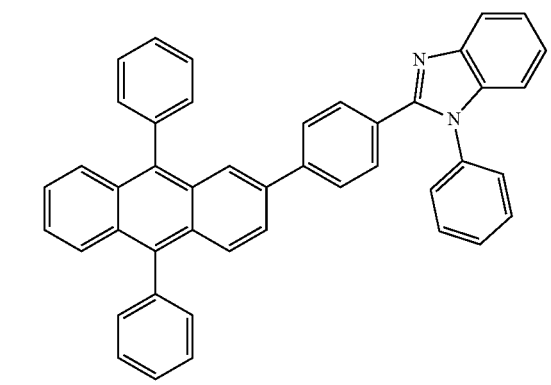
ET5
ET6
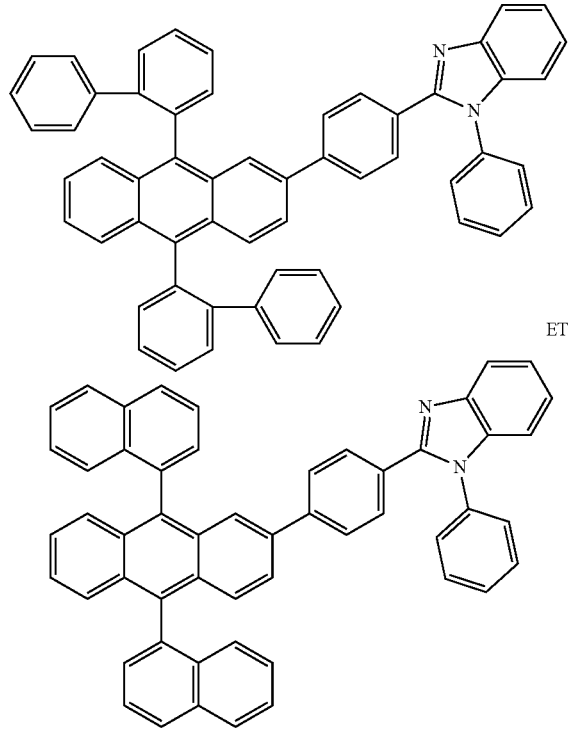
ET7
ET8
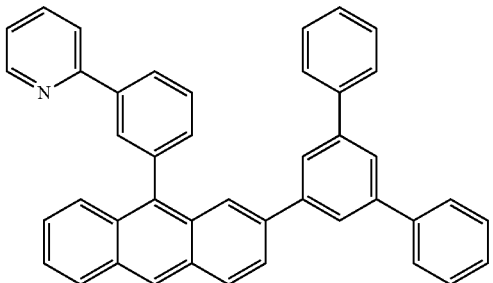
ET9
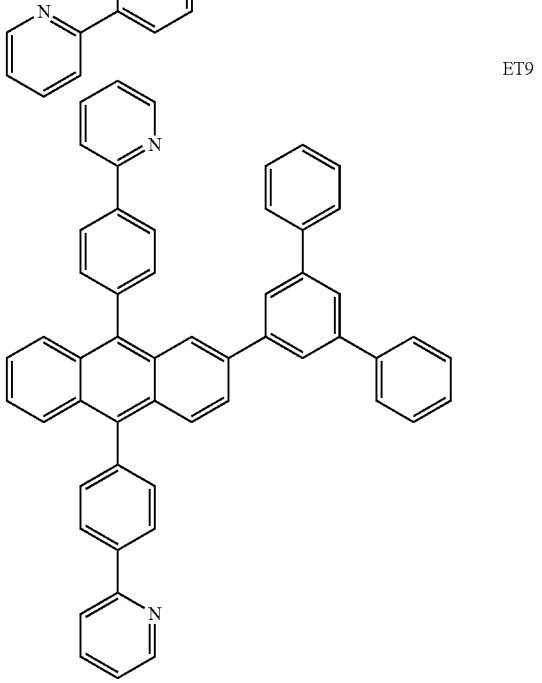
ET10

ET11
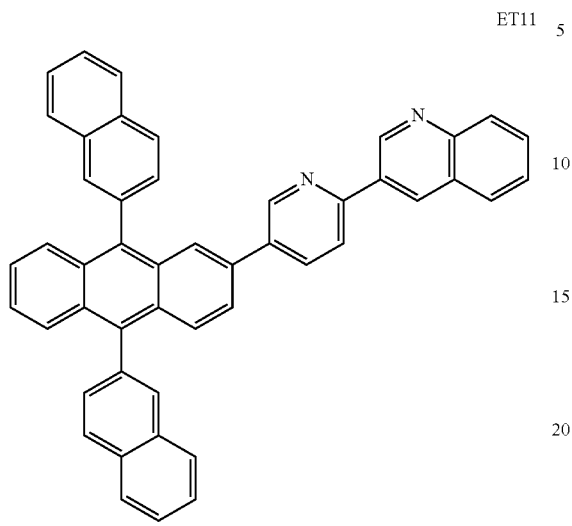
ET12
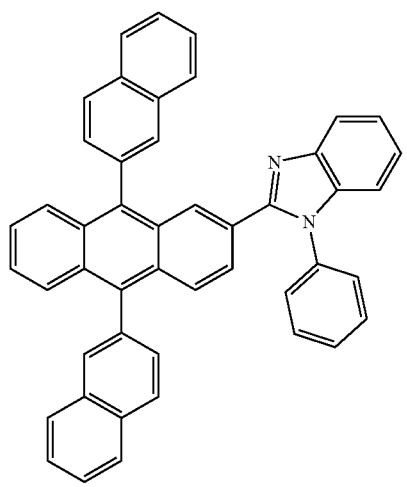
ET13
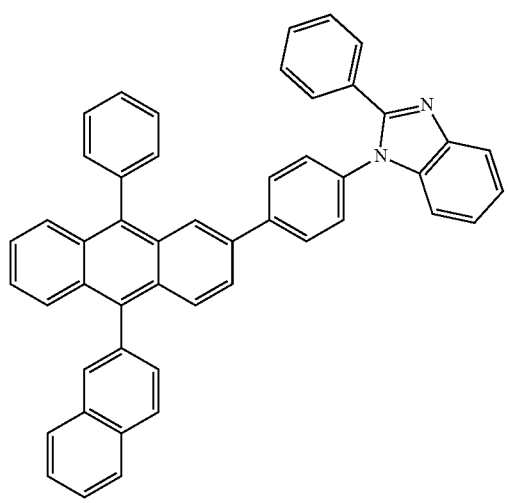
ET14
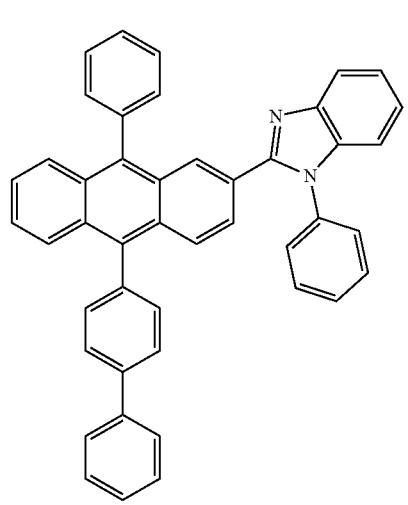
ET15
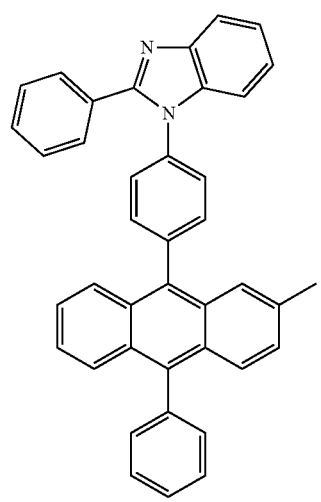
ET16
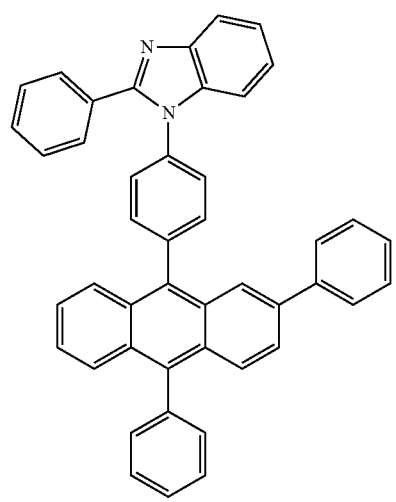

ET17
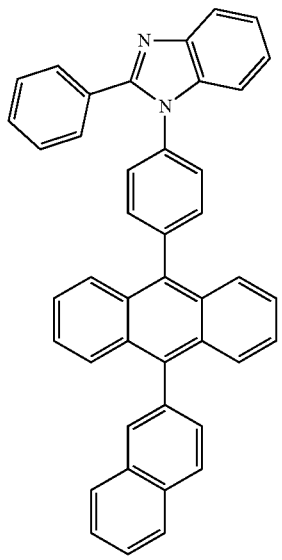
ET18
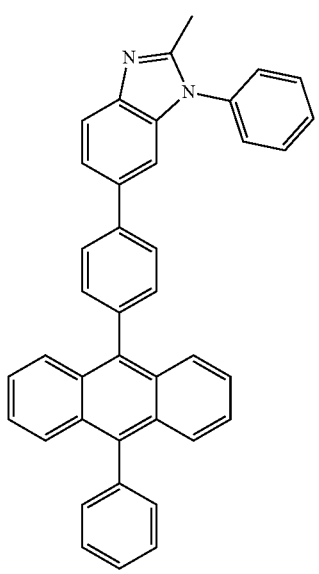
ET20
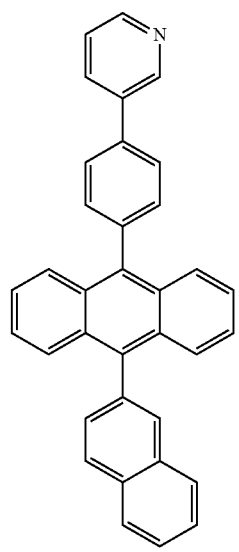
ET21
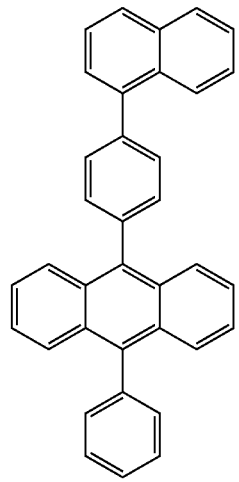
ET19
ET22
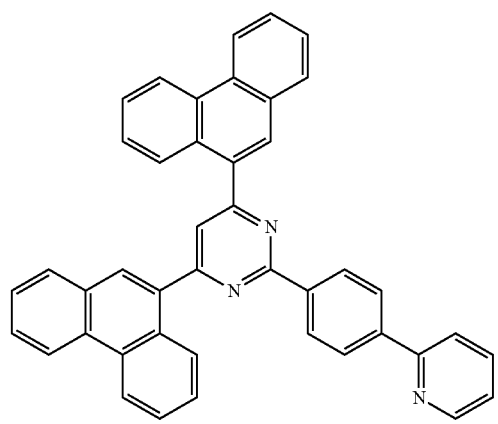

ET23
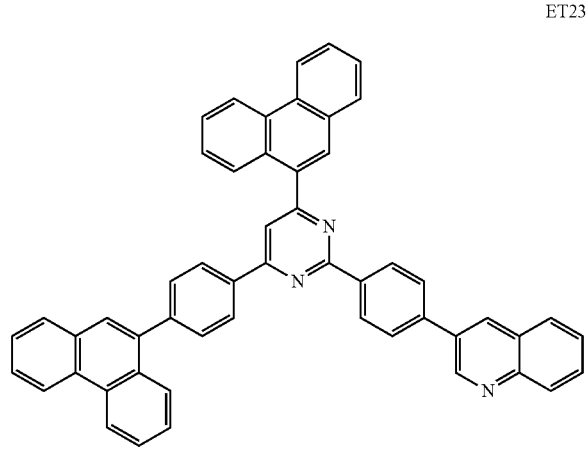
ET26
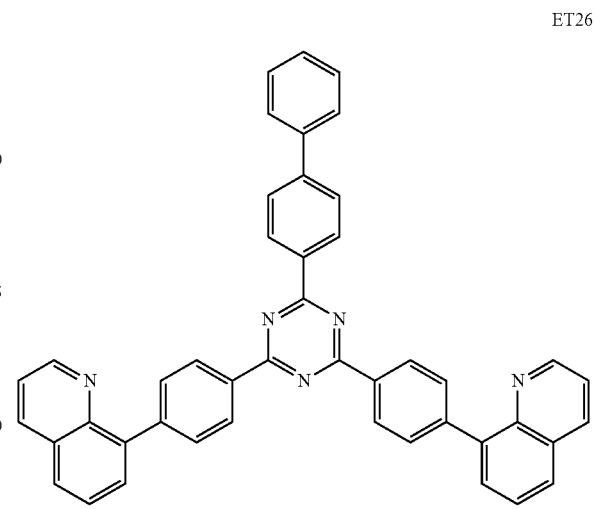
ET24
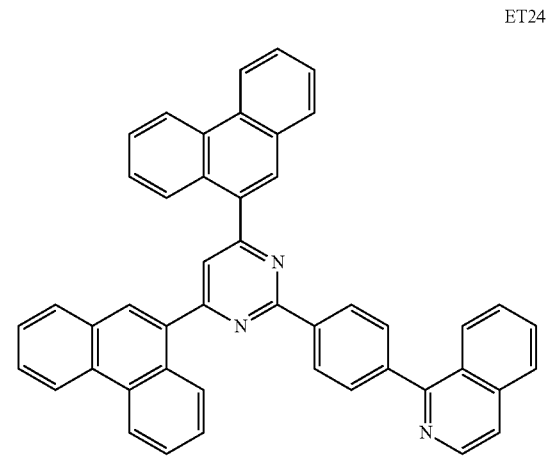
ET27
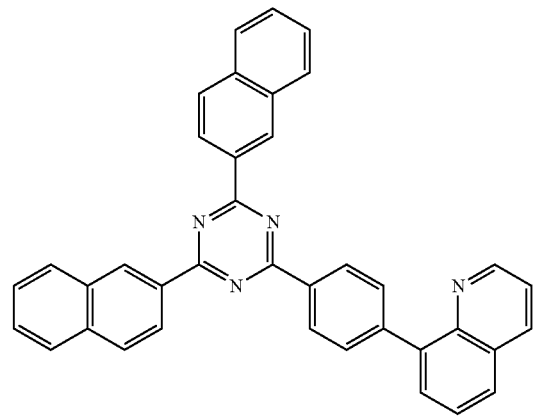
ET25
ET28
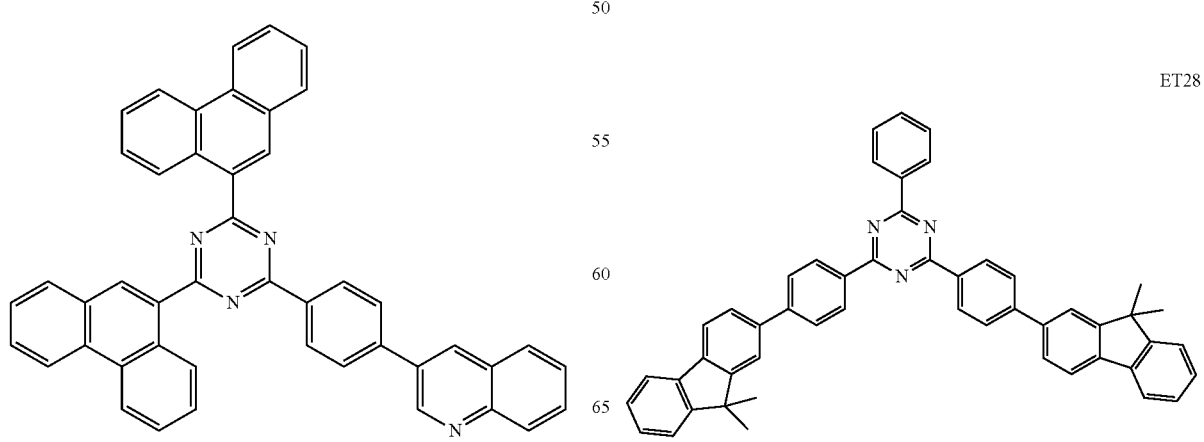

ET29
ET30
ET31
ET32
ET33
ET34
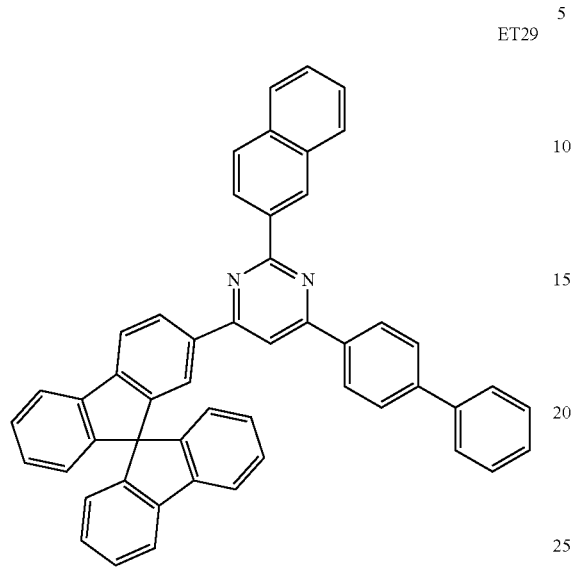
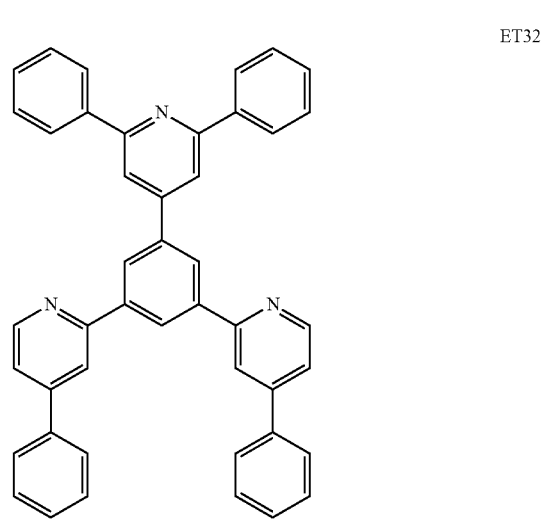
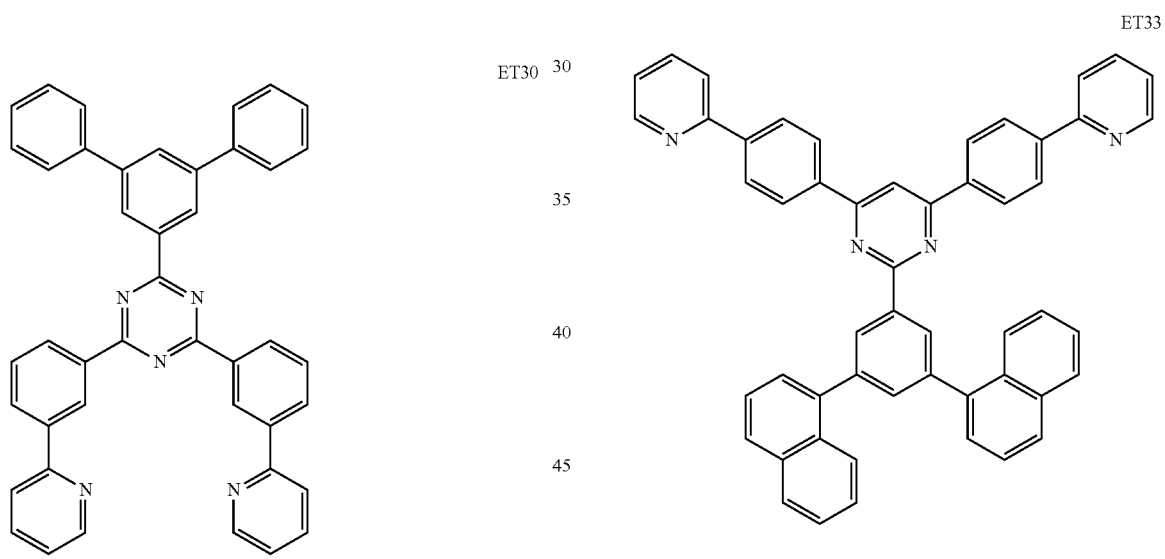
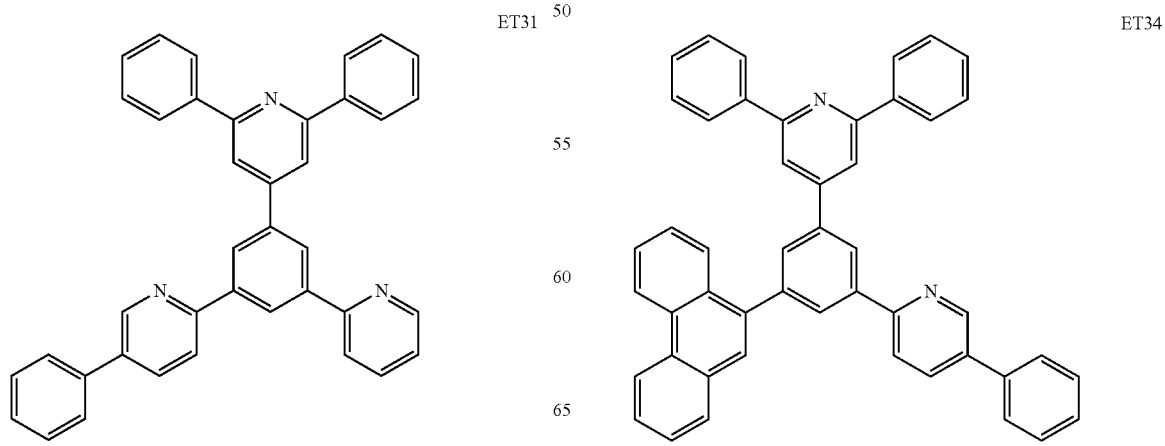

ET35

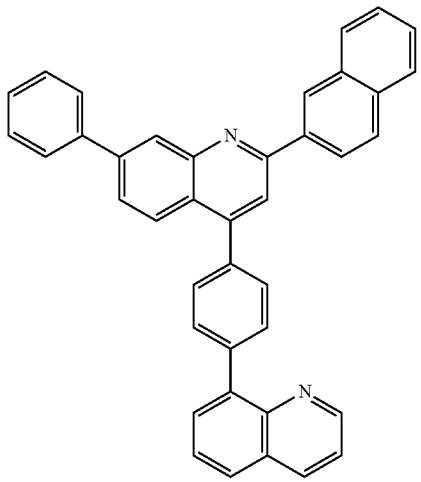

ET36

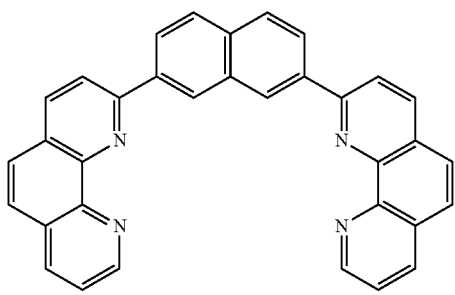

In one exemplary embodiment, the electron transport region may include at least one selected from 2,9-dimethyl-4,7-diphenyl-1,10-phenanthroline (BCP), 4,7-dphenyl-1,10-phenanthroline (Bphen), tris-(8-hydroxyquinoline)aluminum (Alq₃), bis(8-hydroxy-2-methylquinoline)-(4-phenylphenoxy)aluminum (BAlq), 3-(biphenyl-4-yl)-5-(4-tert-butylphenyl)-4-phenyl-4H-1,2,4-triazole (TAZ), and 4-naphthalen-1-yl-3,5-diphenyl-1,2,4-triazole (NTAZ):

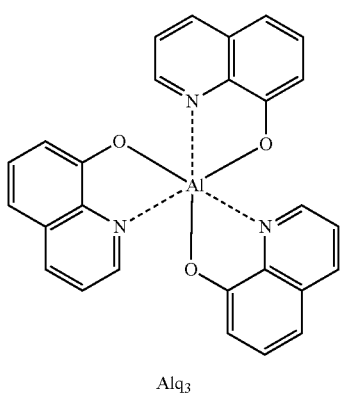

Alq₃

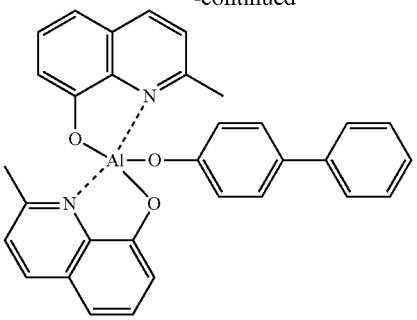

BAlq

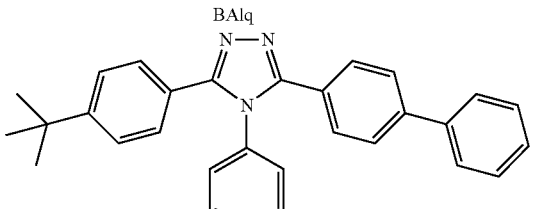

TAZ

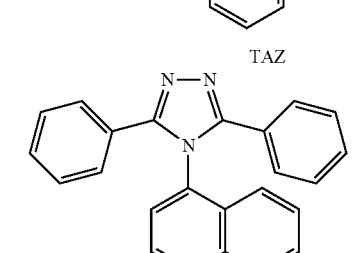

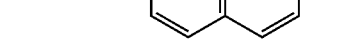

NTAZ

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

The thickness of the electron transport layer 142 may be in a range of about 100 Å to about 1,000 Å, for example, about 150 Å to about 500 Å. When the thickness of the electron transport layer 142 is within the range described above, the electron transport layer 142 may have satisfactory electron transport characteristics without a substantial increase in driving voltage.

The electron transport region (for example, the electron transport layer 142 in the electron transport region) may further include, in addition to the materials described above, a metal-containing material.

The metal-containing material may include at least one selected from an alkali metal complex and an alkaline earth-metal complex. The alkali metal complex may include a metal ion selected from a Li ion, a Na ion, a K ion, a Rb ion, and a Cs ion, and the alkaline earth-metal complex may include a metal ion selected from a Be ion, a Mg ion, a Ca ion, a Sr ion, and a Ba ion. A ligand coordinated with the metal ion of the alkali metal complex or the alkaline earth-metal complex may be selected from a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, and a cyclopentadiene, but the exemplary embodiments are not limited thereto.

For example, the metal-containing material may include a Li complex. The Li complex may include, for example, Compound ET-D1 (lithium quinolate, LiQ) or ET-D2:

ET-D1

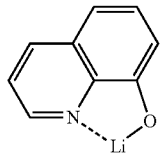

ET-D2

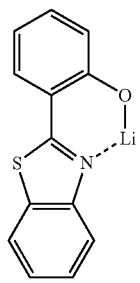

The electron transport region may include an electron injection layer that facilitates electron injection from the second electrode 150. The electron injection layer may directly contact the second electrode 150.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be selected from Li, Na, K, Rb, and Cs. In one exemplary embodiment, the alkali metal may be Li, Na, or Cs. In one or more exemplary embodiments, the alkali metal may be Li or Cs, but the exemplary embodiments are not limited thereto.

The alkaline earth metal may be selected from Mg, Ca, Sr, and Ba.

The rare earth metal may be selected from Sc, Y, Ce, Tb, Yb, and Gd.

The alkali metal compound, the alkaline earth-metal compound, and the rare earth metal compound may be selected from oxides and halides (for example, fluorides, chlorides, bromides, or iodides) of the alkali metal, the alkaline earth-metal, and the rare earth metal.

The alkali metal compound may be selected from alkali metal oxides, such as $Li_2O$, $Cs_2O$, or $K_2O$, and alkali metal halides, such as LiF, NaF, CsF, KF, LiI, NaI, CsI, or KI. In one exemplary embodiment, the alkali metal compound may be selected from LiF, $Li_2O$, NaF, LiI, NaI, CsI, and KI, but the exemplary embodiments are not limited thereto.

The alkaline earth-metal compound may be selected from alkaline earth-metal oxides, such as BaO, SrO, CaO, $Ba_xSr_{1-x}O$ (0<x<1), or $Ba_xCa_{1-x}O$ (0<x<1). In one exemplary embodiment, the alkaline earth-metal compound may be selected from BaO, SrO, and CaO, but the exemplary embodiments are not limited thereto.

The rare earth metal compound may be selected from $YbF_3$, $ScF_3$, $ScO_3$, $Sc_2O_3$, $Y_2O_3$, $Ce_2O_3$, $GdF_3$, and $TbF_3$. In one exemplary embodiment, the rare earth metal compound may be selected from $YbF_3$, $ScF_3$, $TbF_3$, $YbI_3$, $ScI_3$, and $TbI_3$, but the exemplary embodiments are not limited thereto.

The alkali metal complex, the alkaline earth-metal complex, and the rare earth metal complex may include an ion of alkali metal, alkaline earth-metal, and rare earth metal as described above, and a ligand coordinated with a metal ion of the alkali metal complex, the alkaline earth-metal complex, or the rare earth metal complex may be selected from hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, and cyclopentadiene, but the exemplary embodiments are not limited thereto.

The electron injection layer may consist of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more exemplary embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof may be homogeneously or non-homogeneously dispersed in a matrix including the organic material.

The thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage. The electron injection layer may further include a metal-containing material in addition to the above-described materials.

Second Electrode 150

As described above, the light-emitting device 100 includes the second electrode 150 facing the first electrode 110. The second electrode 150 may be a cathode which is an electron injection electrode, and in this regard, a material for forming the second electrode 150 may be selected from a metal, an alloy, an electrically conductive compound, and a combination thereof, which have a relatively low work function.

The second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), an ITO, and an IZO, but the exemplary embodiments are not limited thereto. The second electrode 150 may be a transmissive electrode, a semi-transmissive electrode, or a reflective electrode.

The second electrode 150 may have a single-layered structure or a multi-layered structure including two or more layers. For example, the first electrode 110 may be an anode, and the second electrode 150 may be a cathode. In this regard, the anode may be transmissive, and the cathode may be reflective or semi-transmissive.

Figure 2:
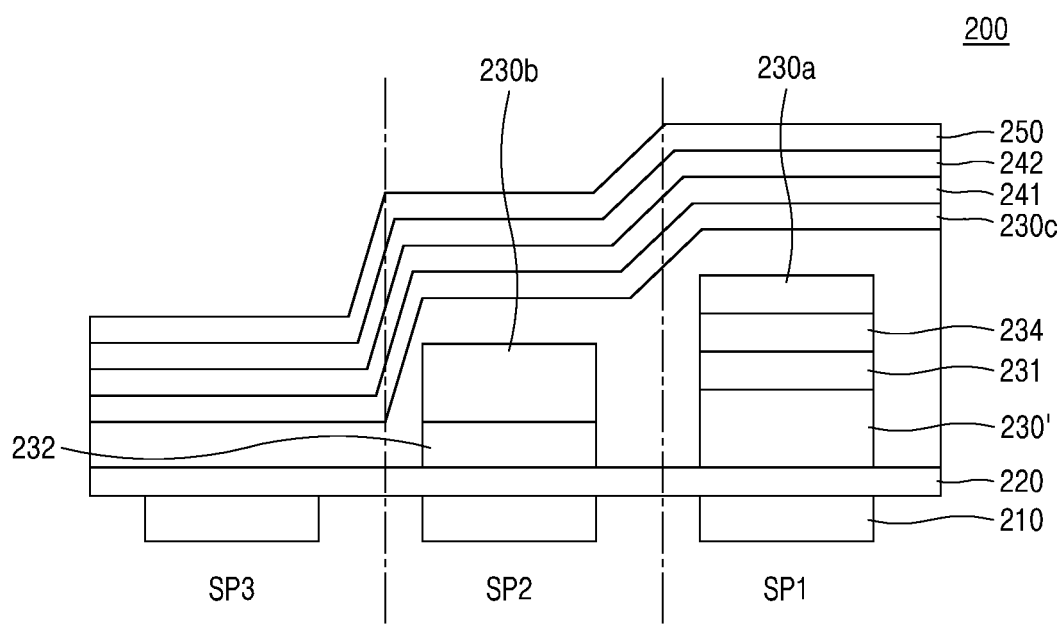
FIG. 2 is a schematic cross-sectional view of an exemplary embodiment of another light-emitting device constructed according to principles of the invention.

Description of FIG. 2

FIG. 2 is a schematic cross-sectional view of an exemplary embodiment of another light-emitting device constructed according to principles of the invention.

Referring to FIG. 2, a light-emitting device 200 according to an exemplary embodiment includes: a plurality of first electrodes 210 respectively disposed in a first subpixel SP1, a second subpixel SP2, and a third subpixel SP3; a second electrode 250 facing the first electrodes 210; a first emission layer 230a disposed in the first subpixel SP1 and emitting first-color light; a second emission layer 230b disposed in the second subpixel SP2 and emitting second-color light; a first layer 230c between the second electrode 250 and each of the first emission layer 230a and the second emission layer 230b, and integrated with the first subpixel SP1, the second subpixel SP2, and the third subpixel SP3; a hole transport region 220 between the first electrode 210 and each of the first layer 230c, the first emission layer 230a, and the second emission layer 230b; a first auxiliary layer 230' between the hole transport region 220 and the first emission layer 230a; and a first intermediate layer 231 between the first auxiliary layer 230' and the first emission layer 230a, wherein other layers are not present between the first layer 230c and the first emission layer 230a, the first auxiliary layer 230' includes a p-dopant, an absolute value of a HOMO energy level of the first intermediate layer 231 is greater than an absolute value of a HOMO energy level of the first auxiliary layer 230' and smaller than an absolute value of a HOMO energy level of the first emission layer 230a, and an absolute value of a LUMO energy level of the first intermediate layer 231 is greater than an absolute value of a LUMO energy level of the first auxiliary layer 230' and smaller than an absolute value of a LUMO energy level of the first emission layer 230a.

In some exemplary embodiments, a second intermediate layer 232 may be further disposed between the hole transport region 220 and the second emission layer 230b, and a third intermediate layer 234 may be further disposed between the first intermediate layer 231 and the first emission layer 230a.

In some exemplary embodiments, the hole transport region 220 may further include at least one of a hole injection layer and a hole transport layer, and at least one of an electron injection layer, substantially the same as described in connection with corresponding elements illustrated in FIGS. 1A-C, and an electron transport layer 242 is further disposed between the first layer 230c and the second electrode 250, and a buffer layer 241 is further disposed between the first layer 230c and the second electrode 250.

The first electrode 210, second electrode 250, first emission layer 230a, second emission layer 230b, first layer 230c, first auxiliary layer 230', first intermediate layer 231, second intermediate layer 232, electron transport layer 242, and buffer layer 241 of FIG. 2 are substantially the same as described in connection with corresponding elements illustrated in FIG. 1.

On the other hand, the light-emitting device 200 of FIG. 2 is structurally different from the light-emitting device 100 of FIG. 1 in that the light-emitting device 200 further includes a third intermediate layer 234 as an additional intermediate layer.

In one exemplary embodiment, the light-emitting device 200 may further include the third intermediate layer 234 disposed between the first intermediate layer 231 and the first emission layer 230a. At this time, an absolute value of a HOMO energy level of the third intermediate layer 234 is greater than an absolute value of a HOMO energy level of the first intermediate layer 231 and smaller than an absolute value of a HOMO energy level of the first emission layer 230a, and an absolute value of a LUMO energy level of the third intermediate layer 234 is greater than an absolute value of a LUMO energy level of the first intermediate layer 231 and smaller than an absolute value of a LUMO energy level of the first emission layer 230a. For details of the third intermediate layer 234, refer to the description of the first intermediate layer 231 to the second intermediate layer 232.

In one exemplary embodiment, a region of the first layer 230c corresponding to the third subpixel SP3 may emit third-color light, and a resonance order of at least one of first-color light, second-color light, and third-color light may be different from the resonance order of at least one of the other two. In one exemplary embodiment, the region of the first layer 130c corresponding to the third subpixel SP3 may emit third-color light, and the resonance order of the first-color light may be greater than or equal to resonance orders of second-color light and third-color light.

For example, i) the resonance order of first-color light may be secondary, and the resonance order of each of second-color light and third-color light may be primary, or ii) the resonance order of first-color light may be tertiary, and the resonance order of each of second-color light and third-color light may be secondary, or iii) the resonance order of first-color light may be secondary, the resonance order of second-color light may be secondary, and the resonance order of third-color light may be primary.

In one exemplary embodiment, the first-color light is blue light, the second-color light is red light, and the region of the first layer 230c corresponding to the third subpixel SP3 may emit green light. In one exemplary embodiment, the first-color light is red light, the second-color light is blue light, and the region of the first layer 230c corresponding to the third subpixel SP3 may emit green light. In one exemplary embodiment, the first-color light is green light, the second-color light is red light, and the region of the first layer 230c corresponding to the third subpixel SP3 may emit blue light. In one exemplary embodiment, the first-color light is red light, the second-color light is green light, and the region of the first layer 230c corresponding to the third subpixel SP3 may emit blue light. In one exemplary embodiment, the first-color light is blue light, the second-color light is green light, and the region of the first layer 230c corresponding to the third subpixel SP3 may emit green light. In one exemplary embodiment, the first-color light is green light, the second-color light is blue light, and the region of the first layer 230c corresponding to the third subpixel SP3 may emit red light.

Each layer included in the light-emitting device 100 or 200 may be formed in a certain area by using various methods including vacuum deposition, spin coating, casting, a Langmuir-Blodgett (LB) method, inkjet printing, laser printing, laser induced thermal imaging (LITI), or the like.

When each layer is formed by vacuum deposition, deposition conditions may include, for example, a deposition temperature of about 100° C. to about 500° C., a vacuum degree of about $10^{-8}$ torr to about $10^{-3}$ torr, and a deposition rate of about 0.01 Å/sec to about 100 Å/sec, and within these ranges, the conditions may be selected depending on a material to be included in a layer to be formed and the structure of the layer to be formed.

When each layer is formed by spin coating, coating conditions may include, for example, a coating rate of about 2,000 rpm to about 5,000 rpm and a heat treatment temperature of about 80° C. to about 200° C., and within these ranges, the conditions may be selected depending on a material to be included in a layer to be formed and the structure of the layer to be formed.

The term "$C_1$-$C_{60}$ alkyl group" as used herein refers to a linear or branched aliphatic saturated hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group a structure corresponding to the $C_1$-$C_{60}$ alkyl group.

The term "$C_6$-$C_{60}$ aryl group" as used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has at least one heteroatom selected from N, O, Si, P, and S as a ring-forming atom, in addition to 1 to 60 carbon atoms. The term "$C_1$-$C_{60}$ heteroarylene group" as used herein refers to a divalent group having a heterocyclic aromatic system that has at least one heteroatom selected from N, O, Si, P, and S as a ring-forming atom, in addition to 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the two or more rings may be fused with each other.

The term "monovalent non-aromatic fused polycyclic group" as used herein refers to a monovalent group (for example, having 8 to 60 carbon atoms) having two or more rings fused with each other, only carbon atoms as ring-forming atoms, and no aromaticity in its entire molecular structure. A detailed example of the monovalent non-aromatic fused polycyclic group is a fluorenyl group. The term "divalent non-aromatic fused polycyclic group" as used herein refers to a divalent group having a structure corresponding to the monovalent non-aromatic fused polycyclic group.

The term "monovalent non-aromatic fused heteropolycyclic group" as used herein refers to a monovalent group (for example, having 1 to 60 carbon atoms) having two or more rings fused to each other, at least one heteroatom selected from N, O, Si, P, and S, other than carbon atoms, as a ring-forming atom, and no aromaticity in its entire molecular structure. A detailed example of the monovalent non-aromatic fused heteropolycyclic group is a carbazolyl group. The term "divalent non-aromatic fused heteropolycyclic group" as used herein refers to a divalent group having a structure corresponding to the monovalent non-aromatic fused heteropolycyclic group.

The term "$C_5$-$C_{60}$ carbocyclic group" as used herein refers to a monocyclic or polycyclic group that includes only carbon as a ring-forming atom and consists of 5 to 60 carbon atoms. The $C_5$-$C_{60}$ carbocyclic group may be an aromatic carbocyclic group or a non-aromatic carbocyclic group. The $C_5$-$C_{60}$ carbocyclic group may be a ring, such as benzene, a monovalent group, such as a phenyl group, or a divalent group, such as a phenylene group. In one or more exemplary embodiments, depending on the number of substituents connected to the $C_5$-$C_{60}$ carbocyclic group, the $C_5$-$C_{60}$ carbocyclic group may be a trivalent group or a quadrivalent group.

The term "$C_1$-$C_{60}$ heterocyclic group" as used herein refers to a group having a structure corresponding to as the $C_5$-$C_{60}$ carbocyclic group, except that as a ring-forming atom, at least one heteroatom selected from N, O, Si, P, and S is used in addition to carbon (the number of carbon atoms may be in a range of 1 to 60).

As used herein, at least one substituent of the substituted $C_5$-$C_{60}$ carbocyclic group, the substituted $C_1$-$C_{60}$ heterocyclic group, the substituted $C_6$-$C_{60}$ arylene group, the substituted $C_1$-$C_{60}$ heteroarylene group, the substituted divalent non-aromatic fused polycyclic group, the substituted divalent non-aromatic fused heteropolycyclic group, the substituted $C_1$-$C_{60}$ alkyl group, the substituted $C_6$-$C_{60}$ aryl group, the substituted $C_1$-$C_{60}$ heteroaryl group, the substituted monovalent non-aromatic fused polycyclic group, and the substituted monovalent non-aromatic fused heteropolycyclic group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, and a monovalent non-aromatic fused heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, and a monovalent non-aromatic fused heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, and a terphenyl group.

The term "biphenyl group" as used herein refers to "a phenyl group substituted with a phenyl group". In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a phenyl group having, as a substituent, a $C_6$-$C_{60}$ aryl group substituted with a $C_6$-$C_{60}$ aryl group.

The terms "hydrogen" and "deuterium" refer to their respective atoms and corresponding radicals, and the terms "—F, —Cl, —Br, and —I" are radicals of, respectively, fluorine, chlorine, bromine, and iodine.

As used herein, the term "atom" may mean an element or its corresponding radical bonded to one or more other atoms.

As used herein, a substituent for a monovalent group, e.g., alkyl, may also be, independently, a substituent for a corresponding divalent group, e.g., alkylene.

* and *' used herein, unless defined otherwise, each refer to a binding site to a neighboring atom in a corresponding formula.

An apparatus includes a thin-film transistor having a source electrode, a drain electrode, and an activation layer. In the illustrated embodiment, the first electrode 110 of the organic light-emitting device 100 is in electrical connection with one of the source electrode or the drain electrode. In other exemplary embodiments, other devices, such as the device 200 may be used instead of the device 100.

EXAMPLES

Referring to Examples and Comparative Examples, materials respectively used in a hole injection layer, a hole transport layer, an organic emission layer, an electron transport layer, an electron injection layer, an auxiliary layer, and an intermediate layer are compounds that satisfy the respective descriptions thereof presented herein in connection with each layer.

Example 1

As an anode, a 15 Ω/cm² (1,200 Å) ITO glass substrate from Corning, Inc. of Corning, New York (hereinafter "Corning") was cut to a size of 50 mm×50 mm×0.7 mm, sonicated with isopropyl alcohol and pure water each for 5 minutes, and then cleaned by exposure to ultraviolet rays and ozone for 30 minutes. Then the resultant glass substrate was loaded onto a vacuum deposition apparatus.

Compound HT3 and HAT-CN were co-deposited at a weight ratio of 99:1 on the glass substrate to a thickness of 50 Å, and Compound HT3 was deposited thereon to a thickness of 220 Å, thereby forming a hole injection layer having a total thickness of 270 Å, and then m-MTDATA was vacuum-deposited on the hole injection layer to form a hole transport layer having a thickness of 50 Å.

Subsequently, in the blue subpixel area, Compound HT3 and HAT-CN were co-deposited at a weight ratio of 99:1 on the hole transport layer to a thickness of 100 Å, and Compound HT1 and F4-TCNQ were additionally deposited at a weight ratio of 99:1 thereon to a thickness of 690 Å, thereby forming a first auxiliary layer, and then m-MTDATA was deposited on the first auxiliary layer to form a first intermediate layer having a thickness of 50 Å, and CBP as a host and an arylamine compound BD1 (FD14) as a blue dopant were co-deposited at a weight ratio of 97:3 on the first intermediate layer to form a blue organic emission layer having a thickness of 160 Å.

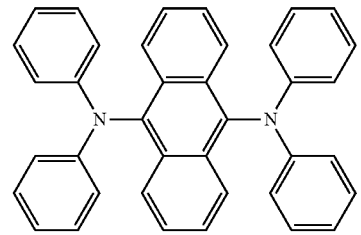

FD14

At this time, values of HOMO and LUMO energy levels of the first auxiliary layer, the first intermediate layer, and the blue organic emission layer are as follows:
first auxiliary layer: HOMO=−5.14 eV, LUMO=−1.82 eV;
first intermediate layer: HOMO=−5.37 eV, LUMO=−2.10 eV; and
blue organic emission layer: HOMO=−5.61 eV, LUMO=−2.49 eV. LUMO energy levels and HOMO energy levels were evaluated by different pulse voltammetry (DPV) method conducted by a computer program with (an electrolyte: 0.1M Bu$_4$NPF$_6$ in dimethylformamide, pulse height: 50 millivolts (m), pulse width: 1 sec, step height: 10 mV, step width: 2 seconds sec, scan rate: 5 millivolts per second (mV/sec), reference electrode: Ag/AgNO$_3$, to evaluate a reduction peak potential of the graph, i.e., Epeak (electron volts, eV)] (when a LUMO/HOMO energy range is beyond a solvent widow, measurement is made after changing a solvent), $E_{peak}$ (eV) is applied to an equation of LUMO (eV)=−4.8−($E_{peak}$−$E_{peak}$ (Ferrocene)) to evaluate a LUMO/HOMO energy lev(eV) of each compound.

Subsequently, in the red subpixel area, m-MTDATA was deposited on the hole transport layer to form a second intermediate layer having a thickness of 50 Å, and CBP as a host and bis(2-(2'-benzothienyl)-pyridinato-N,C3')iridium (acetylacetonate) (Ir(btp)$_2$(acac)) as a red dopant were co-deposited at a weight ratio of 97:3 on the second intermediate layer to form a red organic emission layer having a thickness of 150 Å.

CBP as a host and tris[2-phenylpyridinato-C2,N]iridium (III) (Ir(ppy)$_3$) as a green dopant were co-deposited at a weight ratio of 94:6 on the blue organic emission layer and the red organic emission layer, thereby forming a green organic emission layer as a common layer having a thickness of 250 Å.

In this regard, the red and green organic emission layers emitted light with a primary resonance, and the blue organic emission layer emitted light with a secondary resonance.

BAlq was deposited on the green organic emission layer to form a buffer layer having a thickness of 50 Å for hole blocking, and Alq$_3$ and LiQ were co-deposited at a weight ratio of 1:1 thereon to form an electron transport layer having a thickness of 280 Å.

Yb was deposited on the electron transport layer to form an electron injection layer having a thickness of 13 Å, and Ag and Mg were co-deposited at a weight ratio of 9:1 thereon to form a Yb/Ag:Mg electrode as a cathode having a thickness of 130 Å, thereby completing the manufacture of a light-emitting device.

Comparative Example 1

A light-emitting device was manufactured in the same manner as used in Example 1, except that m-MTDATA was deposited between each of the red organic emission layer and the blue organic emission layer and the green organic emission layer to form a fourth intermediate layer having a thickness of 50 Å.

Figure 3:
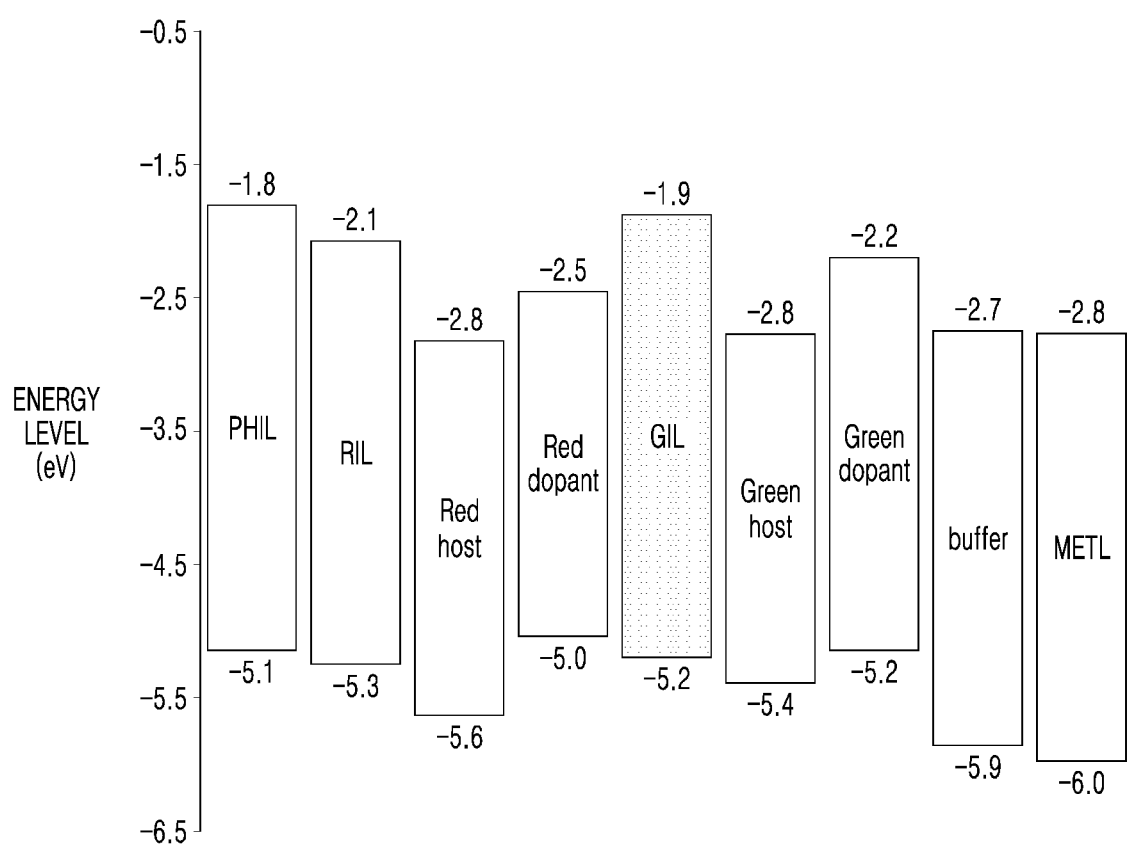
FIG. 3 is an energy diagram of a red emission layer in a comparative light-emitting device according to Comparative Example 1.

FIG. 3 is an energy diagram of a red emission layer in a comparative light-emitting device according to Comparative Example 1.

In this regard, FIG. 3 illustrates an energy diagram of the hole injection layer (PHIL), the second intermediate layer (RIL), the host (Red host) and the dopant (Red dopant) in the red organic emission layer, the fourth intermediate layer (GIL), the host (Green host) and the dopant (Green dopant) in the green organic emission layer, the buffer layer (buffer), and the electron transport layer (METL).

Comparative Example 2

As an anode, a 15 Ω/cm² (1,200 Å) ITO glass substrate from Corning was cut to a size of 50 mm×50 mm×0.7 mm, sonicated with isopropyl alcohol and pure water each for 5 minutes, and then cleaned by exposure to ultraviolet rays and ozone for 30 minutes, and then the resultant glass substrate was loaded onto a vacuum deposition apparatus.

Compound HT3 and HAT-CN were co-deposited at a weight ratio of 99:1 on the glass substrate to a thickness of 50 Å, and Compound HT3 was deposited thereon to a thickness of 220 Å, thereby forming a hole injection layer having a total thickness of 270 Å, and then m-MTDATA was vacuum-deposited on the hole injection layer to form a hole transport layer having a thickness of 50 Å.

Subsequently, in the blue subpixel area, m-MTDATA was deposited on the hole transport layer to form a first intermediate layer having a thickness of 50 Å, and CBP as a host and an arylamine compound BD1 (FD14) as a blue dopant were co-deposited at a weight ratio of 97:3 on the first intermediate layer to form a blue organic emission layer having a thickness of 160 Å.

Compound HT3 and HAT-CN were co-deposited at a weight ratio of 99:1 on the blue organic emission layer to a thickness of 100 Å, and Compound HT1 and F4-TCNQ were additionally deposited at a weight ratio of 99:1 thereon to a thickness of 690 Å, thereby forming a first auxiliary layer.

At this time, absolute values of HOMO and LUMO energy levels of the first auxiliary layer, the first intermediate layer, and the blue organic emission layer are as follows.

Subsequently, in the red subpixel area, m-MTDATA was deposited on the hole transport layer to form a second intermediate layer having a thickness of 50 Å, and CBP as a host and Ir(btp)$_2$(acac) as a red dopant were co-deposited at a weight ratio of 97:3 on the second intermediate layer to form a red organic emission layer having a thickness of 150 Å.

CBP as a host and Ir(ppy)$_3$ as a green dopant were co-deposited at a weight ratio of 94:6 on the first auxiliary layer and the red organic emission layer, thereby forming a green organic emission layer as a common layer having a thickness of 250 Å.

In this regard, the red and green organic emission layers emitted light by a primary resonance, and the blue organic emission layer emitted light by a secondary resonance.

BAlq was deposited on the green organic emission layer to form a buffer layer having a thickness of 50 Å for hole blocking, and Alq$_3$ and LiQ were co-deposited at a weight ratio of 1:1 thereon to form an electron transport layer having a thickness of 280 Å.

Yb was deposited on the electron transport layer to form an electron injection layer having a thickness of 13 Å, and Ag and Mg were co-deposited at a weight ratio of 9:1 thereon to form a Yb/Ag:Mg electrode as a cathode having a thickness of 130 Å, thereby completing the manufacture of a light-emitting device.

Comparative Example 3

A light-emitting device was manufactured in the same manner as used in Example 1, except that the light-emitting device does not include a first auxiliary layer.

Evaluation Example 1

Figure 4:
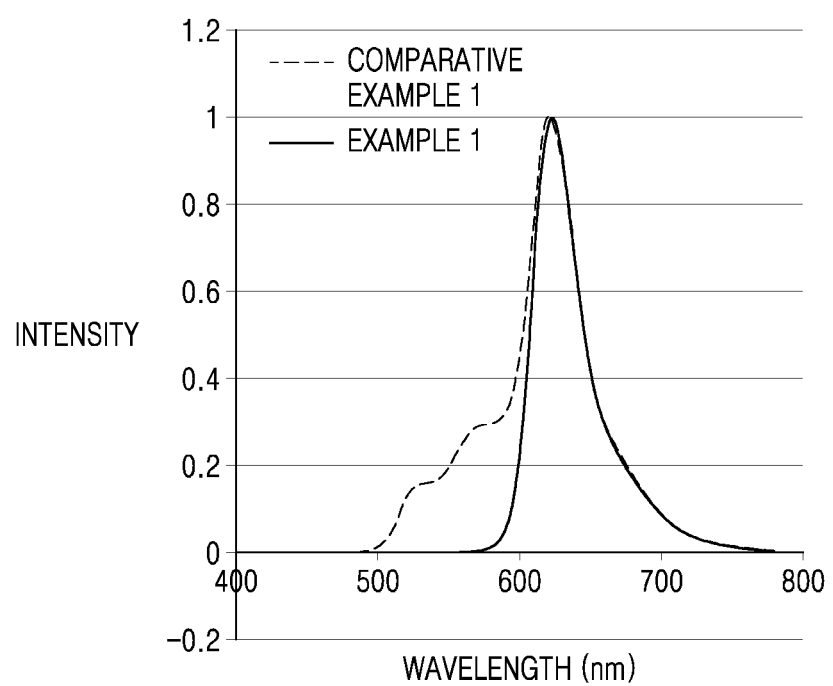
FIG. 4 is a graphical depiction of red electroluminescence spectra of an exemplary embodiment of a light-emitting device according to Example 1 and a comparative example of Comparative Example 1.

FIG. 4 is a graphical depiction of red electroluminescence spectra of an exemplary embodiment of a light-emitting device according to Example 1 and a comparative example of Comparative Example 1.

Red luminescence spectra of the light-emitting devices manufactured according to Example 1 and Comparative Example 1 were measured and shown in FIG. 4.

Referring to FIG. 4, it was confirmed that the light-emitting device of Example 1 shows excellent red luminescence, compared to the light-emitting device of Comparative Example 1, wherein the light-emitting device of Example 1 does not include other layers between the red organic emission layer and the green organic emission layer.

Evaluation Example 2

Figure 5:
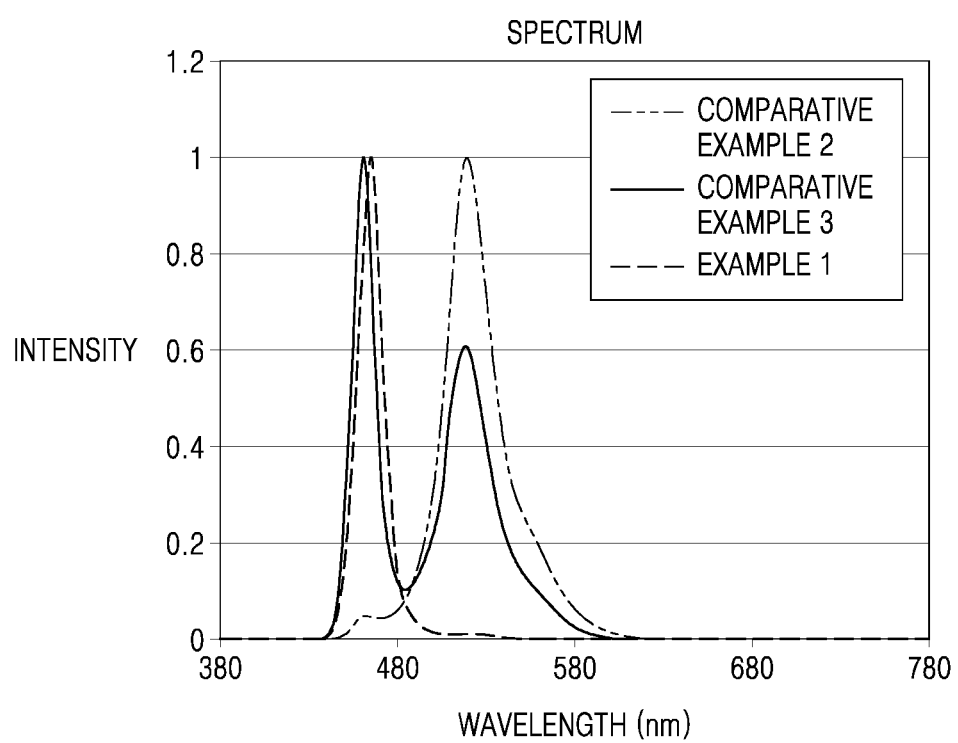
FIG. 5 is a graphical depiction of blue electroluminescence spectra of the exemplary embodiment of light-emitting device according to Example 1 and comparative examples of Comparative Examples 2 to 3.

FIG. 5 is a graphical depiction of blue electroluminescence spectra of the exemplary embodiment of light-emitting device according to Example 1 and comparative examples of Comparative Examples 2 to 3. Blue luminescence spectra of the light-emitting devices manufactured according to Example 1 and Comparative Examples 2 and 3 were measured and shown in FIG. 5.

Referring to FIG. 5, unlike the light-emitting device of Example 1, which does not include other layers between the red organic emission layer and the green organic emission layer, it was confirmed that, when the blue luminescence spectra were being measured, the green organic emission layers as common layers in the light-emitting devices of Comparative Examples 2 and 3 emitted light (wavelength range of 480 nm to 580 nm), resulting in color mixing.

Some of the advantages that may be achieved by exemplary implementations of the invention and/or exemplary methods of the invention include a light-emitting device having little or no color mixing and improved color purity.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting device comprising:
a plurality of first electrodes respectively disposed in a first subpixel, a second subpixel, and a third subpixel;
a second electrode facing the plurality of first electrodes;
a first emission layer disposed in the first subpixel to emit a first-color light;
a second emission layer disposed in the second subpixel to emit a second-color light;
a first layer disposed between the second electrode and each of the first emission layer and the second emission layer, and integrated with the first subpixel, the second subpixel, and the third subpixel;
a hole transport region disposed between the plurality of first electrodes and each of the first layer, the first emission layer, and the second emission layer;
a first auxiliary layer disposed between the hole transport region and the first emission layer; and
a first intermediate layer disposed between the first auxiliary layer and the first emission layer; and
a second intermediate layer between the first intermediate layer and the first emission layer,
wherein other layers are not disposed between the first layer and the first emission layer;
the first auxiliary layer comprises a p-dopant,
an absolute value of a HOMO energy level of the first intermediate layer is greater than an absolute value of a HOMO energy level of the first auxiliary layer and smaller than an absolute value of a HOMO energy level of the first emission layer, and
an absolute value of a LUMO energy level of the first intermediate layer is greater than an absolute value of a LUMO energy level of the first auxiliary layer and smaller than an absolute value of a LUMO energy level of the first emission layer,
wherein an absolute value of a HOMO energy level of the second intermediate layer is greater than an absolute value of a HOMO energy level of the first intermediate layer and smaller than an absolute value of a HOMO energy level of the first emission layer, and
an absolute value of a LUMO energy level of the second intermediate layer is greater than an absolute value of a LUMO energy level of the first intermediate layer and smaller than an absolute value of a LUMO energy level of the first emission layer.

2. The light-emitting device of claim 1, wherein the first layer does not directly contact the first emission layer.

3. The light-emitting device of claim 1, wherein the first intermediate layer comprises a p-dopant or a single film comprising a p-dopant.

4. The light-emitting device of claim 1, wherein at least one of the first intermediate layer and the first auxiliary layer further comprises a hole transport compound.

5. The light-emitting device of claim 4, wherein the hole transport compound comprises at least one compound of Formula 201 and of Formula 202 below:

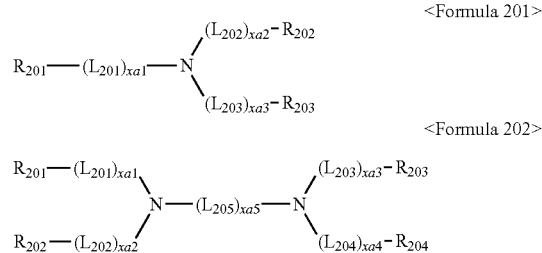

wherein, in Formulae 201 and 202,
$L_{201}$ to $L_{204}$ are each, independently from one another, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic fused polycyclic group, or a substituted or unsubstituted divalent non-aromatic fused heteropolycyclic group;
$L_{205}$ is *—O—*', —S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic fused polycyclic group, or a substituted or unsubstituted divalent non-aromatic fused heteropolycyclic group;
xa1 to xa4 are each, independently from one another, an integer from 0 to 3;
xa5 is an integer from 1 to 10;
$R_{201}$ to $R_{204}$ and $Q_{201}$ are each, independently from one another, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic fused polycyclic group, or a substituted or unsubstituted monovalent non-aromatic fused heteropolycyclic group; and
at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted C1-$C_{60}$ heteroarylene group, the substituted divalent non-aromatic fused polycyclic group, the substituted divalent non-aromatic fused heteropolycyclic group, the substituted $C_1$-$C_{20}$ alkylene group, the substituted $C_2$-$C_{20}$ alkenylene group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic fused polycyclic group, and the substituted monovalent non-aromatic fused heteropolycyclic group is:

deuterium, —F, —Cl, —Br, —I, a hydroxyl group, a cyano group, a nitro group, an amidino group, a hydrazino group, and a hydrazono group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each optionally substituted, independently from one another, with at least one of deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{11}$)($Q_{12}$)($Q_{13}$), —N($Q_{11}$)($Q_{12}$), —B($Q_{11}$)($Q_{12}$), —C(═O)($Q_{11}$), —S(═O)$_2$($Q_{11}$), and —P(═O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, and a monovalent non-aromatic fused heteropolycyclic group, each optionally substituted, independently from one another, with at least one of deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic fused polycyclic group, a monovalent non-aromatic fused heteropolycyclic group, —Si($Q_{21}$)($Q_{22}$)($Q_{23}$), —N($Q_{21}$)($Q_{22}$), —B($Q_{21}$)($Q_{22}$), —C(═O)($Q_{21}$), —S(═O)$_2$($Q_{21}$), and —P(═O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(═O)($Q_{31}$), —S(═O)$_2$($Q_{31}$), and —P(═O)($Q_{31}$)($Q_{32}$);

wherein $Q_{11}$ to $Q_{13}$, $Q_{21}$ to $Q_{23}$, and $Q_{31}$ to $Q_{33}$ are each, independently from one another, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic fused polycyclic group, a monovalent non-aromatic fused heteropolycyclic group, a biphenyl group, or a terphenyl group.

6. The light-emitting device of claim 1, further comprising a third intermediate layer between the hole transport region and the second emission layer.

7. The light-emitting device of claim 1, wherein the hole transport region further comprises at least one of a hole injection layer and a hole transport layer.

8. The light-emitting device of claim 7, wherein the at least one of a hole injection layer and a hole transport layer comprises a p-dopant or a single film comprising a p-dopant.

9. The light-emitting device of claim 1, further comprising at least one of an electron injection layer and an electron transport layer, disposed between the first layer and the second electrode.

10. The light-emitting device of claim 9, wherein the at least one of an electron injection layer and an electron transport layer comprises a metal-containing material.

11. The light-emitting device of claim 1, wherein the plurality of the first electrodes is an anode, and the second electrode is a cathode.

12. The light-emitting device of claim 11, wherein the anode is transmissive, and the cathode is reflective or semi-transmissive.

13. The light-emitting device of claim 1, wherein the light-emitting device is a bottom emission device.

14. The light-emitting device of claim 1, wherein the first-color light is blue light, the second-color light is red light, and
the first layer has a region substantially disposed in the third subpixel that is configured to emit a green light.

15. A flat-panel display apparatus comprising:
a thin-film transistor having a source electrode, a drain electrode, and an activation layer; and
the light-emitting device of claim 1,
wherein the plurality of first electrodes of the light-emitting device is electrically coupled to one of the source electrode and the drain electrode.

16. The light-emitting device of claim 1, wherein the p-dopant comprises at least one of a quinone derivative, a metal oxide, and a cyano group-containing compound.

17. A light-emitting device comprising:
a plurality of first electrodes respectively disposed in a first subpixel, a second subpixel, and a third subpixel;
a second electrode facing the plurality of first electrodes;
a first emission layer disposed in the first subpixel to emit a first-color light;
a second emission layer disposed in the second subpixel to emit a second-color light;
a first layer disposed between the second electrode and each of the first emission layer and the second emission layer, and integrated with the first subpixel, the second subpixel, and the third subpixel;
a hole transport region disposed between the plurality of first electrodes and each of the first layer, the first emission layer, and the second emission layer;
a first auxiliary layer disposed between the hole transport region and the first emission layer;
a first intermediate layer disposed between the first auxiliary layer and the first emission layer; and
a buffer layer between the first layer and the second electrode,
wherein other layers are not disposed between the first layer and the first emission layer;
the first auxiliary layer comprises a p-dopant, an absolute value of a HOMO energy level of the first intermediate layer is greater than an absolute value of a HOMO energy level of the first auxiliary layer and smaller than an absolute value of a HOMO energy level of the first emission layer, and an absolute value of a LUMO energy level of the first intermediate layer is greater than an absolute value of a LUMO energy level of the first auxiliary layer and smaller than an absolute value of a LUMO energy level of the first emission layer.

18. A light-emitting device comprising:

a plurality of first electrodes respectively disposed in a first subpixel, a second subpixel, and a third subpixel;

a second electrode facing the plurality of first electrodes;

a first emission layer disposed in the first subpixel to emit a first-color light;

a second emission layer disposed in the second subpixel to emit a second-color light;

a first layer disposed between the second electrode and each of the first emission layer and the second emission layer, and integrated with the first subpixel, the second subpixel, and the third subpixel;

a hole transport region disposed between the plurality of first electrodes and each of the first layer, the first emission layer, and the second emission layer;

a first auxiliary layer disposed between the hole transport region and the first emission layer; and a first intermediate layer disposed between the first auxiliary layer and the first emission layer, wherein other layers are not disposed between the first layer and the first emission layer;

the first auxiliary layer comprises a p-dopant, an absolute value of a HOMO energy level of the first intermediate layer is greater than an absolute value of a HOMO energy level of the first auxiliary layer and smaller than an absolute value of a HOMO energy level of the first emission layer, and an absolute value of a LUMO energy level of the first intermediate layer is greater than an absolute value of a LUMO energy level of the first auxiliary layer and smaller than an absolute value of a LUMO energy level of the first emission layer, wherein the first layer has a region disposed substantially in the third subpixel that is configured to emit a third-color light, and a resonance order of one of the first-color light, the second-color light, or the third-color light is different from the resonance order of the other two.

* * * * *